(12) United States Patent
Wu

(10) Patent No.: US 8,624,333 B2
(45) Date of Patent: Jan. 7, 2014

(54) SEMICONDUCTOR DEVICE, METHOD OF FORMING SEMICONDUCTOR DEVICE, AND DATA PROCESSING SYSTEM

(76) Inventor: Nan Wu, Tokyo (JP)

(*) Notice: Subject to any disclaimer, the term of this patent is extended or adjusted under 35 U.S.C. 154(b) by 160 days.

(21) Appl. No.: 13/105,437

(22) Filed: May 11, 2011

(65) Prior Publication Data

US 2011/0284969 A1 Nov. 24, 2011

(30) Foreign Application Priority Data

May 19, 2010 (JP) ................................. 2010-115538

(51) Int. Cl.
*H01L 27/088* (2006.01)

(52) U.S. Cl.
USPC .......................................................... 257/401

(58) Field of Classification Search
USPC ........................................ 257/401, E29.255
See application file for complete search history.

(56) References Cited

U.S. PATENT DOCUMENTS

| 6,767,813 | B2* | 7/2004 | Lee et al. | 438/585 |
|---|---|---|---|---|
| 7,095,065 | B2* | 8/2006 | Yu et al. | 257/274 |
| 7,166,895 | B2* | 1/2007 | Saito | 257/347 |
| 7,227,220 | B2* | 6/2007 | Kim et al. | 257/324 |
| 7,514,746 | B2* | 4/2009 | Tang et al. | 257/347 |
| 7,534,686 | B2 | 5/2009 | Lee et al. | |
| 7,598,571 | B2 | 10/2009 | Kim et al. | |
| 7,602,010 | B2* | 10/2009 | Choi et al. | 257/324 |
| 7,646,070 | B2* | 1/2010 | Anderson et al. | 257/401 |
| 7,667,271 | B2* | 2/2010 | Yu et al. | 257/347 |
| 7,687,361 | B2* | 3/2010 | Jang et al. | 438/294 |
| 7,776,711 | B2* | 8/2010 | Kim | 438/424 |
| 7,838,915 | B2* | 11/2010 | Choi et al. | 257/288 |
| 8,310,013 | B2* | 11/2012 | Lin et al. | 257/401 |
| 2004/0036127 | A1* | 2/2004 | Chau et al. | 257/401 |
| 2004/0063286 | A1* | 4/2004 | Kim et al. | 438/283 |
| 2004/0219722 | A1* | 11/2004 | Pham et al. | 438/157 |
| 2005/0029603 | A1* | 2/2005 | Yu et al. | 257/401 |
| 2005/0035415 | A1* | 2/2005 | Yeo et al. | 257/401 |
| 2005/0040475 | A1* | 2/2005 | Jang et al. | 257/396 |
| 2005/0093033 | A1* | 5/2005 | Kinoshita et al. | 257/288 |
| 2005/0145938 | A1* | 7/2005 | Lin | 257/347 |
| 2005/0205944 | A1* | 9/2005 | Clark et al. | 257/401 |
| 2006/0244055 | A1* | 11/2006 | Jang et al. | 257/330 |
| 2006/0246671 | A1* | 11/2006 | Jang et al. | 438/294 |
| 2006/0273415 | A1* | 12/2006 | Kim | 257/413 |
| 2007/0020855 | A1 | 1/2007 | Kim et al. | |
| 2007/0048947 | A1 | 3/2007 | Lee et al. | |
| 2007/0057312 | A1* | 3/2007 | Kim | 257/315 |
| 2007/0145487 | A1* | 6/2007 | Kavalieros et al. | 257/368 |
| 2007/0155076 | A1* | 7/2007 | Kim | 438/197 |
| 2007/0170522 | A1* | 7/2007 | Lee et al. | 257/401 |
| 2007/0176245 | A1* | 8/2007 | Kim et al. | 257/401 |

(Continued)

FOREIGN PATENT DOCUMENTS

| JP | 2005-064500 | 3/2005 |
|---|---|---|
| JP | 2007-027753 | 2/2007 |
| JP | 2007-305827 | 11/2007 |

*Primary Examiner* — Jae Lee
*Assistant Examiner* — Grant Withers
(74) *Attorney, Agent, or Firm* — Young & Thompson

(57) ABSTRACT

A semiconductor device includes a semiconductor substrate including a fin. The fin includes first and second fin portions. The first fin portion extends substantially in a horizontal direction to a surface of the semiconductor substrate. The second fin portion extends substantially in a vertical direction to the surface of the semiconductor substrate. The fin has a channel region.

14 Claims, 46 Drawing Sheets

(56) References Cited

U.S. PATENT DOCUMENTS

| | | | |
|---|---|---|---|
| 2008/0023742 A1* | 1/2008 | Lee | 257/296 |
| 2008/0057634 A1* | 3/2008 | Lee | 438/156 |
| 2008/0064170 A1* | 3/2008 | Kim | 438/283 |
| 2008/0096355 A1* | 4/2008 | Jang et al. | 438/283 |
| 2008/0265321 A1* | 10/2008 | Yu et al. | 257/344 |
| 2008/0277743 A1* | 11/2008 | Cho et al. | 257/407 |
| 2009/0093101 A1* | 4/2009 | Kim | 438/424 |
| 2009/0170271 A1* | 7/2009 | Yoon et al. | 438/301 |
| 2009/0294857 A1* | 12/2009 | Lee | 257/365 |
| 2009/0317967 A1 | 12/2009 | Kim et al. | |
| 2011/0068393 A1* | 3/2011 | Cho et al. | 257/331 |
| 2011/0127611 A1* | 6/2011 | Lee | 257/368 |
| 2011/0266648 A1* | 11/2011 | Cho et al. | 257/506 |

* cited by examiner

X2-X2'

X1-X1'

Y3-Y3'

Y2-Y2'

Y1-Y1'

X2-X2'

X1-X1'

Y3-Y3'

Y2-Y2'

Y1-Y1'

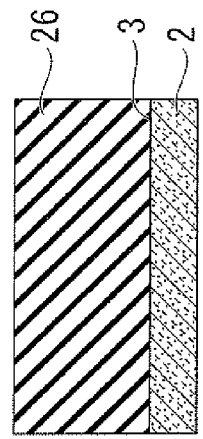
FIG. 11C
X2-X2'
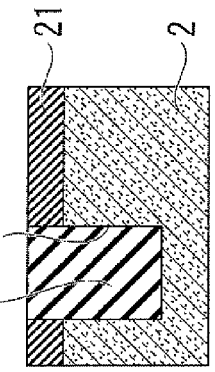
FIG. 11B
X1-X1'
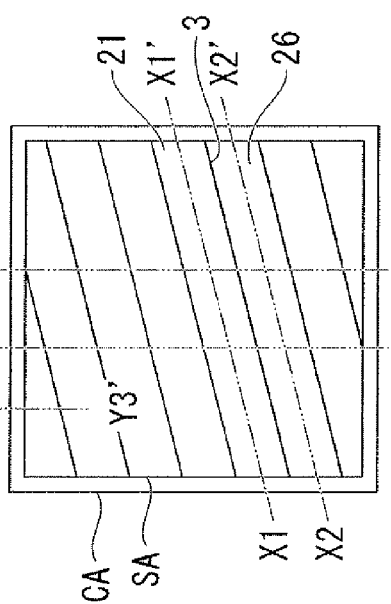
FIG. 11A
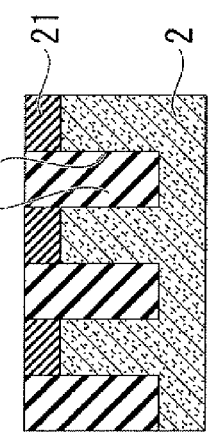
FIG. 11F
Y3-Y3'
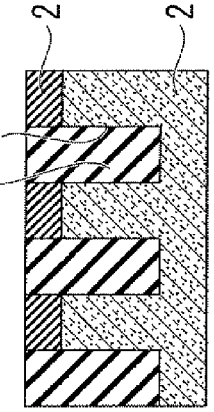
FIG. 11E
Y2-Y2'
FIG. 11D
Y1-Y1'

X2-X2'

X1-X1'

Y3-Y3'

Y2-Y2'

Y1-Y1'

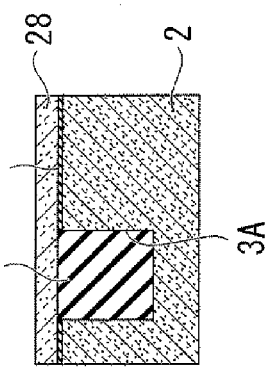
FIG. 13C
X2-X2'
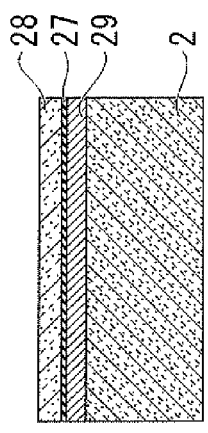
FIG. 13B
X1-X1'
FIG. 13A
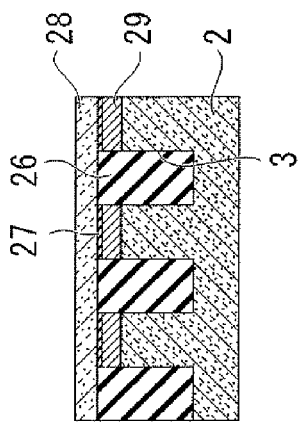
FIG. 13F
Y3-Y3'
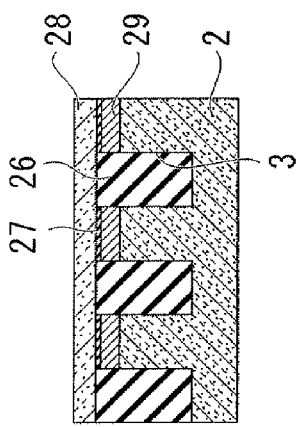
FIG. 13E
Y2-Y2'
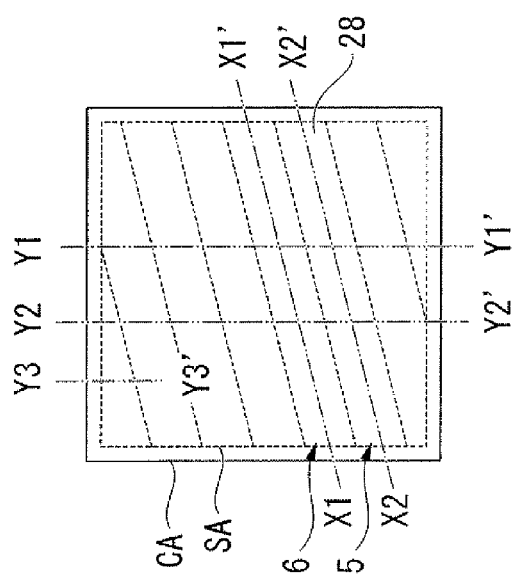
FIG. 13D
Y1-Y1'

X2-X2'

Y3-Y3'

X1-X1'

Y2-Y2'

Y1-Y1'

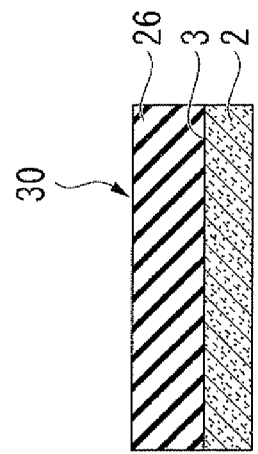
FIG. 15C
X2-X2'
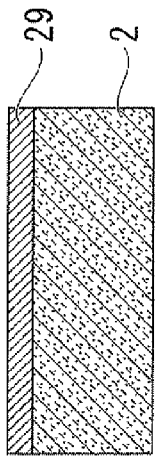
FIG. 15B
X1-X1'
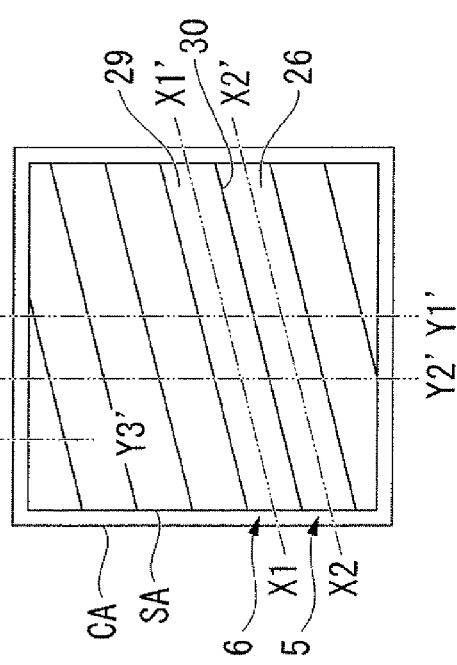
FIG. 15A
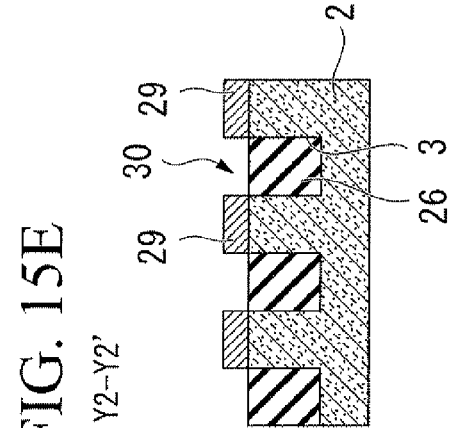
FIG. 15F
Y3-Y3'
FIG. 15E
Y2-Y2'
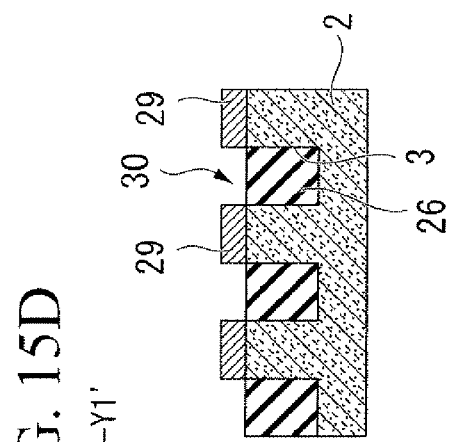
FIG. 15D
Y1-Y1'

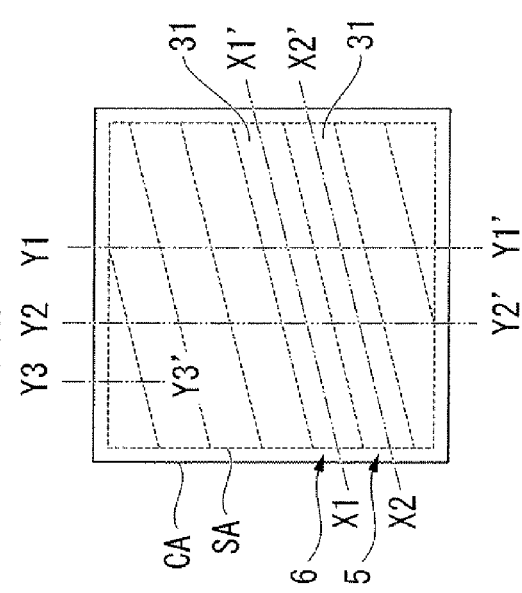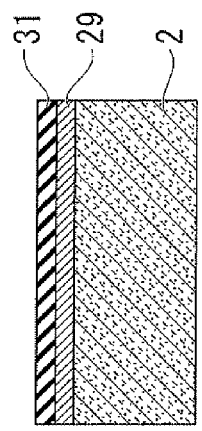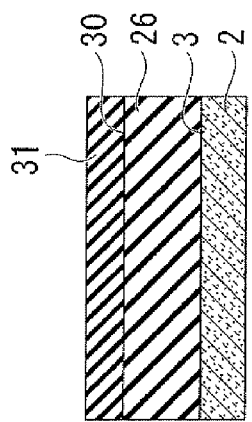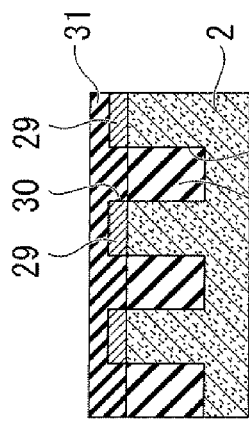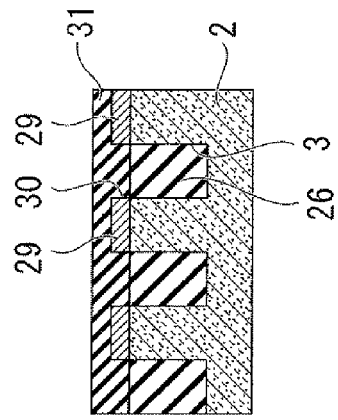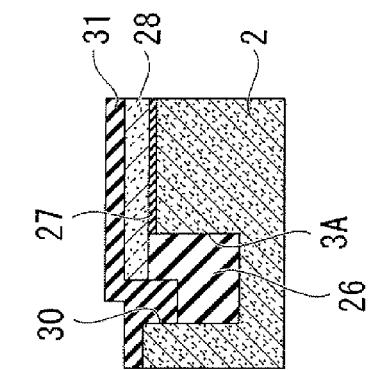

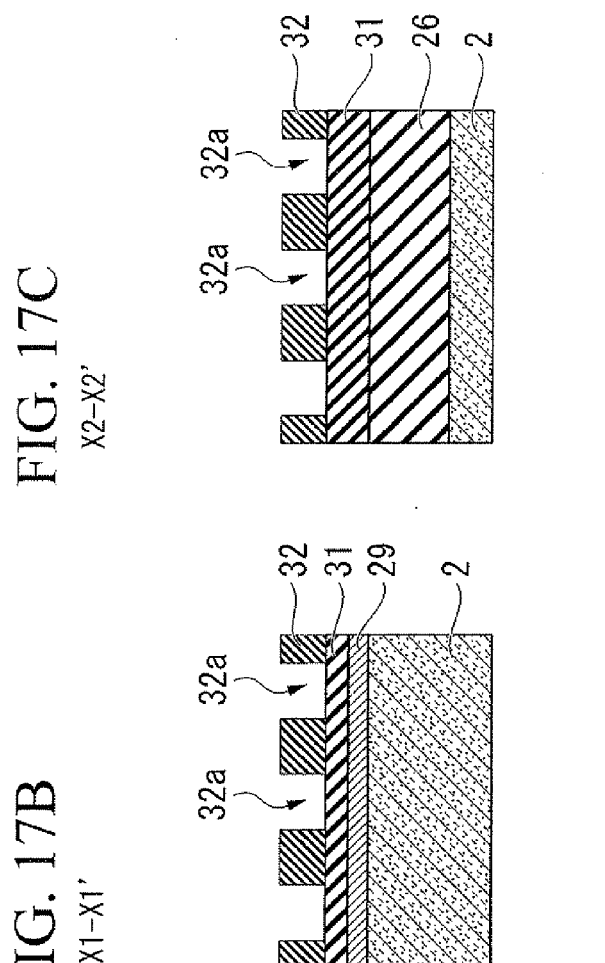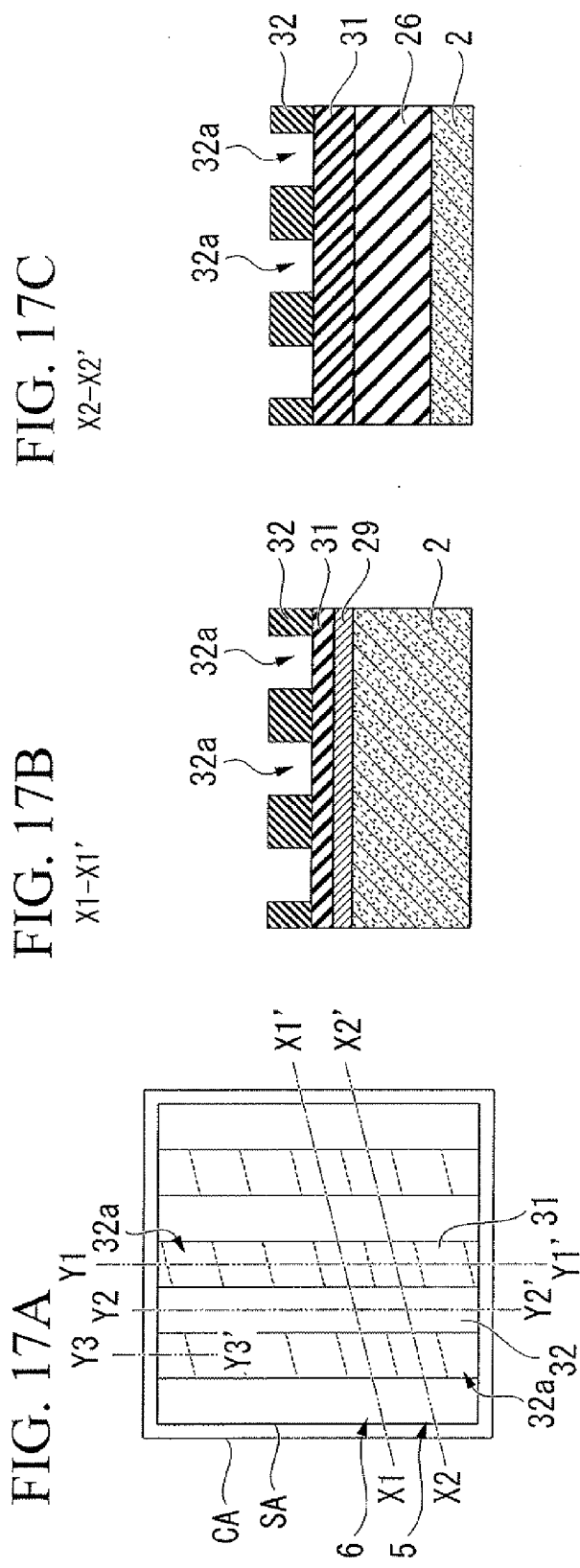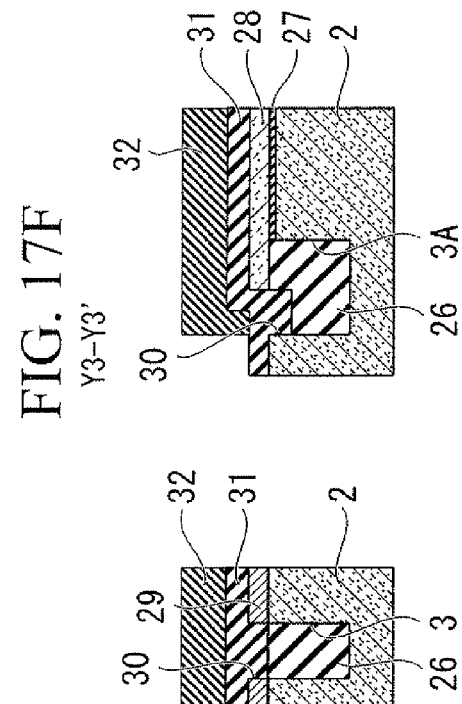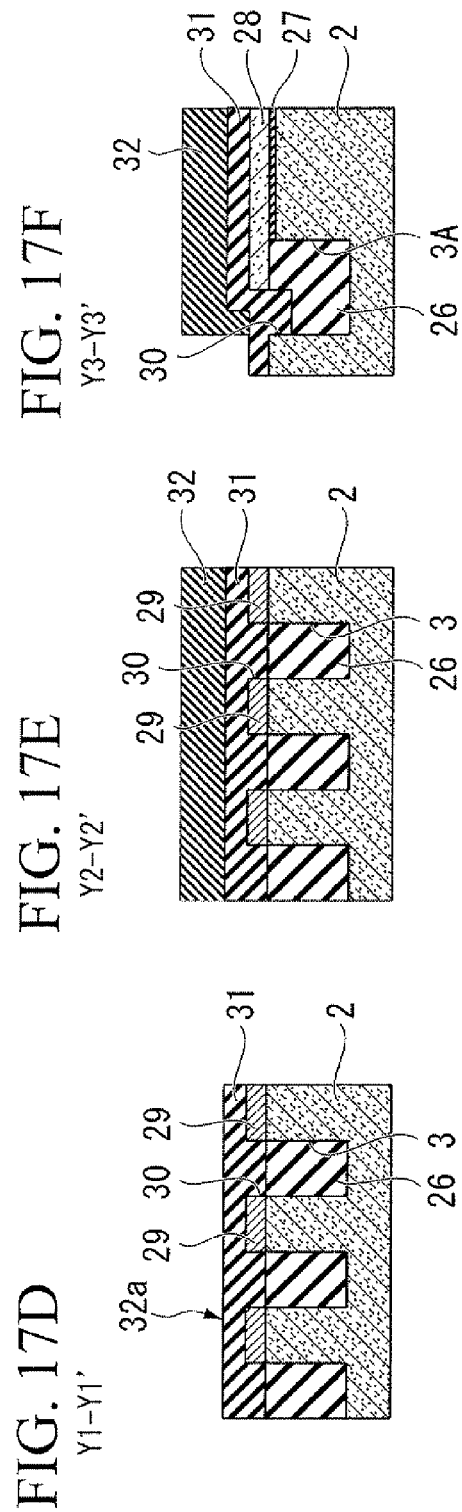

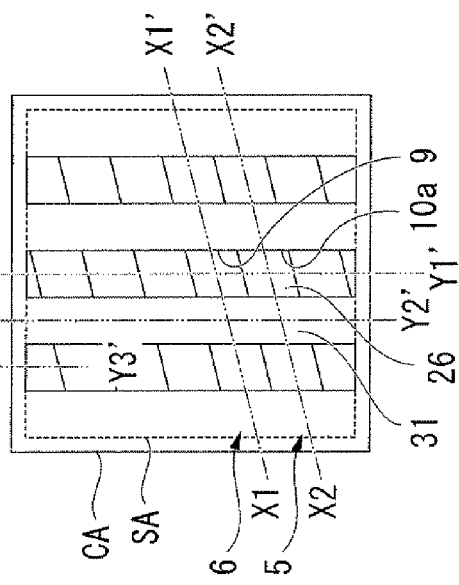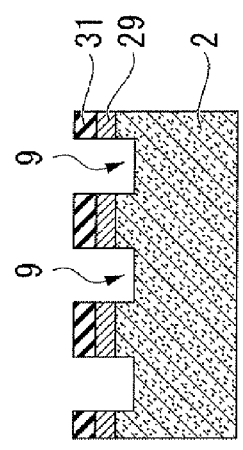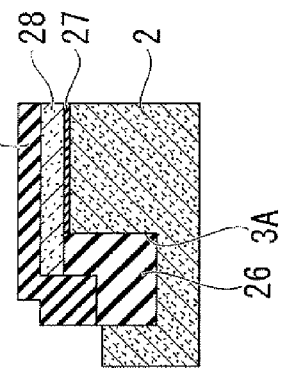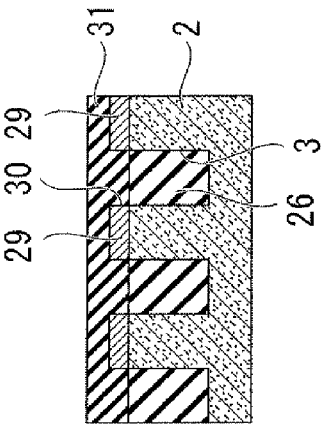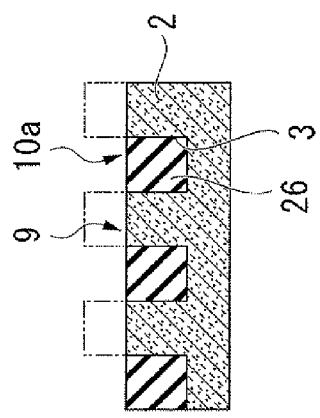

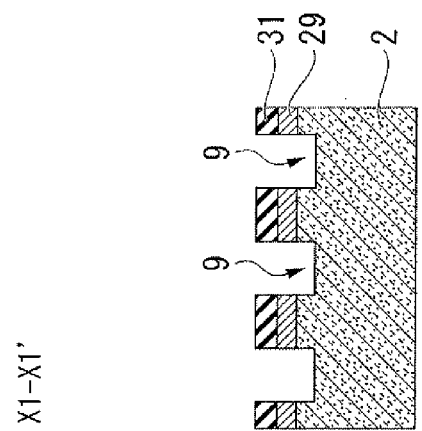
FIG. 19A
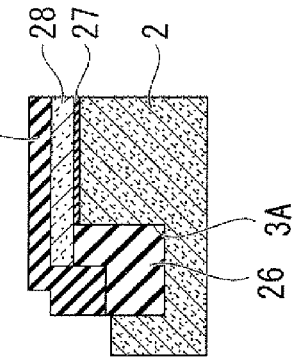
FIG. 19B
X1-X1'
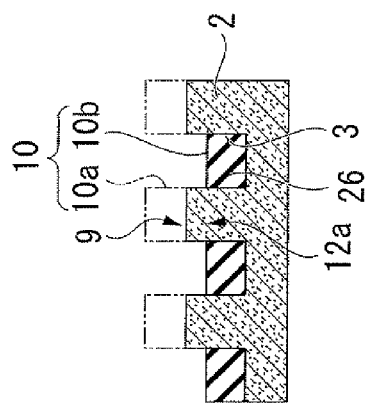
FIG. 19C
X2-X2'
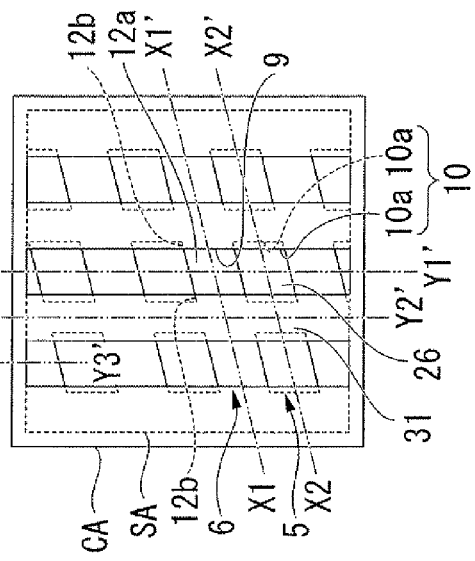
FIG. 19D
Y1-Y1'
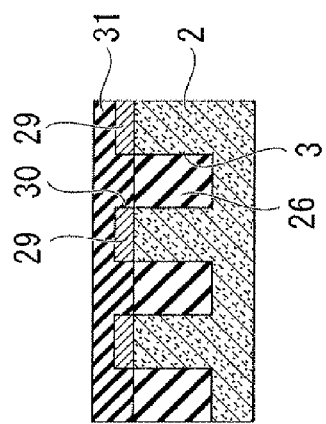
FIG. 19E
Y2-Y2'
FIG. 19F
Y3-Y3'

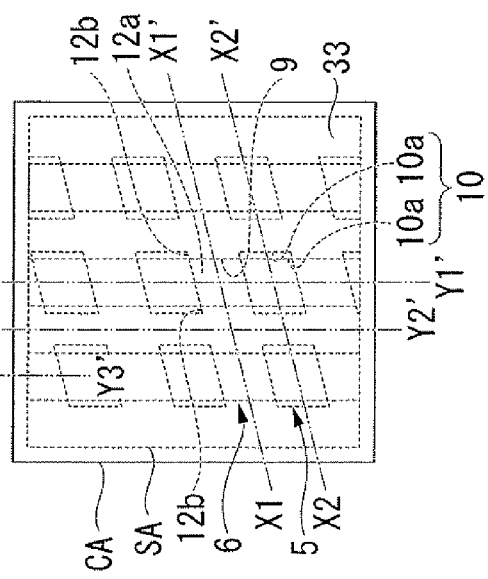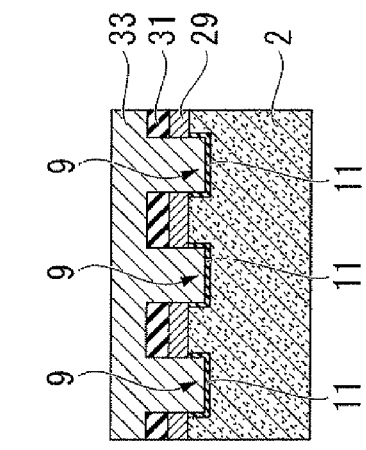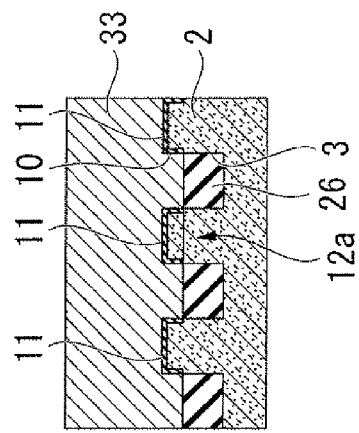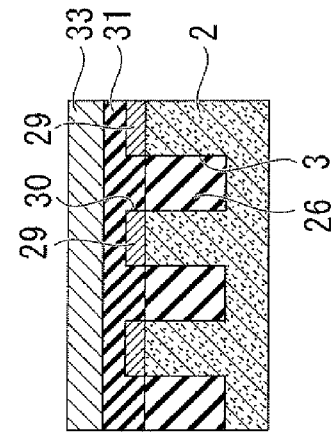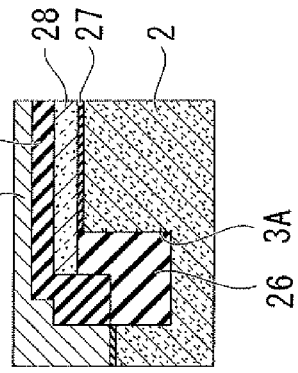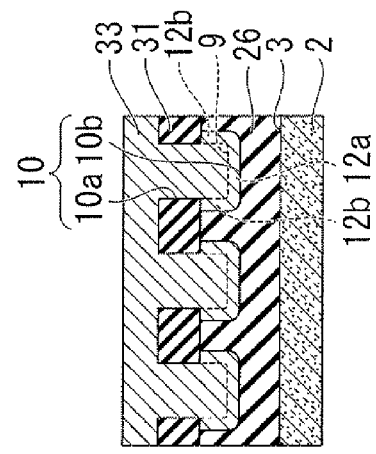

X1-X1'

X2-X2'

Y1-Y1'

Y2-Y2'

Y3-Y3'

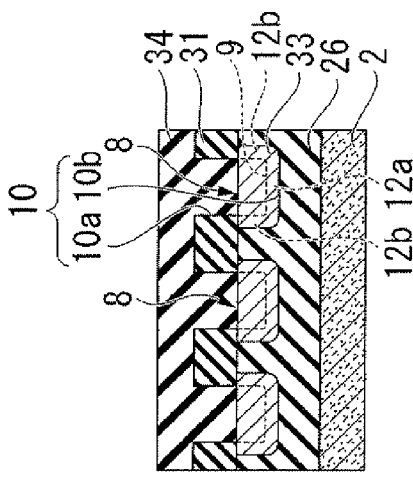
FIG. 22A
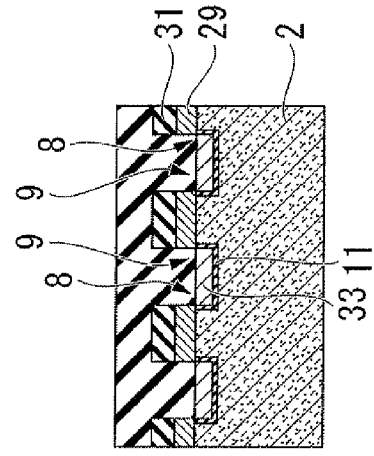
FIG. 22B
X1-X1'
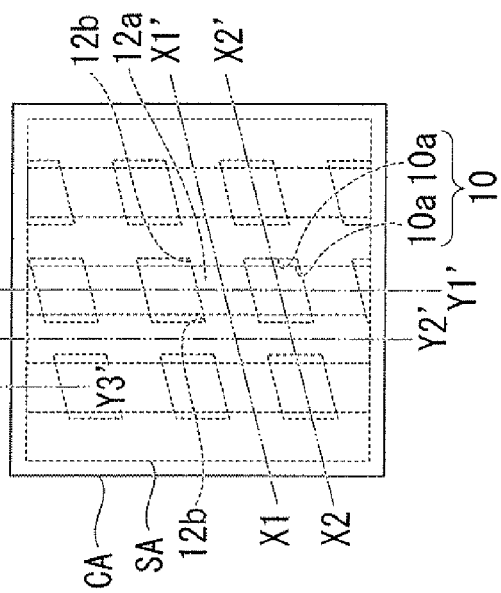
FIG. 22C
X2-X2'
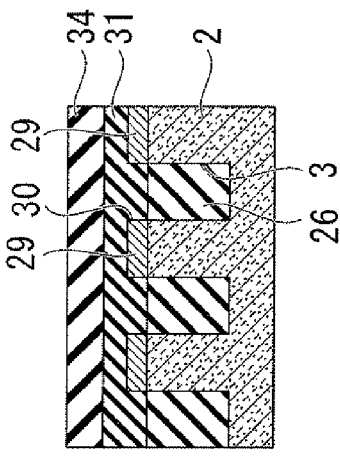
FIG. 22D
Y1-Y1'
FIG. 22E
Y2-Y2'
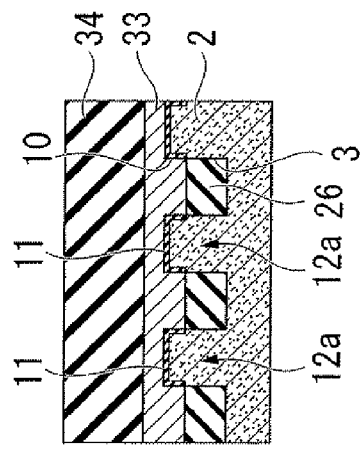
FIG. 22F
Y3-Y3'

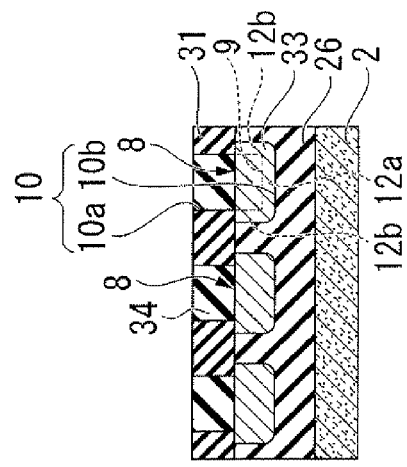
FIG. 23C
X2-X2'
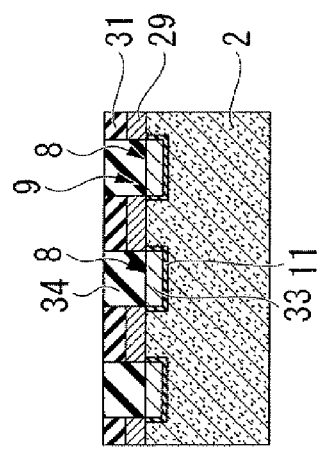
FIG. 23B
X1-X1'
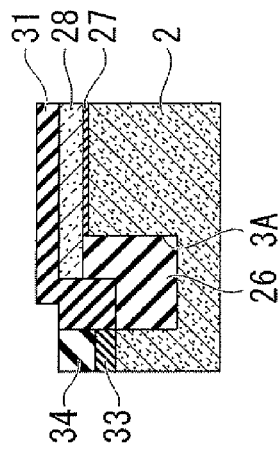
FIG. 23F
Y3-Y3'
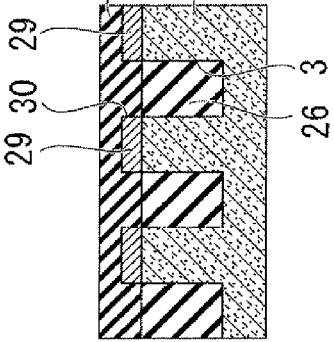
FIG. 23E
Y2-Y2'
FIG. 23A
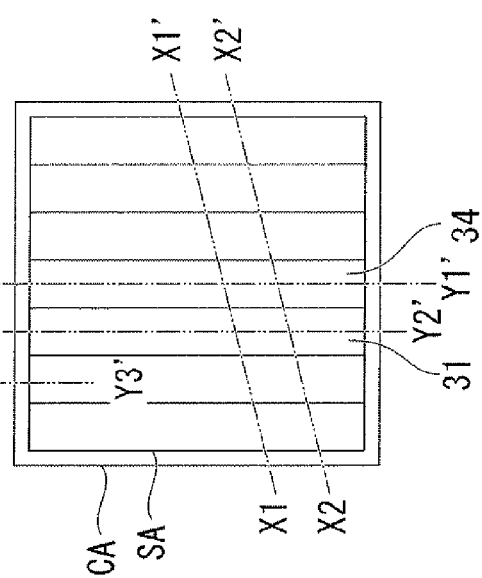
FIG. 23D
Y1-Y1'
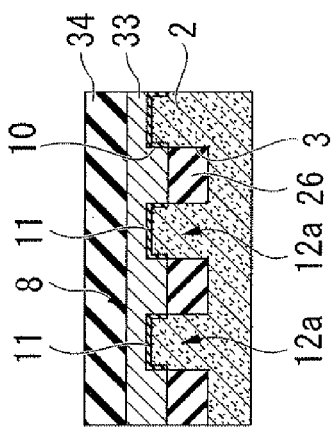

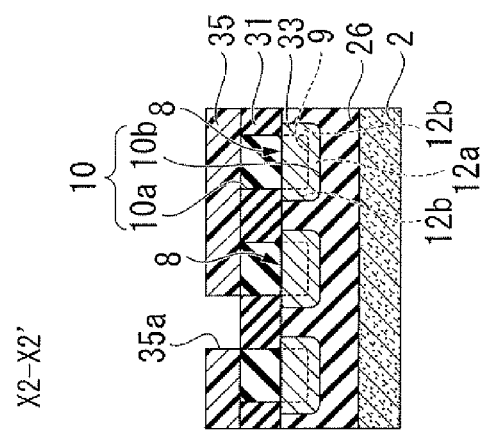
FIG. 24C
X2-X2'
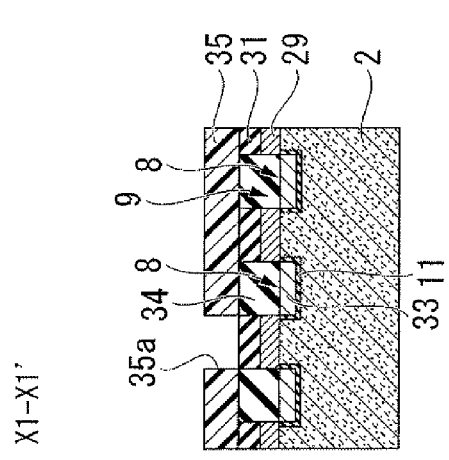
FIG. 24B
X1-X1'
FIG. 24A
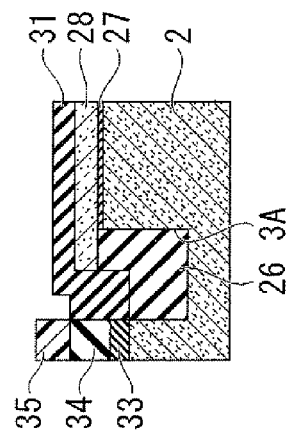
FIG. 24F
Y3-Y3'
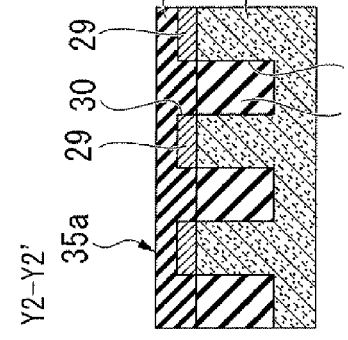
FIG. 24E
Y2-Y2'
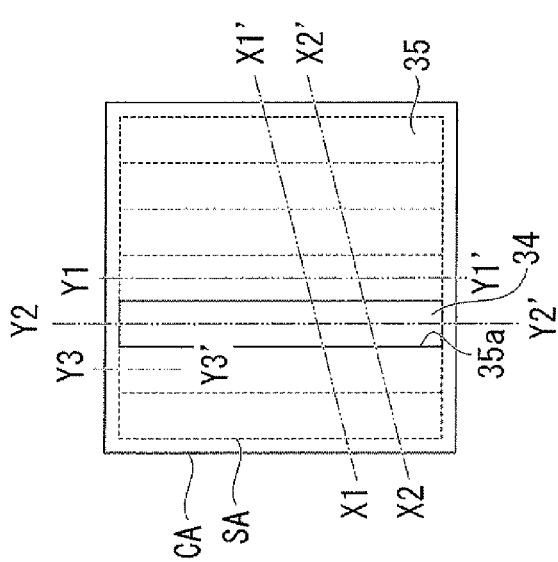
FIG. 24D
Y1-Y1'

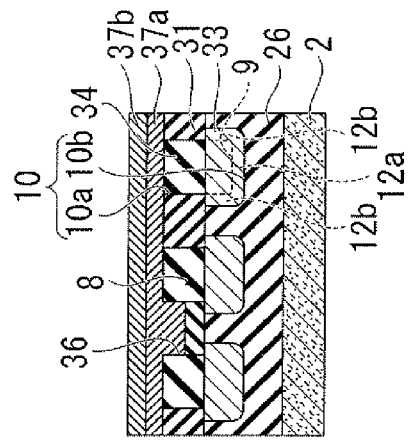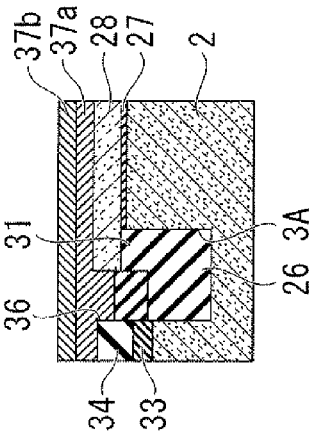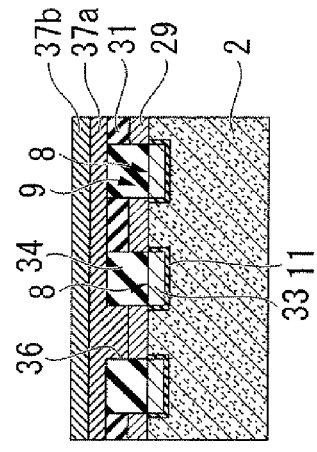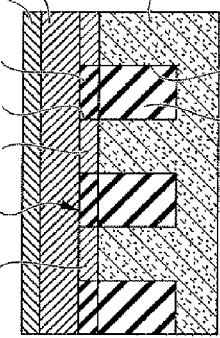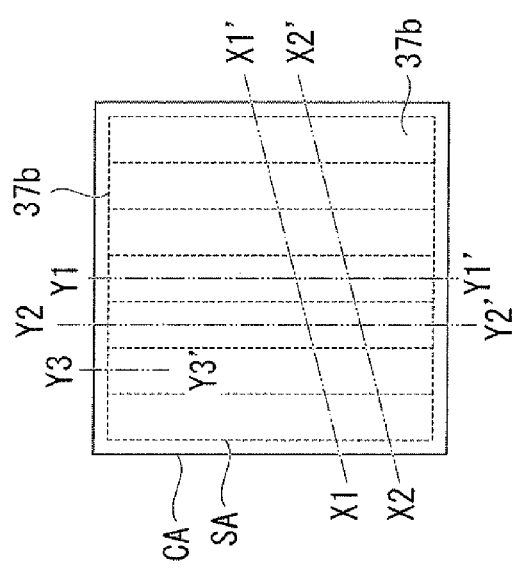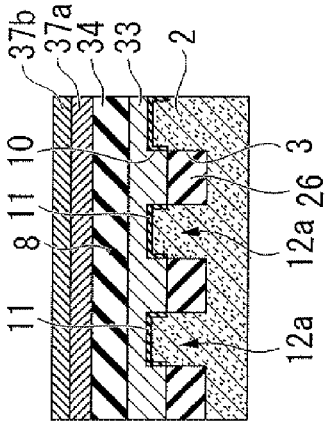

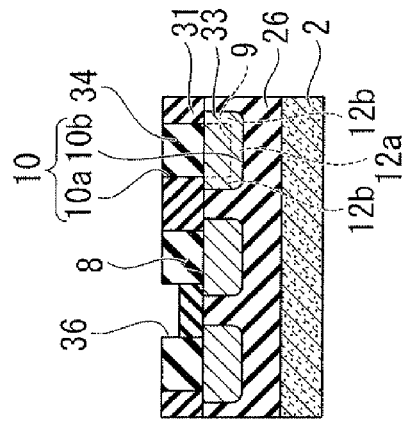
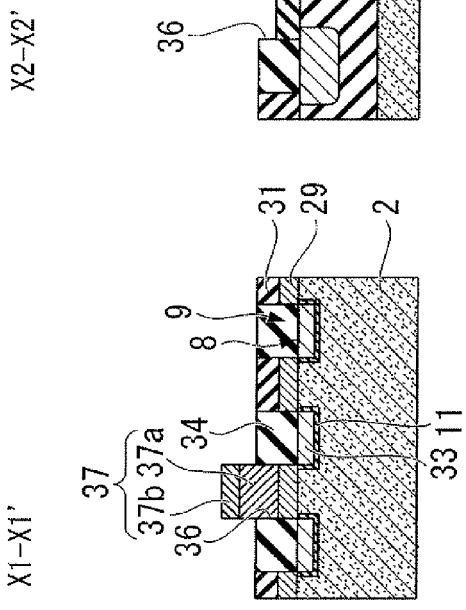
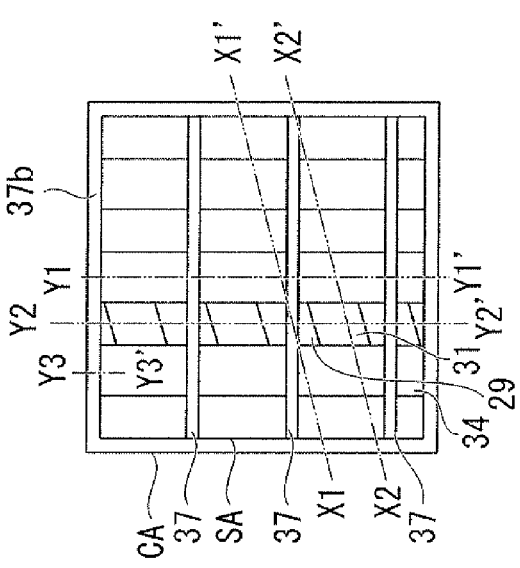
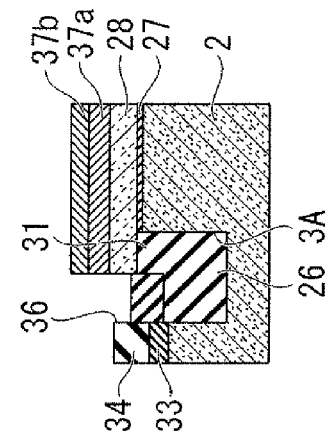
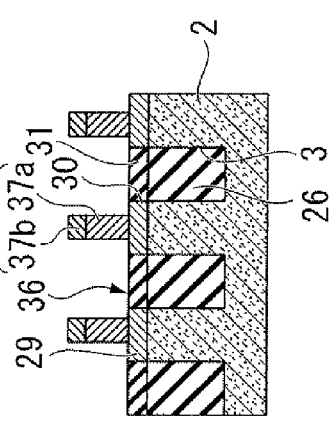
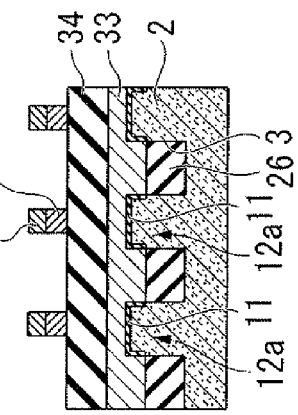

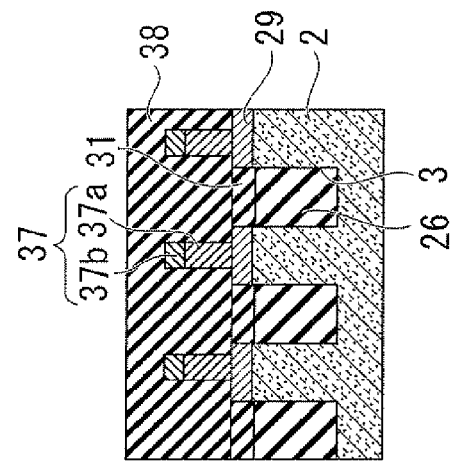
FIG. 28C  Y2-Y2'
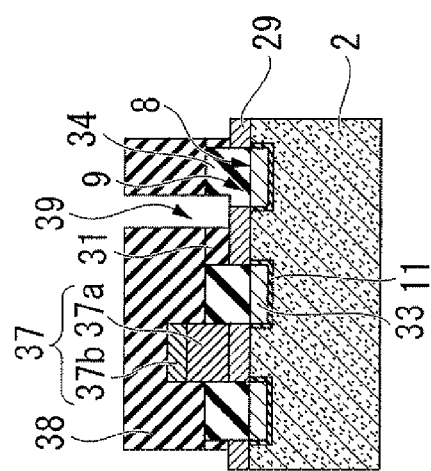
FIG. 28B  X1-X1'
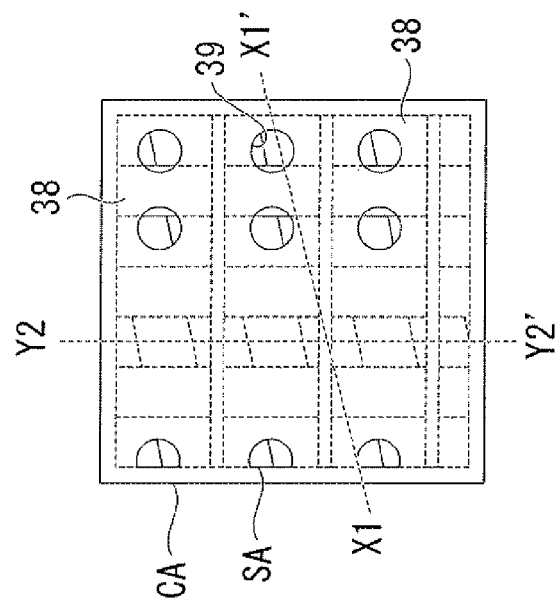
FIG. 28A

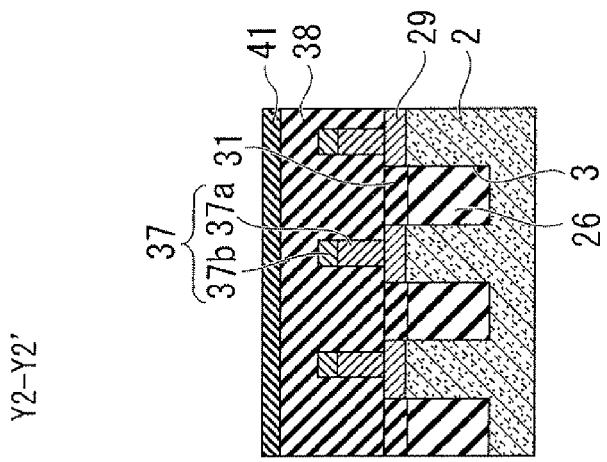
FIG. 29C Y2-Y2'
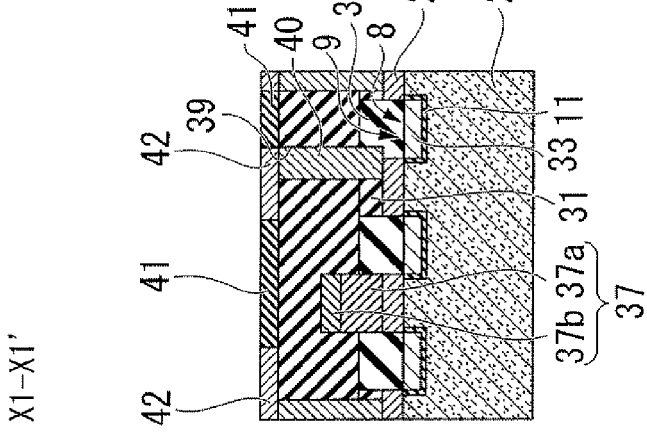
FIG. 29B X1-X1'
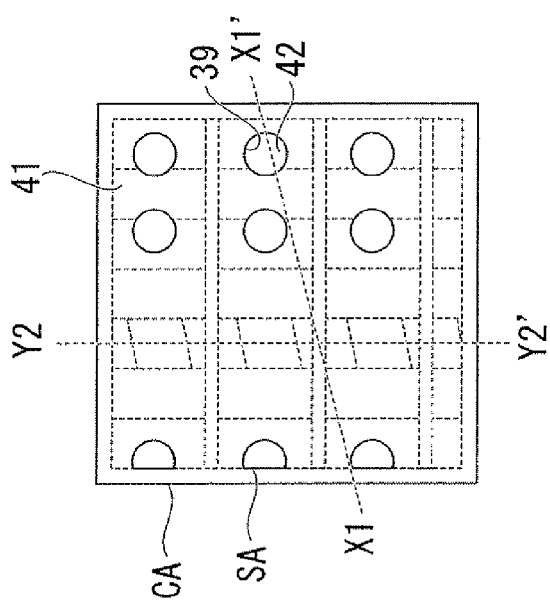
FIG. 29A

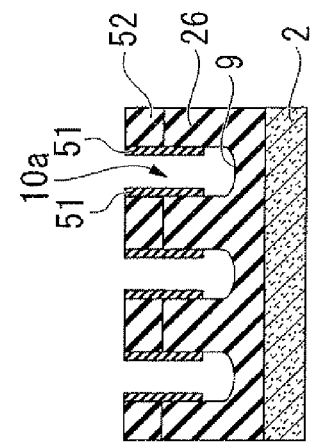
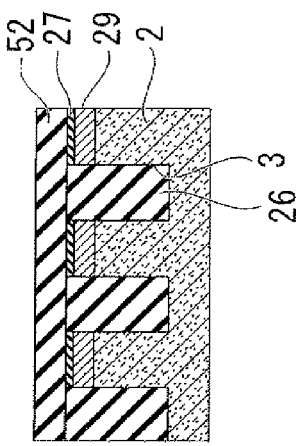
FIG. 37B
X1-X1'
FIG. 37C
X2-X2'
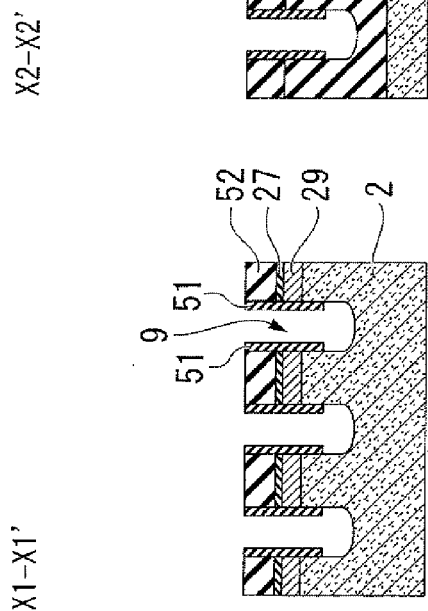
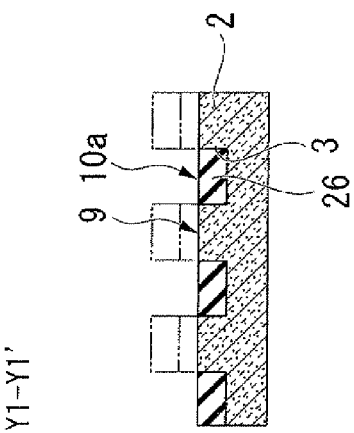
FIG. 37A
FIG. 37D
Y1-Y1'
FIG. 37E
Y2-Y2'
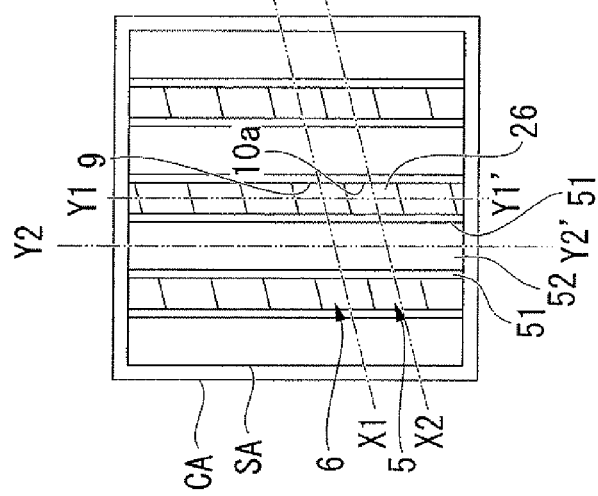

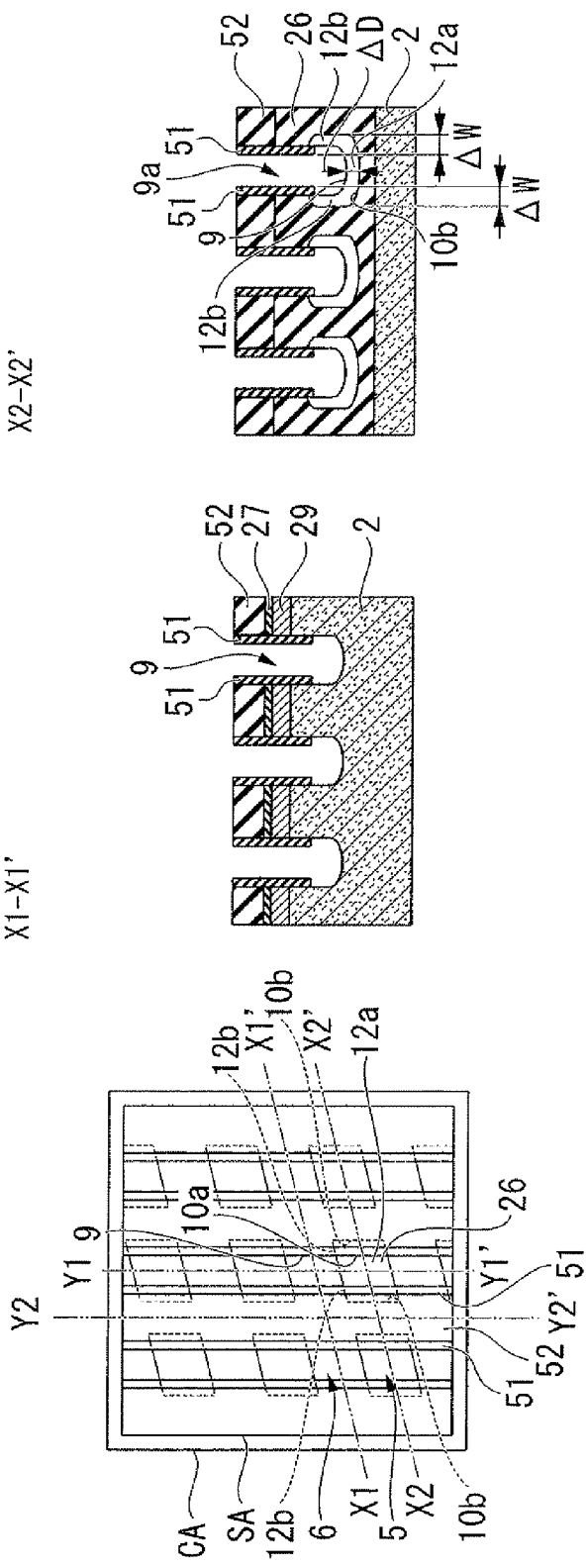

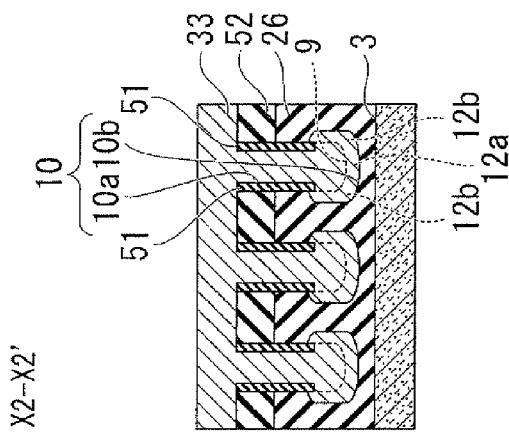
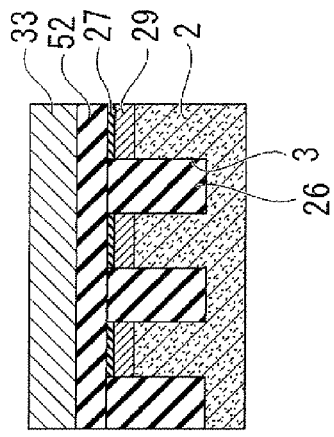
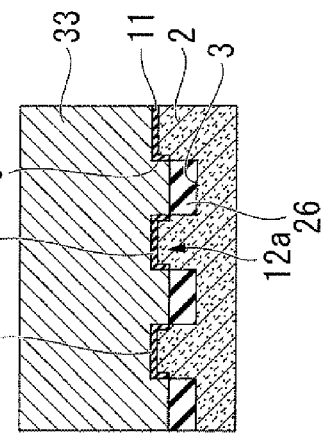
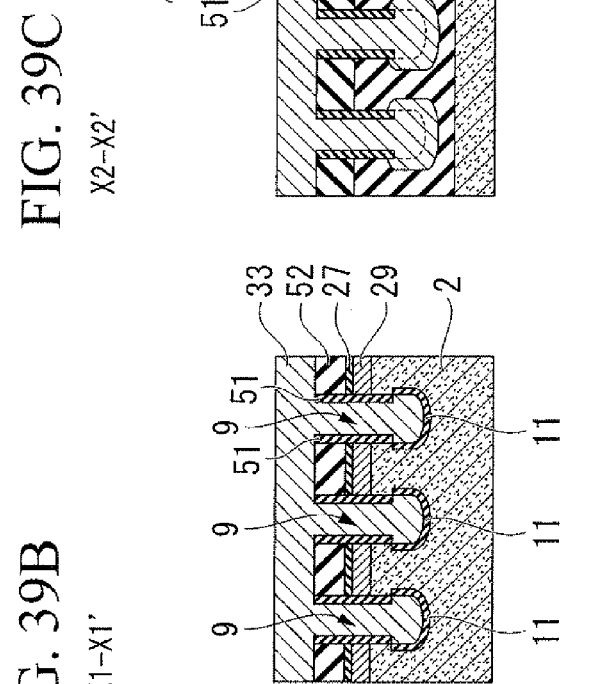
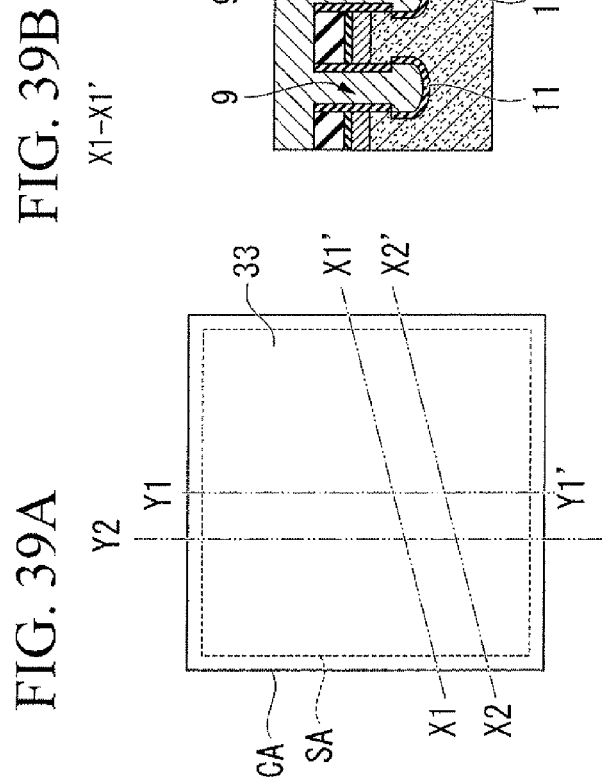

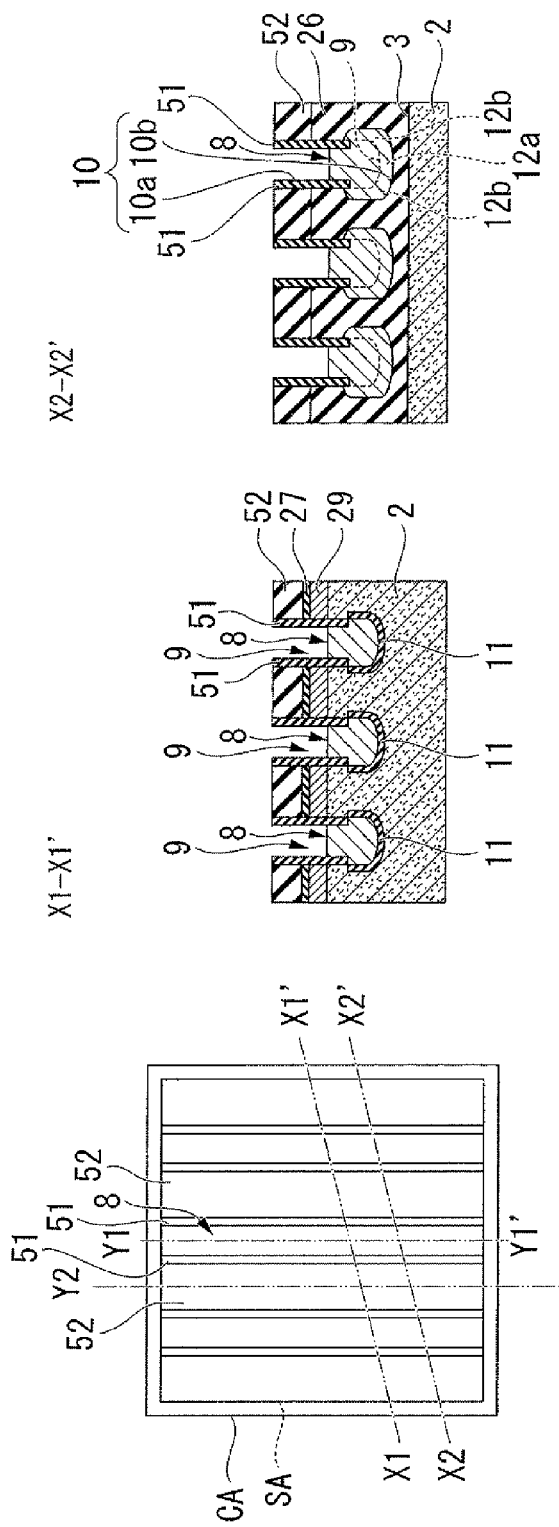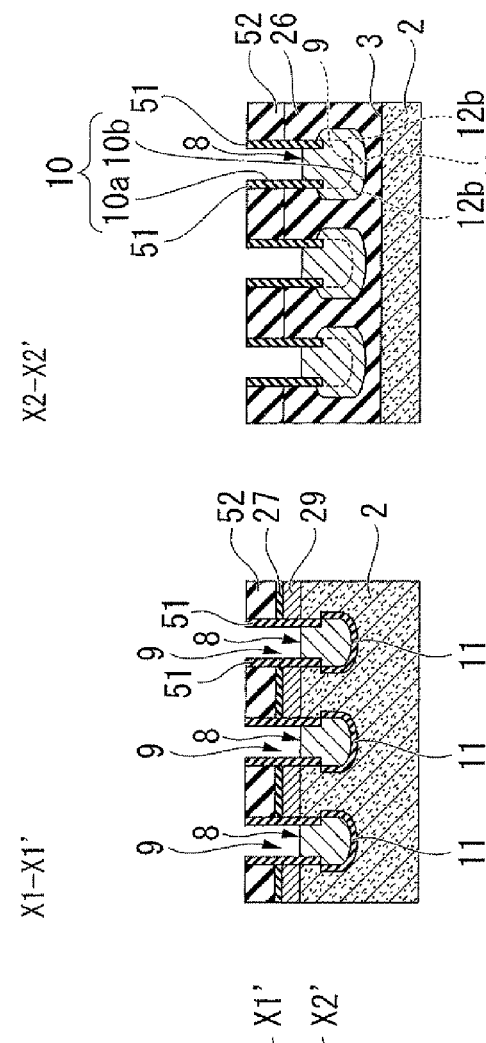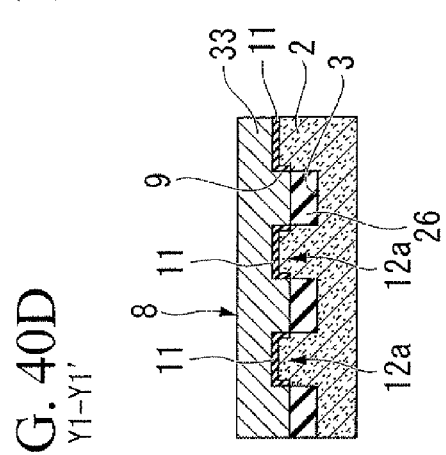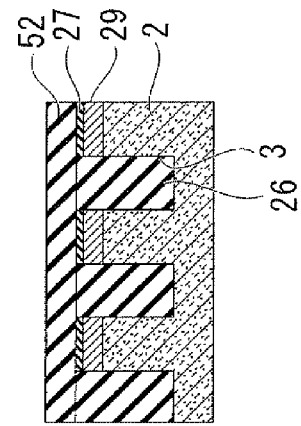

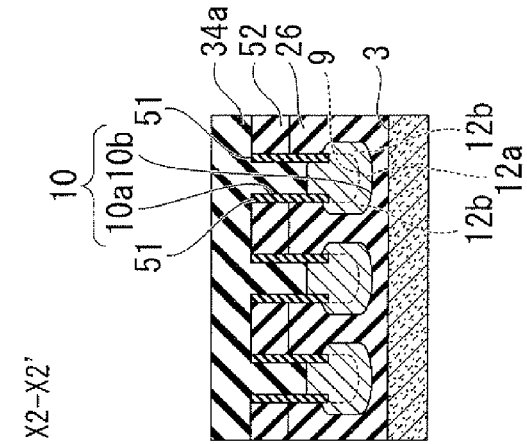
FIG. 41A
FIG. 41B
X1-X1'
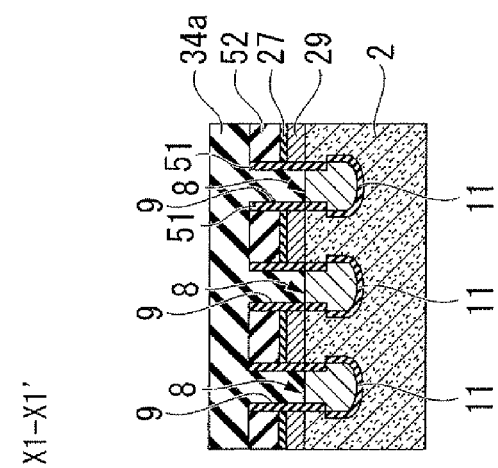
FIG. 41C
X2-X2'
FIG. 41D
Y1-Y1'
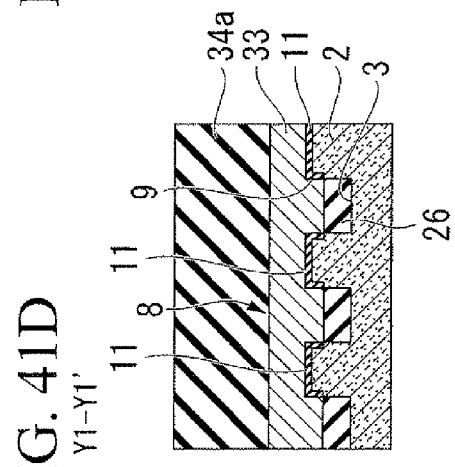
FIG. 41E
Y2-Y2'

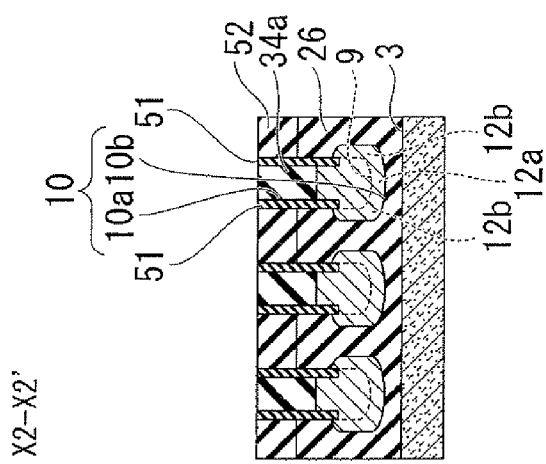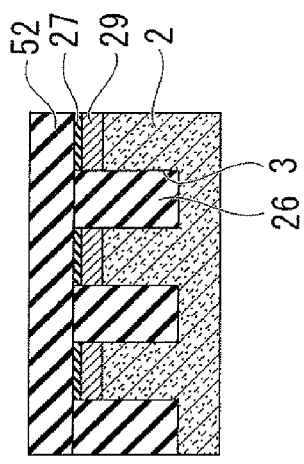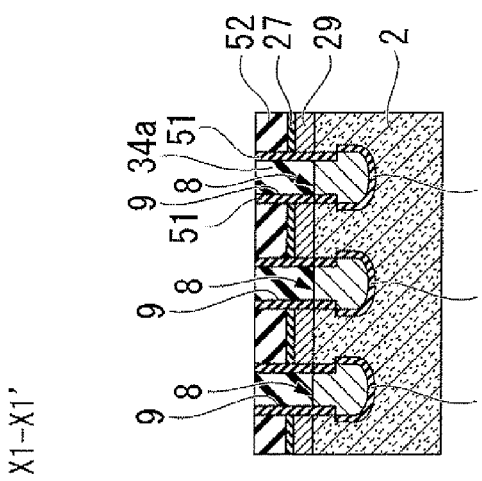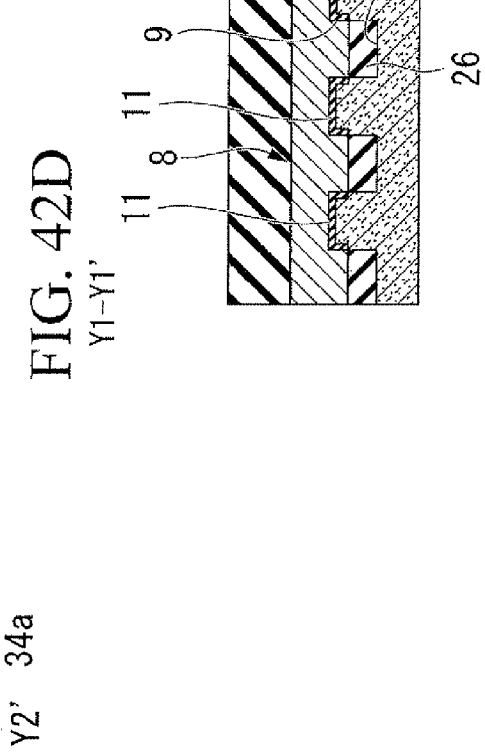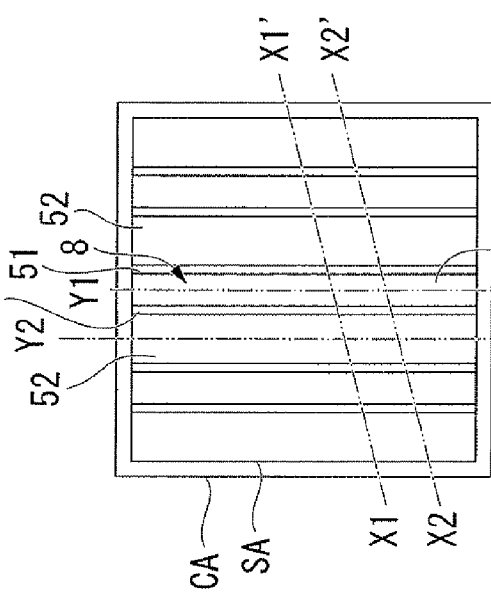

X2-X2'

X1-X1'

Y2-Y2'

Y1-Y1'

X2-X2'

Y2-Y2'

X1-X1'

Y1-Y1'

X2-X2'

Y2-Y2'

X1-X1'

Y1-Y1'

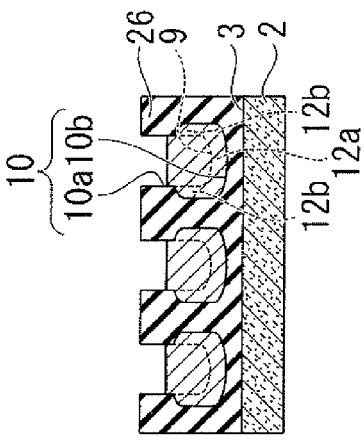
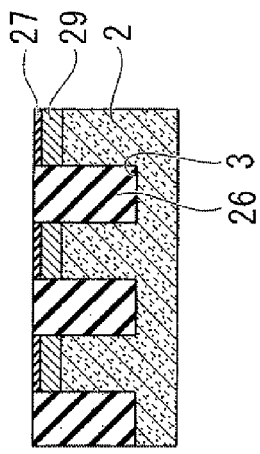
FIG. 49B X1-X1'
FIG. 49C X2-X2'
FIG. 49D Y1-Y1'
FIG. 49E Y2-Y2'
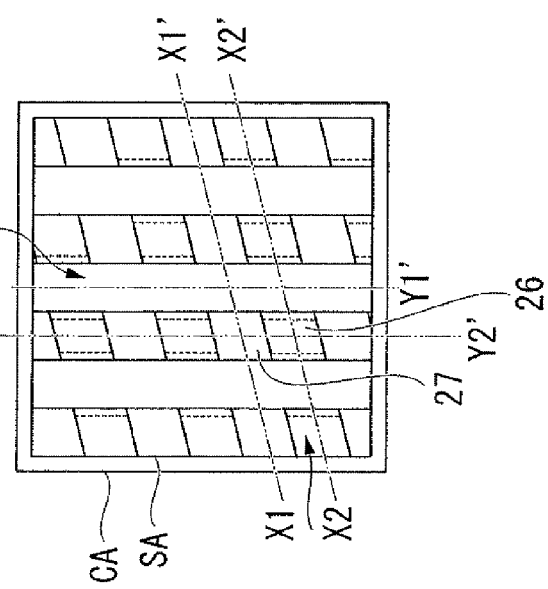
FIG. 49A

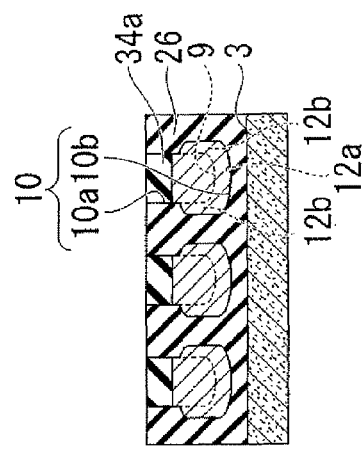
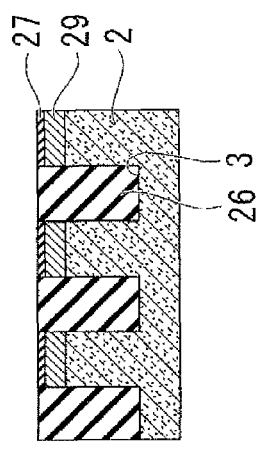
FIG. 50C
X2-X2'
FIG. 50E
Y2-Y2'
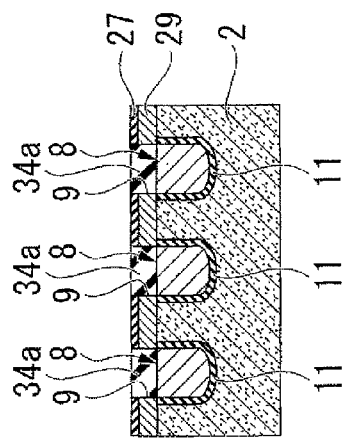
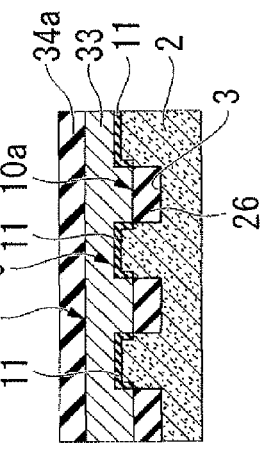
FIG. 50B
X1-X1'
FIG. 50D
Y1-Y1'
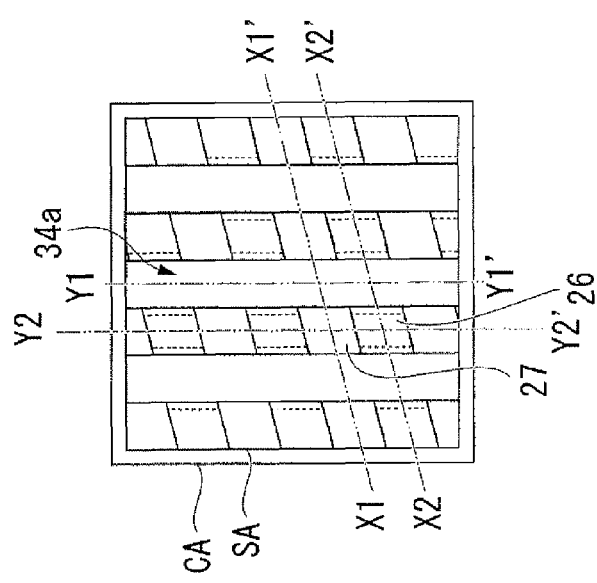
FIG. 50A

X2-X2'

Y2-Y2'

X1-X1'

Y1-Y1'

SEMICONDUCTOR DEVICE, METHOD OF FORMING SEMICONDUCTOR DEVICE, AND DATA PROCESSING SYSTEM

BACKGROUND OF THE INVENTION

1. Field of the Invention

The present invention relates to a semiconductor device, a method of forming a semiconductor device, and a data processing system.

Priority is claimed on Japanese Patent Application No. 2010-115538, May 19, 2010, the content of which is incorporated herein by reference.

2. Description of the Related Art

Recently, dimensions of transistors have become smaller due to miniaturization of semiconductor elements. The dimensional reductions of the transistors will cause remarkable short channel effects of the transistors. As the dimensions of memory cells in dynamic random access memories (DRAMs) and the like are reduced, the channel lengths of transistors are also reduced, which may cause degradation of the performance of transistors. The deterioration in retention of memory cells or writing characteristics has been problematic.

In view of the above, recess (trench) field effect transistors (FETs), fin FETs, and the like have been developed. The recess (trench) FET has a structure in which a trench (also called a groove) is formed in a semiconductor substrate to obtain a channel having a three-dimensional structure. Japanese Unexamined Patent Application, First Publications, Nos. JP-A-2005-064500, JP-A-2007-027753, and JP-A-2007-305827 disclose that the fin FET has a structure in which a fin is formed between trenches to obtain a channel having a three-dimensional structure.

The trench FET is formed by forming a trench in a semiconductor substrate and forming a gate electrode within the trench while a gate insulating film is interposed between the gate electrode and the semiconductor substrate. A channel of the trench FET has a three-dimensional structure. The fin FET is formed by forming a gate electrode over a gate insulting film so as to cross over a fin protruding from a bottom surface of the trenches formed in the semiconductor substrate. Consequently, the channel has a three-dimensional structure. In any case, it is possible to suppress the short channel effects because the gate length can be lengthened with respect to the channel width.

A study has been carried out to adopt buried gate transistors for selecting transistors included in memory cells in the DRAMs due to reduction in size of the memory cell. The buried gate transistor has a structure in which a gate electrode is buried in the semiconductor substrate.

The gate electrode of the buried gate transistor does not protrude from the surface of the substrate because the gate electrode (word line) is buried in the semiconductor substrate. Among wirings connected to memory cells, only bit lines are located over the semiconductor substrate. This will increase flexibility of layouts of capacitors, contact plugs, and the like, which are included in the memory cell and formed over the semiconductor substrate. This will reduce the difficulty of processing the capacitors, the contact plugs, and the like.

SUMMARY

In one embodiment, a semiconductor device may include, but is not limited to, a semiconductor substrate including a fin. The fin includes first and second fin portions. The first fin portion extends substantially in a horizontal direction to a surface of the semiconductor substrate. The second fin portion extends substantially in a vertical direction to the surface of the semiconductor substrate. The fin has a channel region.

In another embodiment, a semiconductor device may include, but is not limited to, the following elements. A semiconductor substrate includes an active region. The active region has a fin. The fin includes first, second, and third fin portions. The first fin portion extends substantially in a first horizontal direction to a surface of the semiconductor substrate. The second and third fin portions extend substantially in a vertical direction to the surface of the semiconductor substrate. An isolation region defines the active region. A word line extends over the isolation region and the active region. The word line extends across the fin. The word line extends substantially in a second horizontal direction perpendicular to the first horizontal direction. The word line has first and second portions. The first portion is interposed between the second and third fin portions. The second portion is over the isolation region. The first portion is smaller in width than the second portion.

In still another embodiment, a semiconductor device may include, but is not limited to, the following elements. A semiconductor substrate has a fin having a channel region in the vicinity of a surface of the fin. The fin includes an end portion. The end portion has first and second channel portions of the channel region. The first and second channel portions are opposed to each other. The first and second channel portions extend substantially vertical to a surface of the semiconductor substrate. A diffusion region has a bottom. The bottom is in contact with the end portion and with the first and second channel portions.

BRIEF DESCRIPTION OF THE DRAWINGS

The above features and advantages of the present invention will be more apparent from the following description of certain preferred embodiments taken in conjunction with the accompanying drawings, in which:

FIG. 11A is a fragmentary plan view illustrating a transistor in a step, subsequent to the step of FIGS. 10A through 10F, involved in the method of forming the semiconductor device in accordance with one embodiment of the present invention;

FIG. 11B is a fragmentary cross sectional elevation view, taken along an X1-X1' line of FIG. 11A, illustrating the transistor in a step, subsequent to the step of FIGS. 10A through 10F, involved in the method of forming the semiconductor device in accordance with one embodiment of the present invention;

FIG. 11C is a fragmentary cross sectional elevation view, taken along an X2-X2' line of FIG. 11A, illustrating the transistor in a step, subsequent to the step of FIGS. 10A through 10F, involved in the method of forming the semiconductor device in accordance with one embodiment of the present invention;

FIG. 11D is a fragmentary cross sectional elevation view, taken along a Y1-Y1' line of FIG. 11A, illustrating the transistor in a step, subsequent to the step of FIGS. 10A through 10F, involved in the method of forming the semiconductor device in accordance with one embodiment of the present invention;

FIG. 11E is a fragmentary cross sectional elevation view, taken along a Y2-Y2' line of FIG. 11A, illustrating the transistor in a step, subsequent to the step of FIGS. 10A through 10F, involved in the method of forming the semiconductor device in accordance with one embodiment of the present invention;

FIG. 11F is a fragmentary cross sectional elevation view, taken along a Y3-Y3' line of FIG. 11A, illustrating the transistor in a step, subsequent to the step of FIGS. 10A through 10F, involved in the method of forming the semiconductor device in accordance with one embodiment of the present invention;

FIG. 13A is a fragmentary plan view illustrating a transistor in a step, subsequent to the step of FIGS. 12A through 12F, involved in the method of forming the semiconductor device in accordance with one embodiment of the present invention;

FIG. 13B is a fragmentary cross sectional elevation view, taken along an X1-X1' line of FIG. 13A, illustrating the transistor in a step, subsequent to the step of FIGS. 12A through 12F, involved in the method of forming the semiconductor device in accordance with one embodiment of the present invention;

FIG. 13C is a fragmentary cross sectional elevation view, taken along an X2-X2' line of FIG. 13A, illustrating the transistor in a step, subsequent to the step of FIGS. 12A through 12F, involved in the method of forming the semiconductor device in accordance with one embodiment of the present invention;

FIG. 13D is a fragmentary cross sectional elevation view, taken along a Y1-Y1' line of FIG. 13A, illustrating the transistor in a step, subsequent to the step of FIGS. 12A through 12F, involved in the method of forming the semiconductor device in accordance with one embodiment of the present invention;

FIG. 13E is a fragmentary cross sectional elevation view, taken along a Y2-Y2' line of FIG. 13A, illustrating the transistor in a step, subsequent to the step of FIGS. 12A through 12F, involved in the method of forming the semiconductor device in accordance with one embodiment of the present invention;

FIG. 13F is a fragmentary cross sectional elevation view, taken along a Y3-Y3' line of FIG. 13A, illustrating the transistor in a step, subsequent to the step of FIGS. 12A through 12F, involved in the method of forming the semiconductor device in accordance with one embodiment of the present invention;

FIG. 15A is a fragmentary plan view illustrating a transistor in a step, subsequent to the step of FIGS. 14A through 14F, involved in the method of forming the semiconductor device in accordance with one embodiment of the present invention;

FIG. 15B is a fragmentary cross sectional elevation view, taken along an X1-X1' line of FIG. 15A, illustrating the transistor in a step, subsequent to the step of FIGS. 14A through 14F, involved in the method of forming the semiconductor device in accordance with one embodiment of the present invention;

FIG. 15C is a fragmentary cross sectional elevation view, taken along an X2-X2' line of FIG. 15A, illustrating the transistor in a step, subsequent to the step of FIGS. 14A through 14F, involved in the method of forming the semiconductor device in accordance with one embodiment of the present invention;

FIG. 15D is a fragmentary cross sectional elevation view, taken along a Y1-Y1' line of FIG. 15A, illustrating the transistor in a step, subsequent to the step of FIGS. 14A through 14F, involved in the method of forming the semiconductor device in accordance with one embodiment of the present invention;

FIG. 15E is a fragmentary cross sectional elevation view, taken along a Y2-Y2' line of FIG. 15A, illustrating the transistor in a step, subsequent to the step of FIGS. 14A through 14F, involved in the method of forming the semiconductor device in accordance with one embodiment of the present invention;

FIG. 15F is a fragmentary cross sectional elevation view, taken along a Y3-Y3' line of FIG. 15A, illustrating the transistor in a step, subsequent to the step of FIGS. 14A through 14F, involved in the method of forming the semiconductor device in accordance with one embodiment of the present invention;

FIG. 16A is a fragmentary plan view illustrating a transistor in a step, subsequent to the step of FIGS. 15A through 15F, involved in the method of forming the semiconductor device in accordance with one embodiment of the present invention;

FIG. 16B is a fragmentary cross sectional elevation view, taken along an X1-X1' line of FIG. 16A, illustrating the transistor in a step, subsequent to the step of FIGS. 15A through 15F, involved in the method of forming the semiconductor device in accordance with one embodiment of the present invention;

FIG. 16C is a fragmentary cross sectional elevation view, taken along an X2-X2' line of FIG. 16A, illustrating the transistor in a step, subsequent to the step of FIGS. 15A through 15F, involved in the method of forming the semiconductor device in accordance with one embodiment of the present invention;

FIG. 16D is a fragmentary cross sectional elevation view, taken along a Y1-Y1' line of FIG. 16A, illustrating the transistor in a step, subsequent to the step of FIGS. 15A through 15F, involved in the method of forming the semiconductor device in accordance with one embodiment of the present invention;

FIG. 16E is a fragmentary cross sectional elevation view, taken along a Y2-Y2' line of FIG. 16A, illustrating the transistor in a step, subsequent to the step of FIGS. 15A through 15F, involved in the method of forming the semiconductor device in accordance with one embodiment of the present invention;

FIG. 16F is a fragmentary cross sectional elevation view, taken along a Y3-Y3' line of FIG. 16A, illustrating the transistor in a step, subsequent to the step of FIGS. 15A through 15F, involved in the method of forming the semiconductor device in accordance with one embodiment of the present invention;

FIG. 17A is a fragmentary plan view illustrating a transistor in a step, subsequent to the step of FIGS. 16A through 16F, involved in the method of forming the semiconductor device in accordance with one embodiment of the present invention;

FIG. 17B is a fragmentary cross sectional elevation view, taken along an X1-X1' line of FIG. 17A, illustrating the transistor in a step, subsequent to the step of FIGS. 16A through 16F, involved in the method of forming the semiconductor device in accordance with one embodiment of the present invention;

FIG. 17C is a fragmentary cross sectional elevation view, taken along an X2-X2' line of FIG. 17A, illustrating the transistor in a step, subsequent to the step of FIGS. 16A through 16F, involved in the method of forming the semiconductor device in accordance with one embodiment of the present invention;

FIG. 17D is a fragmentary cross sectional elevation view, taken along a Y1-Y1' line of FIG. 17A, illustrating the transistor in a step, subsequent to the step of FIGS. 16A through 16F, involved in the method of forming the semiconductor device in accordance with one embodiment of the present invention;

FIG. 17E is a fragmentary cross sectional elevation view, taken along a Y2-Y2' line of FIG. 17A, illustrating the transistor in a step, subsequent to the step of FIGS. 16A through 16F, involved in the method of forming the semiconductor device in accordance with one embodiment of the present invention;

FIG. 17F is a fragmentary cross sectional elevation view, taken along a Y3-Y3' line of FIG. 17A, illustrating the transistor in a step, subsequent to the step of FIGS. 16A through 16F, involved in the method of forming the semiconductor device in accordance with one embodiment of the present invention;

FIG. 18A is a fragmentary plan view illustrating a transistor in a step, subsequent to the step of FIGS. 17A through 17F, involved in the method of forming the semiconductor device in accordance with one embodiment of the present invention;

FIG. 18B is a fragmentary cross sectional elevation view, taken along an X1-X1' line of FIG. 18A, illustrating the transistor in a step, subsequent to the step of FIGS. 17A through 17F, involved in the method of forming the semiconductor device in accordance with one embodiment of the present invention;

FIG. 18C is a fragmentary cross sectional elevation view, taken along an X2-X2' line of FIG. 18A, illustrating the transistor in a step, subsequent to the step of FIGS. 17A through 17F, involved in the method of forming the semiconductor device in accordance with one embodiment of the present invention;

FIG. 18D is a fragmentary cross sectional elevation view, taken along a Y1-Y1' line of FIG. 18A, illustrating the transistor in a step, subsequent to the step of FIGS. 17A through 17F, involved in the method of forming the semiconductor device in accordance with one embodiment of the present invention;

FIG. 18E is a fragmentary cross sectional elevation view, taken along a Y2-Y2' line of FIG. 18A, illustrating the transistor in a step, subsequent to the step of FIGS. 17A through 17F, involved in the method of forming the semiconductor device in accordance with one embodiment of the present invention;

FIG. 18F is a fragmentary cross sectional elevation view, taken along a Y3-Y3' line of FIG. 18A, illustrating the transistor in a step, subsequent to the step of FIGS. 17A through 17F, involved in the method of forming the semiconductor device in accordance with one embodiment of the present invention;

FIG. 19A is a fragmentary plan view illustrating a transistor in a step, subsequent to the step of FIGS. 18A through 18F, involved in the method of forming the semiconductor device in accordance with one embodiment of the present invention;

FIG. 19B is a fragmentary cross sectional elevation view, taken along an X1-X1' line of FIG. 19A, illustrating the transistor in a step, subsequent to the step of FIGS. 18A through 18F, involved in the method of forming the semiconductor device in accordance with one embodiment of the present invention;

FIG. 19C is a fragmentary cross sectional elevation view, taken along an X2-X2' line of FIG. 19A, illustrating the transistor in a step, subsequent to the step of FIGS. 18A through 18F, involved in the method of forming the semiconductor device in accordance with one embodiment of the present invention;

FIG. 19D is a fragmentary cross sectional elevation view, taken along a Y1-Y1' line of FIG. 19A, illustrating the transistor in a step, subsequent to the step of FIGS. 18A through 18F, involved in the method of forming the semiconductor device in accordance with one embodiment of the present invention;

FIG. 19E is a fragmentary cross sectional elevation view, taken along a Y2-Y2' line of FIG. 19A, illustrating the transistor in a step, subsequent to the step of FIGS. 18A through 18F, involved in the method of forming the semiconductor device in accordance with one embodiment of the present invention;

FIG. 19F is a fragmentary cross sectional elevation view, taken along a Y3-Y3' line of FIG. 19A, illustrating the transistor in a step, subsequent to the step of FIGS. 18A through 18F, involved in the method of forming the semiconductor device in accordance with one embodiment of the present invention;

FIG. 20A is a fragmentary plan view illustrating a transistor in a step, subsequent to the step of FIGS. 19A through 19F, involved in the method of forming the semiconductor device in accordance with one embodiment of the present invention;

FIG. 20B is a fragmentary cross sectional elevation view, taken along an X1-X1' line of FIG. 20A, illustrating the transistor in a step, subsequent to the step of FIGS. 19A through 19F, involved in the method of forming the semiconductor device in accordance with one embodiment of the present invention;

FIG. 20C is a fragmentary cross sectional elevation view, taken along an X2-X2' line of FIG. 20A, illustrating the transistor in a step, subsequent to the step of FIGS. 19A through 19F, involved in the method of forming the semiconductor device in accordance with one embodiment of the present invention;

FIG. 20D is a fragmentary cross sectional elevation view, taken along a Y1-Y1' line of FIG. 20A, illustrating the transistor in a step, subsequent to the step of FIGS. 19A through 19F, involved in the method of forming the semiconductor device in accordance with one embodiment of the present invention;

FIG. 20E is a fragmentary cross sectional elevation view, taken along a Y2-Y2' line of FIG. 20A, illustrating the transistor in a step, subsequent to the step of FIGS. 19A through 19F, involved in the method of forming the semiconductor device in accordance with one embodiment of the present invention;

FIG. 20F is a fragmentary cross sectional elevation view, taken along a Y3-Y3' line of FIG. 20A, illustrating the transistor in a step, subsequent to the step of FIGS. 19A through 19F, involved in the method of forming the semiconductor device in accordance with one embodiment of the present invention;

FIG. 22A is a fragmentary plan view illustrating a transistor in a step, subsequent to the step of FIGS. 21A through 21F, involved in the method of forming the semiconductor device in accordance with one embodiment of the present invention;

FIG. 22B is a fragmentary cross sectional elevation view, taken along an X1-X1' line of FIG. 22A, illustrating the transistor in a step, subsequent to the step of FIGS. 21A through 21F, involved in the method of forming the semiconductor device in accordance with one embodiment of the present invention;

FIG. 22C is a fragmentary cross sectional elevation view, taken along an X2-X2' line of FIG. 22A, illustrating the transistor in a step, subsequent to the step of FIGS. 21A through 21F, involved in the method of forming the semiconductor device in accordance with one embodiment of the present invention;

FIG. 22D is a fragmentary cross sectional elevation view, taken along a Y1-Y1' line of FIG. 22A, illustrating the transistor in a step, subsequent to the step of FIGS. 21A through 21F, involved in the method of forming the semiconductor device in accordance with one embodiment of the present invention;

FIG. 22E is a fragmentary cross sectional elevation view, taken along a Y2-Y2' line of FIG. 22A, illustrating the transistor in a step, subsequent to the step of FIGS. 21A through 21F, involved in the method of forming the semiconductor device in accordance with one embodiment of the present invention;

FIG. 22F is a fragmentary cross sectional elevation view, taken along a Y3-Y3' line of FIG. 22A, illustrating the transistor in a step, subsequent to the step of FIGS. 21A through 21F, involved in the method of forming the semiconductor device in accordance with one embodiment of the present invention;

FIG. 23A is a fragmentary plan view illustrating a transistor in a step, subsequent to the step of FIGS. 22A through 22F, involved in the method of forming the semiconductor device in accordance with one embodiment of the present invention;

FIG. 23B is a fragmentary cross sectional elevation view, taken along an X1-X1' line of FIG. 23A, illustrating the transistor in a step, subsequent to the step of FIGS. 22A through 22F, involved in the method of forming the semiconductor device in accordance with one embodiment of the present invention;

FIG. 23C is a fragmentary cross sectional elevation view, taken along an X2-X2' line of FIG. 23A, illustrating the transistor in a step, subsequent to the step of FIGS. 22A through 22F, involved in the method of forming the semiconductor device in accordance with one embodiment of the present invention;

FIG. 23D is a fragmentary cross sectional elevation view, taken along a Y1-Y1' line of FIG. 23A, illustrating the transistor in a step, subsequent to the step of FIGS. 22A through 22F, involved in the method of forming the semiconductor device in accordance with one embodiment of the present invention;

FIG. 23E is a fragmentary cross sectional elevation view, taken along a Y2-Y2' line of FIG. 23A, illustrating the transistor in a step, subsequent to the step of FIGS. 22A through 22F, involved in the method of forming the semiconductor device in accordance with one embodiment of the present invention;

FIG. 23F is a fragmentary cross sectional elevation view, taken along a Y3-Y3' line of FIG. 23A, illustrating the transistor in a step, subsequent to the step of FIGS. 22A through 22F, involved in the method of forming the semiconductor device in accordance with one embodiment of the present invention;

FIG. 24A is a fragmentary plan view illustrating a transistor in a step, subsequent to the step of FIGS. 23A through 23F, involved in the method of forming the semiconductor device in accordance with one embodiment of the present invention;

FIG. 24B is a fragmentary cross sectional elevation view, taken along an X1-X1' line of FIG. 24A, illustrating the transistor in a step, subsequent to the step of FIGS. 23A through 23F, involved in the method of forming the semiconductor device in accordance with one embodiment of the present invention;

FIG. 24C is a fragmentary cross sectional elevation view, taken along an X2-X2' line of FIG. 24A, illustrating the transistor in a step, subsequent to the step of FIGS. 23A through 23F, involved in the method of forming the semiconductor device in accordance with one embodiment of the present invention;

FIG. 24D is a fragmentary cross sectional elevation view, taken along a Y1-Y1' line of FIG. 24A, illustrating the transistor in a step, subsequent to the step of FIGS. 23A through 23F, involved in the method of forming the semiconductor device in accordance with one embodiment of the present invention;

FIG. 24E is a fragmentary cross sectional elevation view, taken along a Y2-Y2' line of FIG. 24A, illustrating the transistor in a step, subsequent to the step of FIGS. 23A through 23F, involved in the method of forming the semiconductor device in accordance with one embodiment of the present invention;

FIG. 24F is a fragmentary cross sectional elevation view, taken along a Y3-Y3' line of FIG. 24A, illustrating the transistor in a step, subsequent to the step of FIGS. 23A through 23F, involved in the method of forming the semiconductor device in accordance with one embodiment of the present invention;

FIG. 25A is a fragmentary plan view illustrating a transistor in a step, subsequent to the step of FIGS. 24A through 24F, involved in the method of forming the semiconductor device in accordance with one embodiment of the present invention;

FIG. 25B is a fragmentary cross sectional elevation view, taken along an X1-X1' line of FIG. 25A, illustrating the transistor in a step, subsequent to the step of FIGS. 24A through 24F, involved in the method of forming the semiconductor device in accordance with one embodiment of the present invention;

FIG. 25C is a fragmentary cross sectional elevation view, taken along an X2-X2' line of FIG. 25A, illustrating the transistor in a step, subsequent to the step of FIGS. 24A through 24F, involved in the method of forming the semiconductor device in accordance with one embodiment of the present invention;

FIG. 25D is a fragmentary cross sectional elevation view, taken along a Y1-Y1' line of FIG. 25A, illustrating the transistor in a step, subsequent to the step of FIGS. 24A through 24F, involved in the method of forming the semiconductor device in accordance with one embodiment of the present invention;

FIG. 25E is a fragmentary cross sectional elevation view, taken along a Y2-Y2' line of FIG. 25A, illustrating the transistor in a step, subsequent to the step of FIGS. 24A through 24F, involved in the method of forming the semiconductor device in accordance with one embodiment of the present invention;

FIG. 25F is a fragmentary cross sectional elevation view, taken along a Y3-Y3' line of FIG. 25A, illustrating the transistor in a step, subsequent to the step of FIGS. 24A through 24F, involved in the method of forming the semiconductor device in accordance with one embodiment of the present invention;

FIG. 26A is a fragmentary plan view illustrating a transistor in a step, subsequent to the step of FIGS. 25A through 25F, involved in the method of forming the semiconductor device in accordance with one embodiment of the present invention;

FIG. 26B is a fragmentary cross sectional elevation view, taken along an X1-X1' line of FIG. 26A, illustrating the transistor in a step, subsequent to the step of FIGS. 25A through 25F, involved in the method of forming the semiconductor device in accordance with one embodiment of the present invention;

FIG. 26C is a fragmentary cross sectional elevation view, taken along an X2-X2' line of FIG. 26A, illustrating the transistor in a step, subsequent to the step of FIGS. 25A through 25F, involved in the method of forming the semiconductor device in accordance with one embodiment of the present invention;

FIG. 26D is a fragmentary cross sectional elevation view, taken along a Y1-Y1' line of FIG. 26A, illustrating the transistor in a step, subsequent to the step of FIGS. 25A through 25F, involved in the method of forming the semiconductor device in accordance with one embodiment of the present invention;

FIG. 26E is a fragmentary cross sectional elevation view, taken along a Y2-Y2' line of FIG. 26A, illustrating the transistor in a step, subsequent to the step of FIGS. 25A through 25F, involved in the method of forming the semiconductor device in accordance with one embodiment of the present invention;

FIG. 26F is a fragmentary cross sectional elevation view, taken along a Y3-Y3' line of FIG. 26A, illustrating the transistor in a step, subsequent to the step of FIGS. 25A through 25F, involved in the method of forming the semiconductor device in accordance with one embodiment of the present invention;

FIG. 27A is a fragmentary plan view illustrating a transistor in a step, subsequent to the step of FIGS. 26A through 26F, involved in the method of forming the semiconductor device in accordance with one embodiment of the present invention;

FIG. 27B is a fragmentary cross sectional elevation view, taken along an X1-X1' line of FIG. 27A, illustrating the transistor in a step, subsequent to the step of FIGS. 26A through 26F, involved in the method of forming the semiconductor device in accordance with one embodiment of the present invention;

FIG. 27C is a fragmentary cross sectional elevation view, taken along an X2-X2' line of FIG. 27A, illustrating the transistor in a step, subsequent to the step of FIGS. 26A through 26F, involved in the method of forming the semiconductor device in accordance with one embodiment of the present invention;

FIG. 27D is a fragmentary cross sectional elevation view, taken along a Y1-Y1' line of FIG. 27A, illustrating the transistor in a step, subsequent to the step of FIGS. 26A through 26F, involved in the method of forming the semiconductor device in accordance with one embodiment of the present invention;

FIG. 27E is a fragmentary cross sectional elevation view, taken along a Y2-Y2' line of FIG. 27A, illustrating the transistor in a step, subsequent to the step of FIGS. 26A through 26F, involved in the method of forming the semiconductor device in accordance with one embodiment of the present invention;

FIG. 27F is a fragmentary cross sectional elevation view, taken along a Y3-Y3' line of FIG. 27A, illustrating the transistor in a step, subsequent to the step of FIGS. 26A through 26F, involved in the method of forming the semiconductor device in accordance with one embodiment of the present invention;

FIG. 28A is a fragmentary plan view illustrating a transistor in a step, subsequent to the step of FIGS. 27A through 27F, involved in the method of forming the semiconductor device in accordance with one embodiment of the present invention;

FIG. 28B is a fragmentary cross sectional elevation view, taken along an X1-X1' line of FIG. 28A, illustrating the transistor in a step, subsequent to the step of FIGS. 27A through 27F, involved in the method of forming the semiconductor device in accordance with one embodiment of the present invention;

FIG. 28C is a fragmentary cross sectional elevation view, taken along a Y2-Y2' line of FIG. 28A, illustrating the transistor in a step, subsequent to the step of FIGS. 27A through 27F, involved in the method of forming the semiconductor device in accordance with one embodiment of the present invention;

FIG. 29A is a fragmentary plan view illustrating a transistor in a step, subsequent to the step of FIGS. 28A through 28F, involved in the method of forming the semiconductor device in accordance with one embodiment of the present invention;

FIG. 29B is a fragmentary cross sectional elevation view, taken along an X1-X1' line of FIG. 29A, illustrating the transistor in a step, subsequent to the step of FIGS. 28A through 28F, involved in the method of forming the semiconductor device in accordance with one embodiment of the present invention;

FIG. 29C is a fragmentary cross sectional elevation view, taken along a Y2-Y2' line of FIG. 29A, illustrating the transistor in a step, subsequent to the step of FIGS. 28A through 28F, involved in the method of forming the semiconductor device in accordance with one embodiment of the present invention;

FIG. 30A is a fragmentary cross sectional elevation view, taken along an X1-X1' line, illustrating the transistor and a cylindrical capacitor in a step, subsequent to the step of FIGS. 29A through 29F, involved in the method of forming the semiconductor device in accordance with one embodiment of the present invention;

FIG. 30B is a fragmentary cross sectional elevation view, taken along an X1-X1' line, illustrating the transistor and a crown capacitor in a step, subsequent to the step of FIGS. 27A through 27F, involved in the method of forming the semiconductor device in accordance with one embodiment of the present invention;

Figure 31:
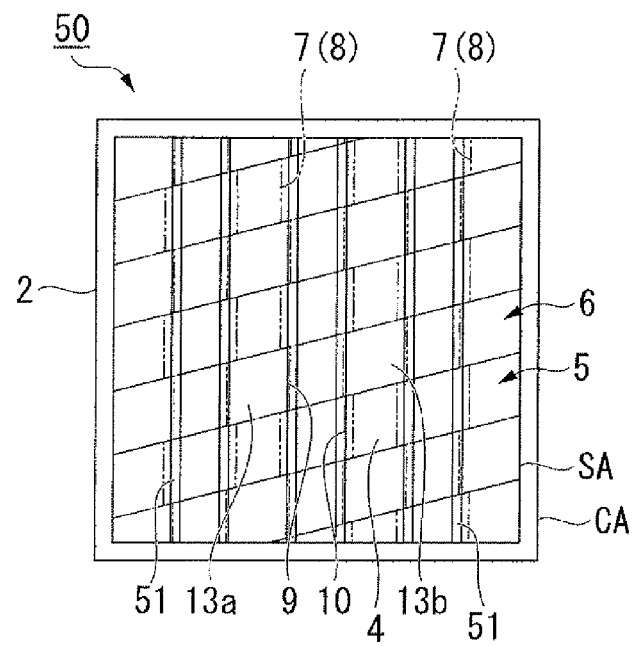
Figure 32:
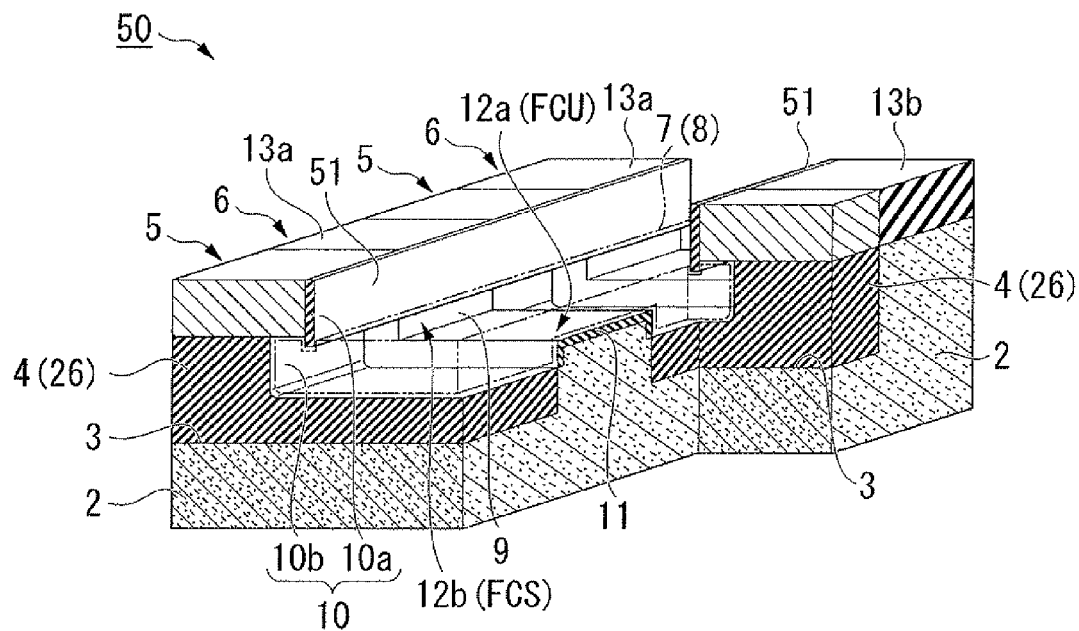
Figure 33:
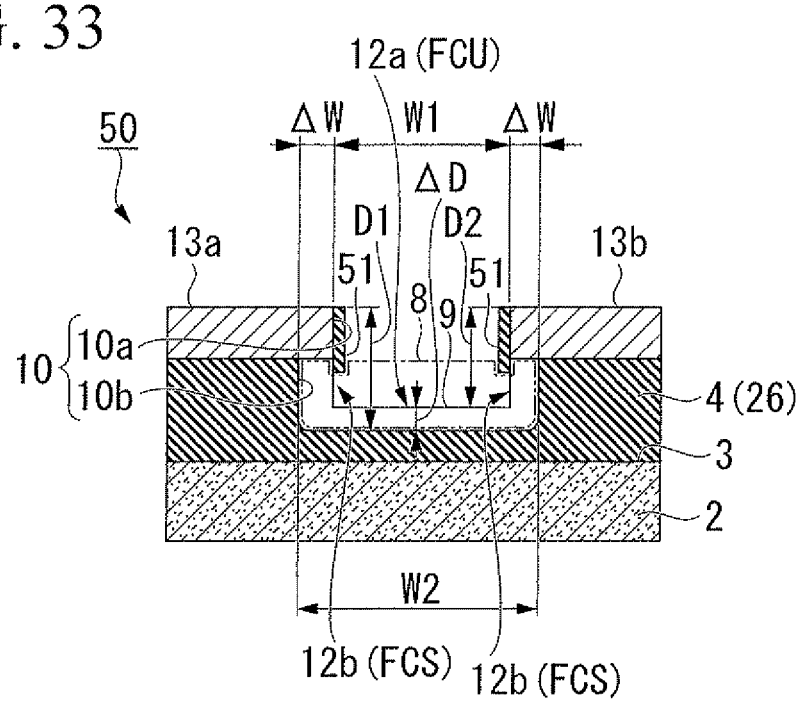
Figure 34A:
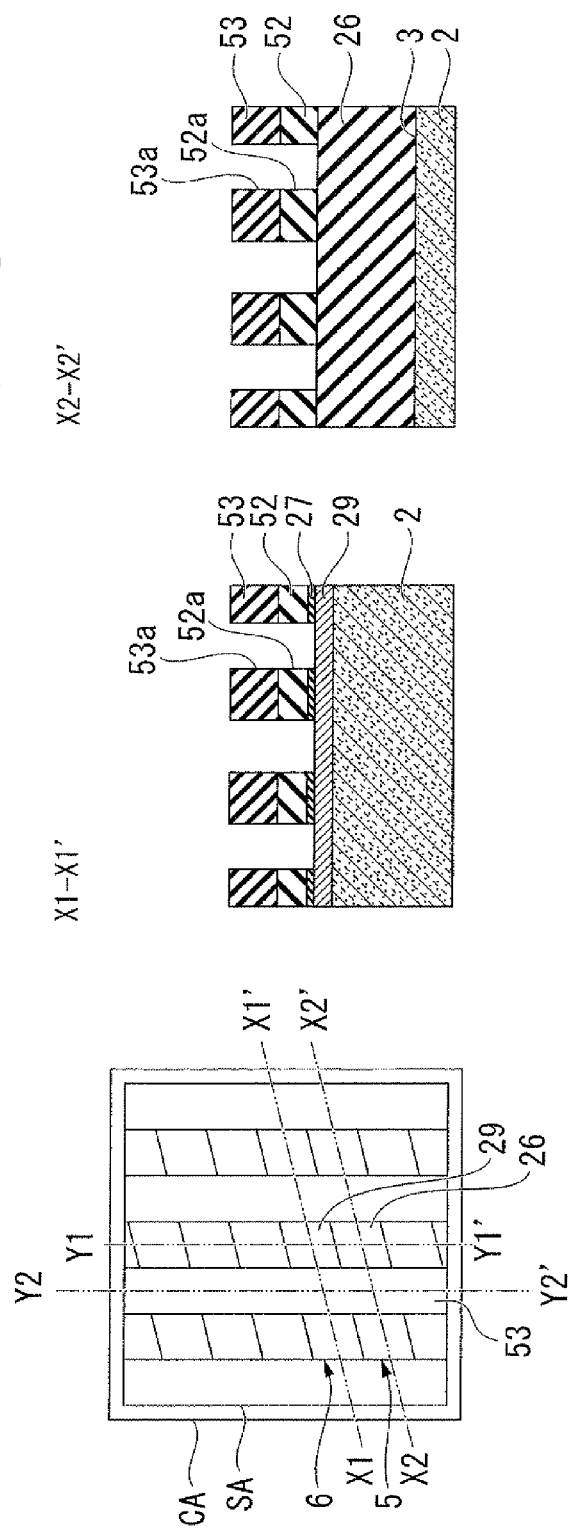
Figure 35C:
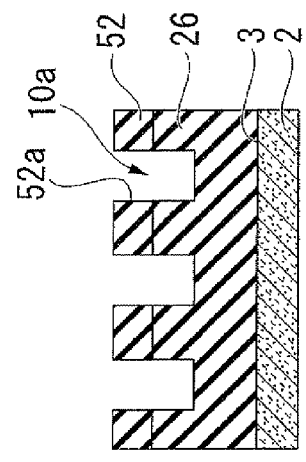
Figure 35E:
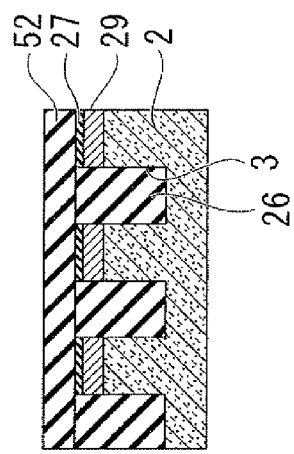
Figure 35B:
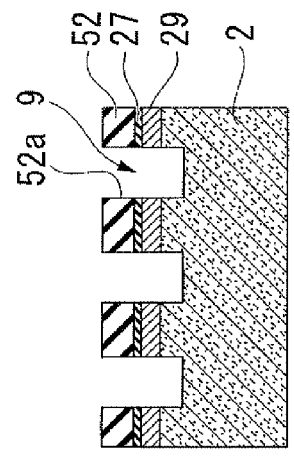
Figure 35D:
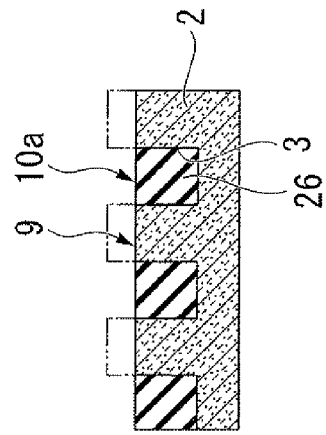
Figure 35A:
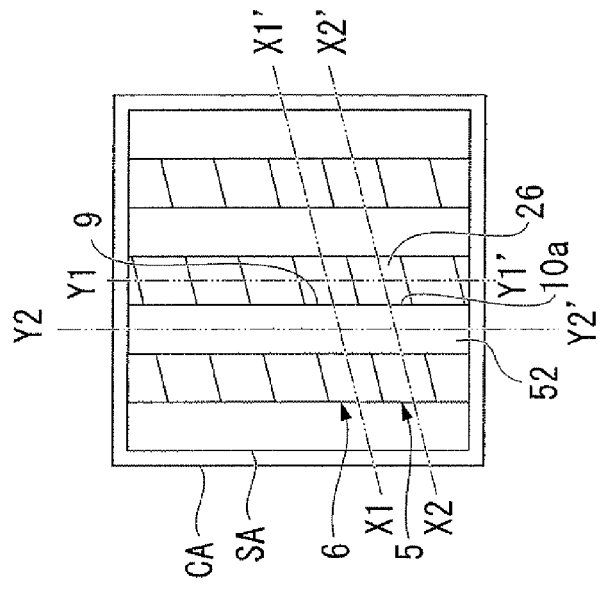
Figure 36A:
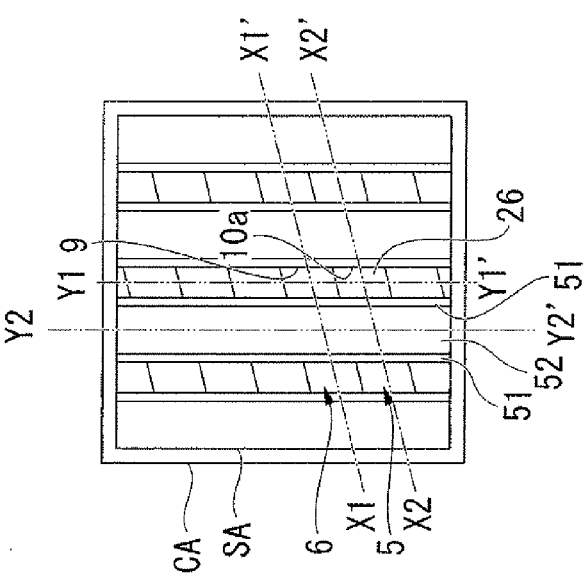
Figure 36B:
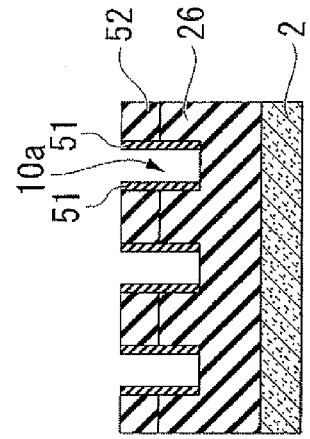
Figure 36C:
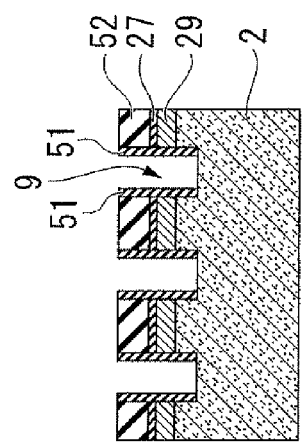
Figure 36D:
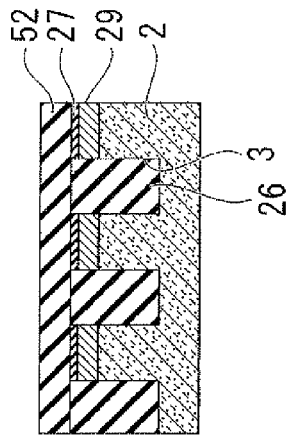
Figure 36E:
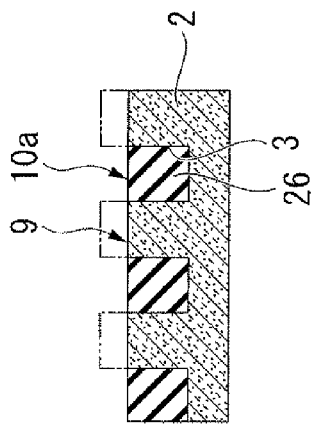
Figure 43C:
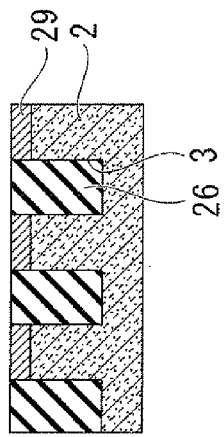
Figure 43B:
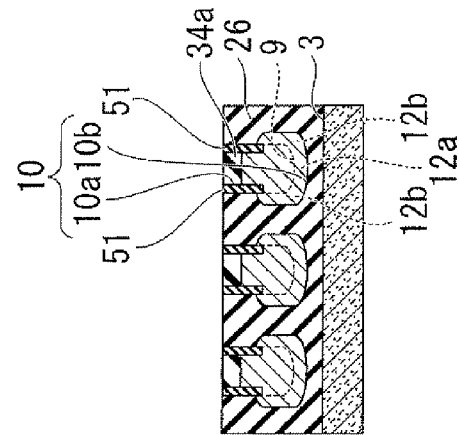
Figure 43E:
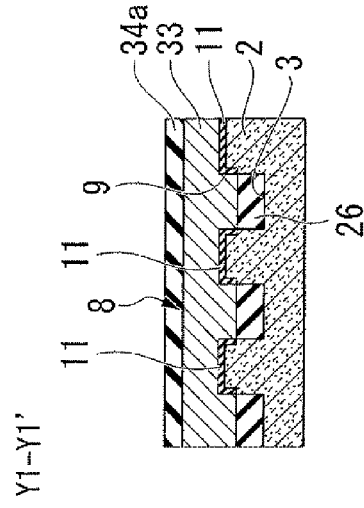
Figure 43D:
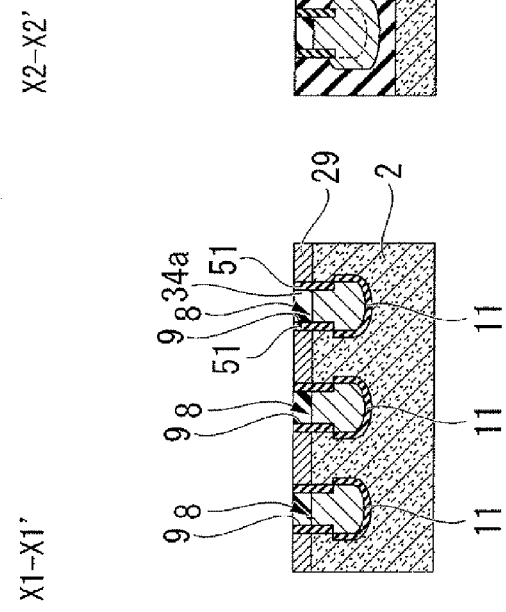
Figure 43A:
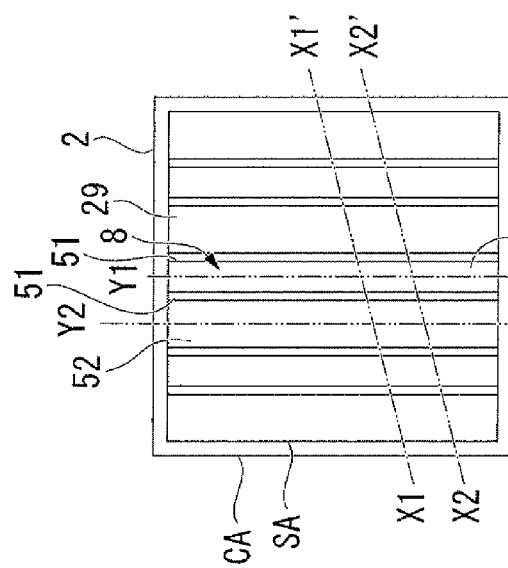
Figure 44C:
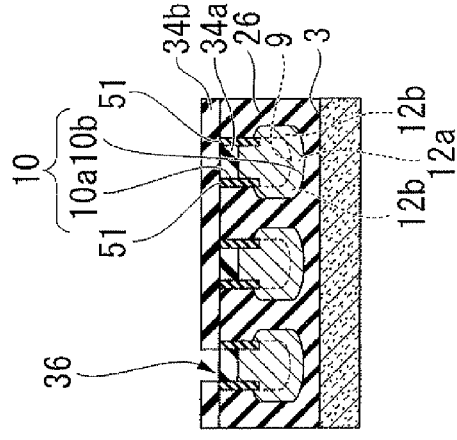
Figure 44E:
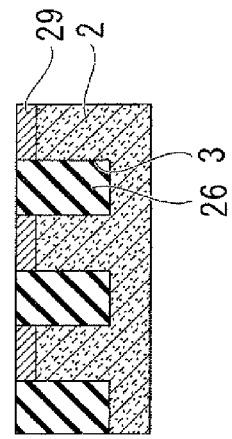
Figure 44B:
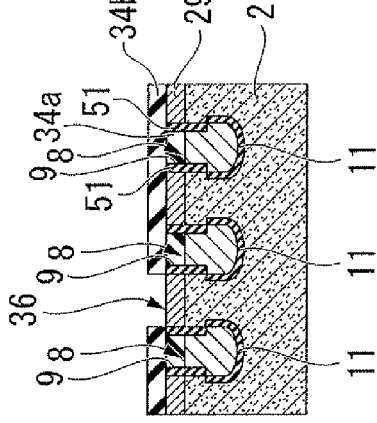
Figure 44D:
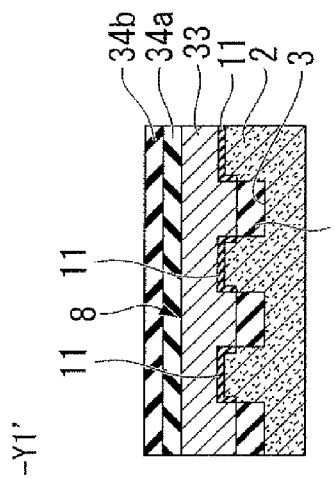
Figure 44A:
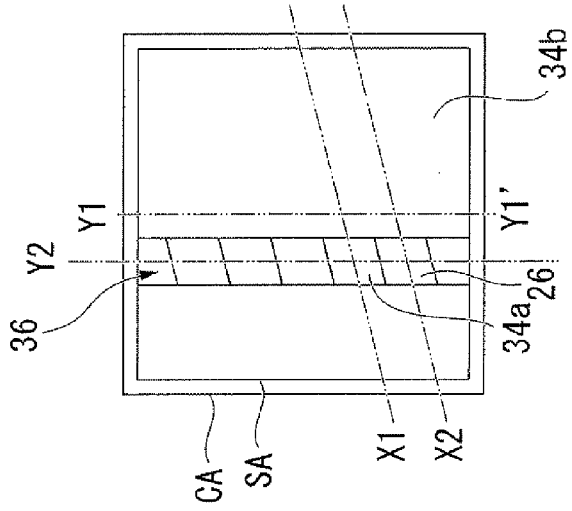
Figure 45:
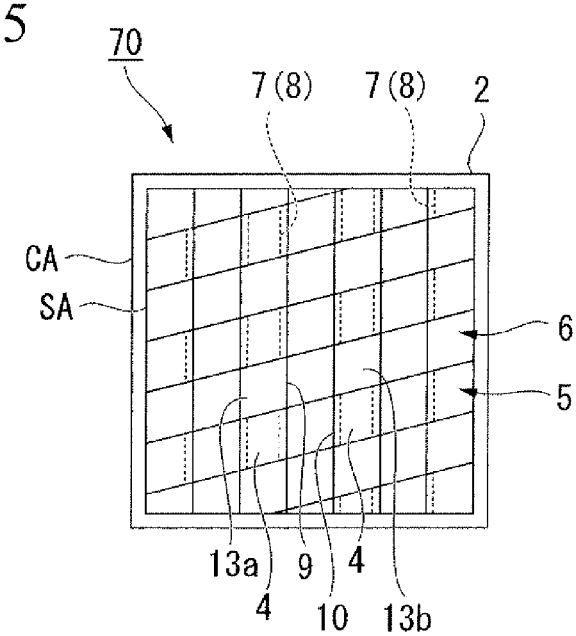
Figure 46:
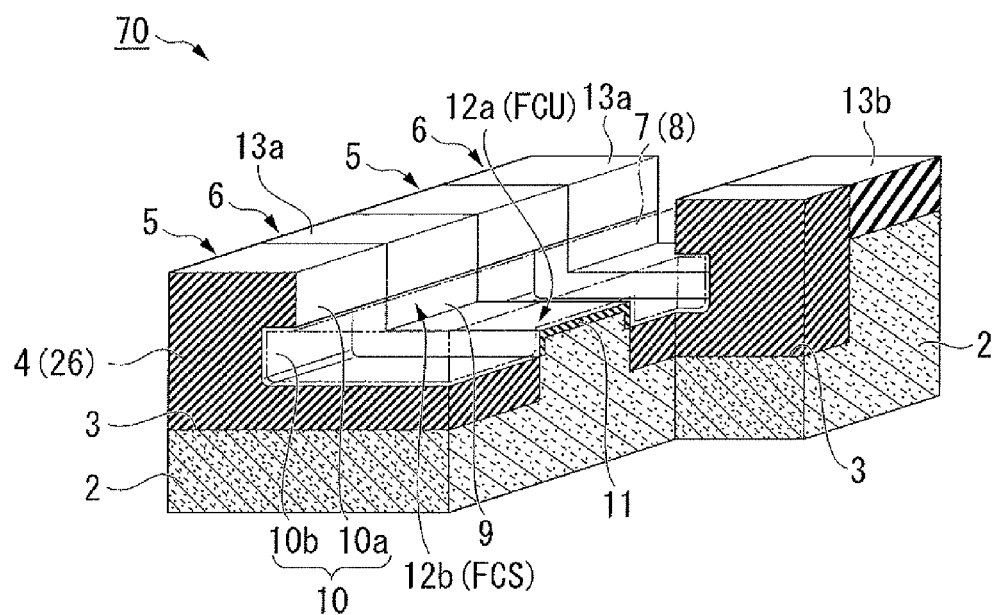
Figure 47:
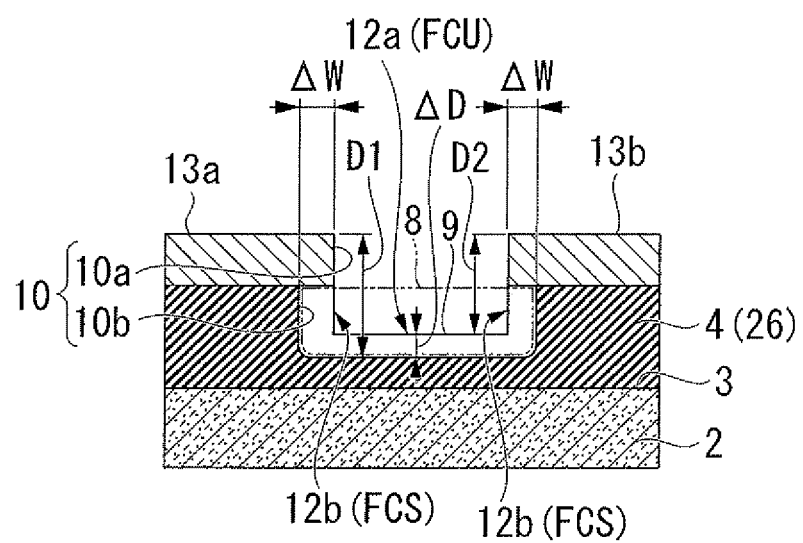
Figure 48C:
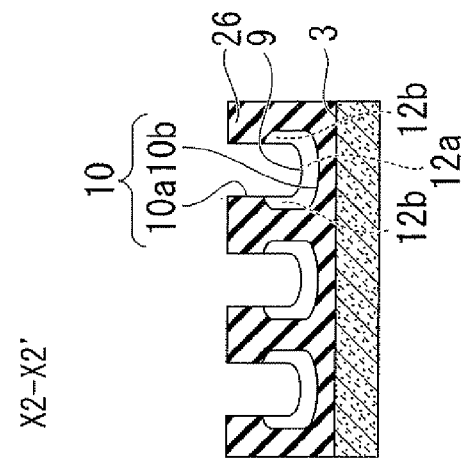
Figure 48E:
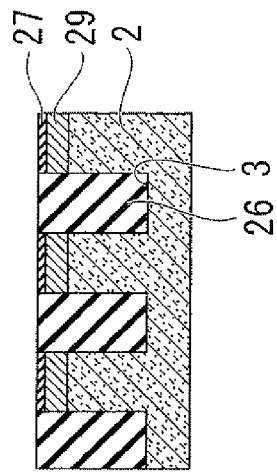
Figure 48B:
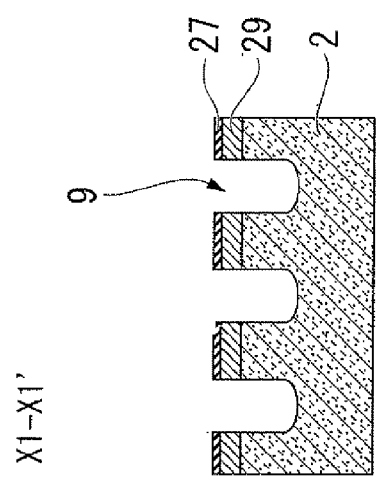
Figure 48D:
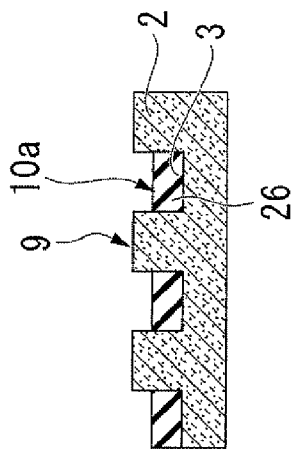
Figure 48A:
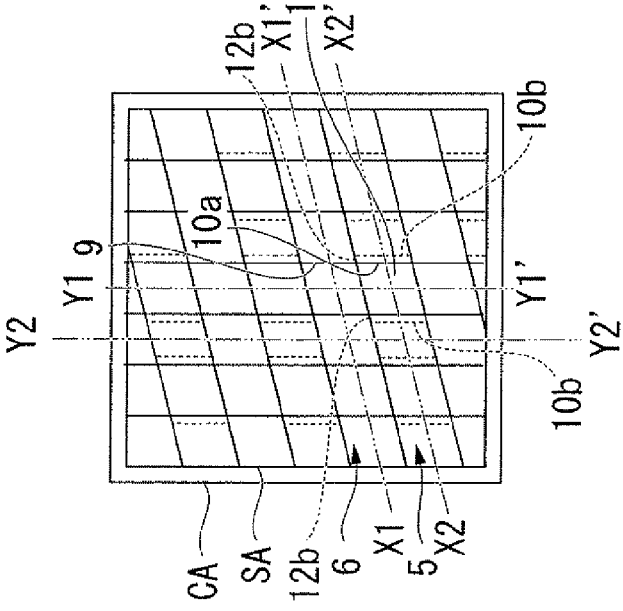
Figure 51C:
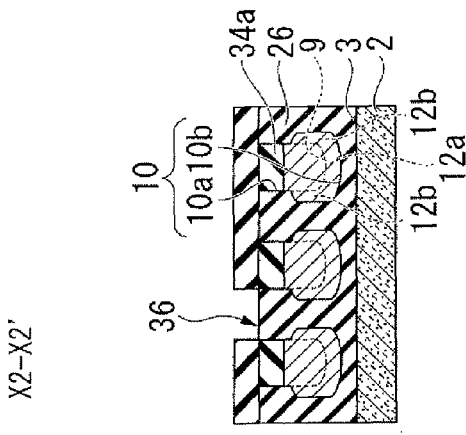
Figure 51E:
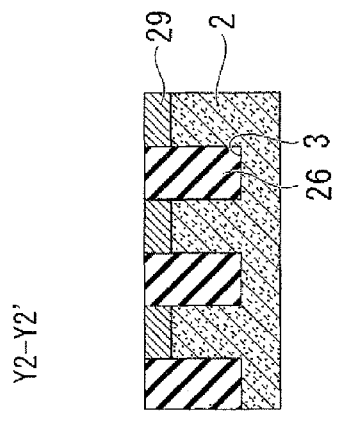
Figure 51B:
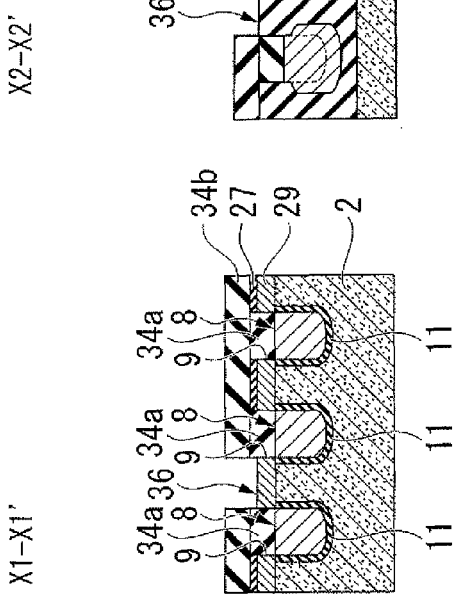
Figure 51D:
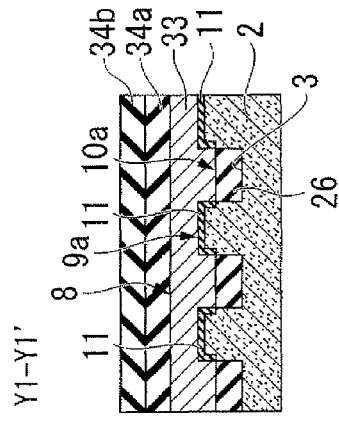
Figure 51A:
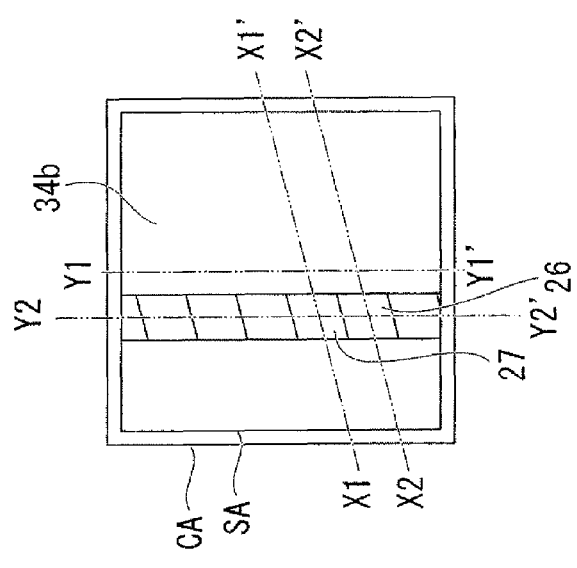
Figure 52:
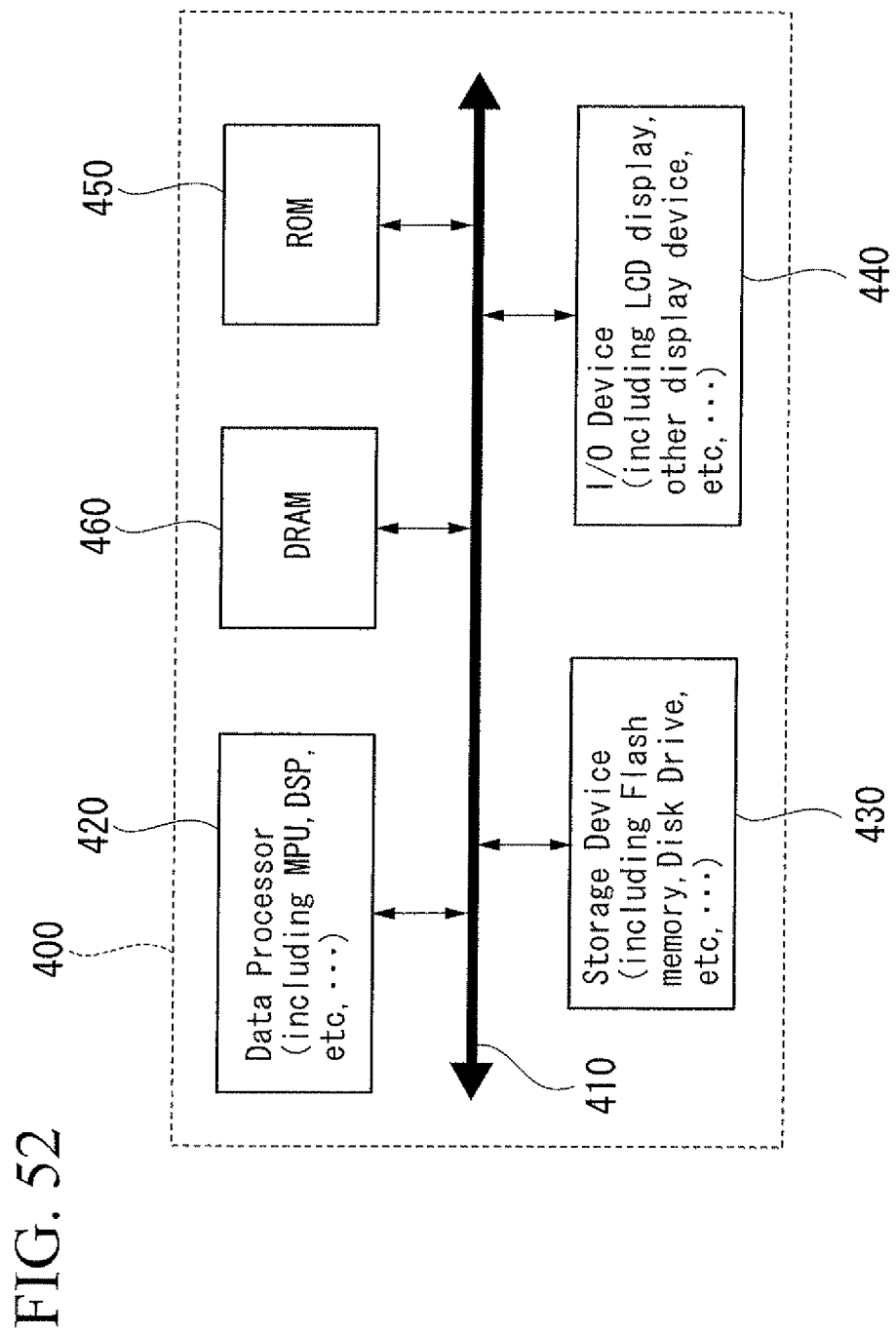
Figure 53:
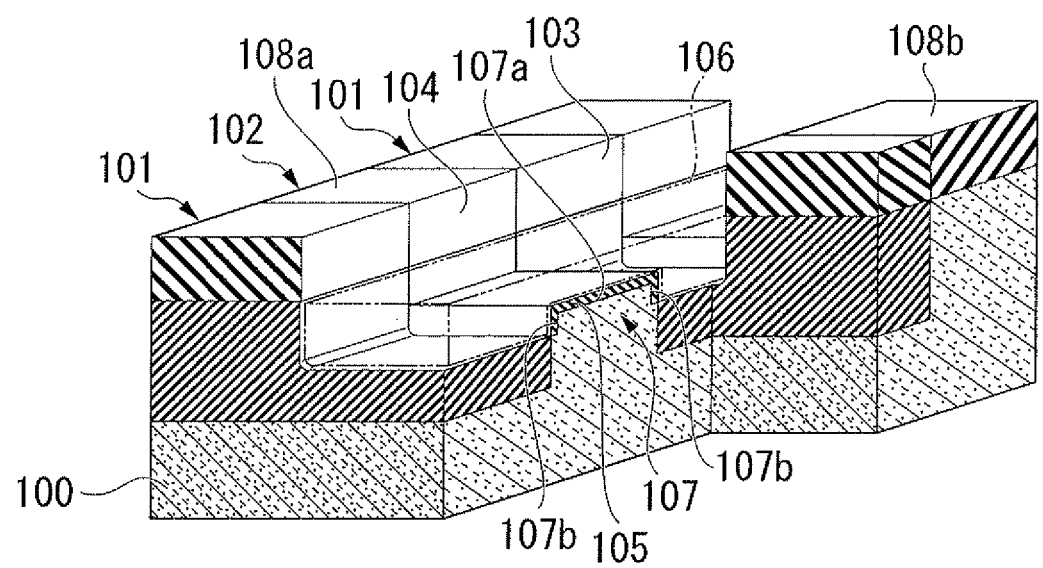

FIG. 31 is a fragmentary plan view illustrating a semiconductor device in accordance with another embodiment of the present invention;

FIG. 32 is a fragmentary perspective view illustrating a part of the semiconductor device in accordance with another embodiment of the present invention;

FIG. 33 is a fragmentary cross sectional elevation view illustrating a channel structure of the semiconductor device shown in FIG. 31 in accordance with another embodiment of the present invention;

FIG. 34A is a fragmentary plan view illustrating a transistor in a step involved in the method of forming the semiconductor device in accordance with another embodiment of the present invention;

FIG. 34B is a fragmentary cross sectional elevation view, taken along an X1-X1' line of FIG. 34A, illustrating the transistor in a step involved in the method of forming the semiconductor device in accordance with another embodiment of the present invention;

FIG. 34C is a fragmentary cross sectional elevation view, taken along an X2-X2' line of FIG. 34A, illustrating the transistor in a step involved in the method of forming the semiconductor device in accordance with another embodiment of the present invention;

FIG. 34D is a fragmentary cross sectional elevation view, taken along a Y1-Y1' line of FIG. 34A, illustrating the transistor in a step involved in the method of forming the semiconductor device in accordance with another embodiment of the present invention;

FIG. 34E is a fragmentary cross sectional elevation view, taken along a Y2-Y2' line of FIG. 34A, illustrating the transistor in a step involved in the method of forming the semiconductor device in accordance with another embodiment of the present invention;

FIG. 35A is a fragmentary plan view illustrating the transistor in a step, subsequent to the step of FIGS. 34A through 34F, involved in the method of forming the semiconductor device in accordance with another embodiment of the present invention;

FIG. 35B is a fragmentary cross sectional elevation view, taken along an X1-X1' line of FIG. 35A, illustrating the transistor in a step, subsequent to the step of FIGS. 34A through 34F, involved in the method of forming the semiconductor device in accordance with another embodiment of the present invention;

FIG. 35C is a fragmentary cross sectional elevation view, taken along an X2-X2' line of FIG. 35A, illustrating the transistor in a step, subsequent to the step of FIGS. 34A through 34F, involved in the method of forming the semiconductor device in accordance with another embodiment of the present invention;

FIG. 35D is a fragmentary cross sectional elevation view, taken along a Y1-Y1' line of FIG. 35A, illustrating the transistor in a step, subsequent to the step of FIGS. 34A through 34F, involved in the method of forming the semiconductor device in accordance with another embodiment of the present invention;

FIG. 35E is a fragmentary cross sectional elevation view, taken along a Y2-Y2' line of FIG. 35A, illustrating the transistor in a step, subsequent to the step of FIGS. 34A through 34F, involved in the method of forming the semiconductor device in accordance with another embodiment of the present invention;

FIG. 36A is a fragmentary plan view illustrating the transistor in a step, subsequent to the step of FIGS. 35A through 35F, involved in the method of forming the semiconductor device in accordance with another embodiment of the present invention;

FIG. 36B is a fragmentary cross sectional elevation view, taken along an X1-X1' line of FIG. 36A, illustrating the transistor in a step, subsequent to the step of FIGS. 35A through 35F, involved in the method of forming the semiconductor device in accordance with another embodiment of the present invention;

FIG. 36C is a fragmentary cross sectional elevation view, taken along an X2-X2' line of FIG. 36A, illustrating the transistor in a step, subsequent to the step of FIGS. 35A through 35F, involved in the method of forming the semiconductor device in accordance with another embodiment of the present invention;

FIG. 36D is a fragmentary cross sectional elevation view, taken along a Y1-Y1' line of FIG. 36A, illustrating the transistor in a step, subsequent to the step of FIGS. 35A through 35F, involved in the method of forming the semiconductor device in accordance with another embodiment of the present invention;

FIG. 36E is a fragmentary cross sectional elevation view, taken along a Y2-Y2' line of FIG. 36A, illustrating the transistor in a step, subsequent to the step of FIGS. 35A through 35F, involved in the method of forming the semiconductor device in accordance with another embodiment of the present invention;

FIG. 37A is a fragmentary plan view illustrating the transistor in a step, subsequent to the step of FIGS. 36A through 36F, involved in the method of forming the semiconductor device in accordance with another embodiment of the present invention;

FIG. 37B is a fragmentary cross sectional elevation view, taken along an X1-X1' line of FIG. 37A, illustrating the transistor in a step, subsequent to the step of FIGS. 36A through 36F, involved in the method of forming the semiconductor device in accordance with another embodiment of the present invention;

FIG. 37C is a fragmentary cross sectional elevation view, taken along an X2-X2' line of FIG. 37A, illustrating the transistor in a step, subsequent to the step of FIGS. 36A through 36F, involved in the method of forming the semiconductor device in accordance with another embodiment of the present invention;

FIG. 37D is a fragmentary cross sectional elevation view, taken along a Y1-Y1' line of FIG. 37A, illustrating the transistor in a step, subsequent to the step of FIGS. 36A through 36F, involved in the method of forming the semiconductor device in accordance with another embodiment of the present invention;

FIG. 37E is a fragmentary cross sectional elevation view, taken along a Y2-Y2' line of FIG. 37A, illustrating the transistor in a step, subsequent to the step of FIGS. 36A through 36F, involved in the method of forming the semiconductor device in accordance with another embodiment of the present invention;

FIG. 38A is a fragmentary plan view illustrating the transistor in a step, subsequent to the step of FIGS. 37A through 37F, involved in the method of forming the semiconductor device in accordance with another embodiment of the present invention;

FIG. 38B is a fragmentary cross sectional elevation view, taken along an X1-X1' line of FIG. 38A, illustrating the transistor in a step, subsequent to the step of FIGS. 37A through 37F, involved in the method of forming the semiconductor device in accordance with another embodiment of the present invention;

FIG. 38C is a fragmentary cross sectional elevation view, taken along an X2-X2' line of FIG. 38A, illustrating the transistor in a step, subsequent to the step of FIGS. 37A through 37F, involved in the method of forming the semiconductor device in accordance with another embodiment of the present invention;

FIG. 38D is a fragmentary cross sectional elevation view, taken along a Y1-Y1' line of FIG. 38A, illustrating the transistor in a step, subsequent to the step of FIGS. 37A through 37F, involved in the method of forming the semiconductor device in accordance with another embodiment of the present invention;

FIG. 38E is a fragmentary cross sectional elevation view, taken along a Y2-Y2' line of FIG. 38A, illustrating the transistor in a step, subsequent to the step of FIGS. 37A through 37F, involved in the method of forming the semiconductor device in accordance with another embodiment of the present invention;

FIG. 39A is a fragmentary plan view illustrating a transistor in a step, subsequent to the step of FIGS. 38A through 38F, involved in the method of forming the semiconductor device in accordance with another embodiment of the present invention;

FIG. 39B is a fragmentary cross sectional elevation view, taken along an X1-X1' line of FIG. 39A, illustrating the transistor in a step, subsequent to the step of FIGS. 38A through 38F, involved in the method of forming the semiconductor device in accordance with another embodiment of the present invention;

FIG. 39C is a fragmentary cross sectional elevation view, taken along an X2-X2' line of FIG. 39A, illustrating the transistor in a step, subsequent to the step of FIGS. 38A through 38F, involved in the method of forming the semiconductor device in accordance with another embodiment of the present invention;

FIG. 39D is a fragmentary cross sectional elevation view, taken along a Y1-Y1' line of FIG. 39A, illustrating the transistor in a step, subsequent to the step of FIGS. 38A through 38F, involved in the method of forming the semiconductor device in accordance with another embodiment of the present invention;

FIG. 39E is a fragmentary cross sectional elevation view, taken along a Y2-Y2' line of FIG. 39A, illustrating the transistor in a step, subsequent to the step of FIGS. 38A through 38F, involved in the method of forming the semiconductor device in accordance with another embodiment of the present invention;

FIG. 40A is a fragmentary plan view illustrating a transistor in a step, subsequent to the step of FIGS. 39A through 39F, involved in the method of forming the semiconductor device in accordance with another embodiment of the present invention;

FIG. 40B is a fragmentary cross sectional elevation view, taken along an X1-X1' line of FIG. 40A, illustrating the transistor in a step, subsequent to the step of FIGS. 39A through 39F, involved in the method of forming the semiconductor device in accordance with another embodiment of the present invention;

FIG. 40C is a fragmentary cross sectional elevation view, taken along an X2-X2' line of FIG. 40A, illustrating the transistor in a step, subsequent to the step of FIGS. 39A through 39F, involved in the method of forming the semiconductor device in accordance with another embodiment of the present invention;

FIG. 40D is a fragmentary cross sectional elevation view, taken along a Y1-Y1' line of FIG. 40A, illustrating the transistor in a step, subsequent to the step of FIGS. 39A through 39F, involved in the method of forming the semiconductor device in accordance with another embodiment of the present invention;

FIG. 40E is a fragmentary cross sectional elevation view, taken along a Y2-Y2' line of FIG. 40A, illustrating the transistor in a step, subsequent to the step of FIGS. 39A through 39F, involved in the method of forming the semiconductor device in accordance with another embodiment of the present invention;

FIG. 41A is a fragmentary plan view illustrating a transistor in a step, subsequent to the step of FIGS. 40A through 40F, involved in the method of forming the semiconductor device in accordance with another embodiment of the present invention;

FIG. 41B is a fragmentary cross sectional elevation view, taken along an X1-X1' line of FIG. 41A, illustrating the transistor in a step, subsequent to the step of FIGS. 40A through 40F, involved in the method of forming the semiconductor device in accordance with another embodiment of the present invention;

FIG. 41C is a fragmentary cross sectional elevation view, taken along an X2-X2' line of FIG. 41A, illustrating the transistor in a step, subsequent to the step of FIGS. 40A through 40F, involved in the method of forming the semiconductor device in accordance with another embodiment of the present invention;

FIG. 41D is a fragmentary cross sectional elevation view, taken along a Y1-Y1' line of FIG. 41A, illustrating the transistor in a step, subsequent to the step of FIGS. 40A through 40F, involved in the method of forming the semiconductor device in accordance with another embodiment of the present invention;

FIG. 41E is a fragmentary cross sectional elevation view, taken along a Y2-Y2' line of FIG. 41A, illustrating the transistor in a step, subsequent to the step of FIGS. 40A through 40F, involved in the method of forming the semiconductor device in accordance with another embodiment of the present invention;

FIG. 42A is a fragmentary plan view illustrating a transistor in a step, subsequent to the step of FIGS. 41A through 41F, involved in the method of forming the semiconductor device in accordance with another embodiment of the present invention;

FIG. 42B is a fragmentary cross sectional elevation view, taken along an X1-X1' line of FIG. 42A, illustrating the transistor in a step, subsequent to the step of FIGS. 41A through 41F, involved in the method of forming the semiconductor device in accordance with another embodiment of the present invention;

FIG. 42C is a fragmentary cross sectional elevation view, taken along an X2-X2' line of FIG. 42A, illustrating the transistor in a step, subsequent to the step of FIGS. 41A through 41F, involved in the method of forming the semiconductor device in accordance with another embodiment of the present invention;

FIG. 42D is a fragmentary cross sectional elevation view, taken along a Y1-Y1' line of FIG. 42A, illustrating the transistor in a step, subsequent to the step of FIGS. 41A through 41F, involved in the method of forming the semiconductor device in accordance with another embodiment of the present invention;

FIG. 42E is a fragmentary cross sectional elevation view, taken along a Y2-Y2' line of FIG. 42A, illustrating the transistor in a step, subsequent to the step of FIGS. 41A through 41F, involved in the method of forming the semiconductor device in accordance with another embodiment of the present invention;

FIG. 43A is a fragmentary plan view illustrating a transistor in a step, subsequent to the step of FIGS. 42A through 42F, involved in the method of forming the semiconductor device in accordance with another embodiment of the present invention;

FIG. 43B is a fragmentary cross sectional elevation view, taken along an X1-X1' line of FIG. 43A, illustrating the transistor in a step, subsequent to the step of FIGS. 42A through 42F, involved in the method of forming the semiconductor device in accordance with another embodiment of the present invention;

FIG. 43C is a fragmentary cross sectional elevation view, taken along an X2-X2' line of FIG. 43A, illustrating the transistor in a step, subsequent to the step of FIGS. 42A through 42F, involved in the method of forming the semiconductor device in accordance with another embodiment of the present invention;

FIG. 43D is a fragmentary cross sectional elevation view, taken along a Y1-Y1' line of FIG. 43A, illustrating the transistor in a step, subsequent to the step of FIGS. 42A through 42F, involved in the method of forming the semiconductor device in accordance with another embodiment of the present invention;

FIG. 43E is a fragmentary cross sectional elevation view, taken along a Y2-Y2' line of FIG. 43A, illustrating the transistor in a step, subsequent to the step of FIGS. 42A through 42F, involved in the method of forming the semiconductor device in accordance with another embodiment of the present invention;

FIG. 44A is a fragmentary plan view illustrating a transistor in a step, subsequent to the step of FIGS. 43A through 43F, involved in the method of forming the semiconductor device in accordance with another embodiment of the present invention;

FIG. 44B is a fragmentary cross sectional elevation view, taken along an X1-X1' line of FIG. 44A, illustrating the transistor in a step, subsequent to the step of FIGS. 43A through 43F, involved in the method of forming the semiconductor device in accordance with another embodiment of the present invention;

FIG. 44C is a fragmentary cross sectional elevation view, taken along an X2-X2' line of FIG. 44A, illustrating the transistor in a step, subsequent to the step of FIGS. 43A through 43F, involved in the method of forming the semiconductor device in accordance with another embodiment of the present invention;

FIG. 44D is a fragmentary cross sectional elevation view, taken along a Y1-Y1' line of FIG. 44A, illustrating the transistor in a step, subsequent to the step of FIGS. 43A through 43F, involved in the method of forming the semiconductor device in accordance with another embodiment of the present invention;

FIG. 44E is a fragmentary cross sectional elevation view, taken along a Y2-Y2' line of FIG. 44A, illustrating the transistor in a step, subsequent to the step of FIGS. 43A through 43F, involved in the method of forming the semiconductor device in accordance with another embodiment of the present invention;

FIG. 45 is a fragmentary plan view illustrating a semiconductor device in accordance with still another embodiment of the present invention;

FIG. 46 is a fragmentary perspective view illustrating a part of the semiconductor device shown in FIG. 45 in accordance with still another embodiment of the present invention;

FIG. 47 is a fragmentary cross sectional elevation view illustrating a channel structure of the semiconductor device shown in FIG. 45 in accordance with still another embodiment of the present invention;

FIG. 48A is a fragmentary plan view illustrating a transistor in a step involved in the method of forming the semiconductor device in accordance with still another embodiment of the present invention;

FIG. 48B is a fragmentary cross sectional elevation view, taken along an X1-X1' line of FIG. 48A, illustrating the transistor in a step involved in the method of forming the semiconductor device in accordance with still another embodiment of the present invention;

FIG. 48C is a fragmentary cross sectional elevation view, taken along an X2-X2' line of FIG. 48A, illustrating the transistor in a step involved in the method of forming the semiconductor device in accordance with still another embodiment of the present invention;

FIG. 48D is a fragmentary cross sectional elevation view, taken along a Y1-Y1' line of FIG. 48A, illustrating the transistor in a step involved in the method of forming the semiconductor device in accordance with still another embodiment of the present invention;

FIG. 48E is a fragmentary cross sectional elevation view, taken along a Y2-Y2' line of FIG. 48A, illustrating the transistor in a step involved in the method of forming the semiconductor device in accordance with still another embodiment of the present invention;

FIG. 49A is a fragmentary plan view illustrating a transistor in a step, subsequent to the step of FIGS. 48A through 48F, involved in the method of forming the semiconductor device in accordance with still another embodiment of the present invention;

FIG. 49B is a fragmentary cross sectional elevation view, taken along an X1-X1' line of FIG. 49A, illustrating the transistor in a step, subsequent to the step of FIGS. 48A through 48F, involved in the method of forming the semiconductor device in accordance with still another embodiment of the present invention;

FIG. 49C is a fragmentary cross sectional elevation view, taken along an X2-X2' line of FIG. 49A, illustrating the transistor in a step, subsequent to the step of FIGS. 48A through 48F, involved in the method of forming the semiconductor device in accordance with still another embodiment of the present invention;

FIG. 49D is a fragmentary cross sectional elevation view, taken along a Y1-Y1' line of FIG. 49A, illustrating the transistor in a step, subsequent to the step of FIGS. 48A through 48F, involved in the method of forming the semiconductor device in accordance with still another embodiment of the present invention;

FIG. 49E is a fragmentary cross sectional elevation view, taken along a Y2-Y2' line of FIG. 49A, illustrating the transistor in a step, subsequent to the step of FIGS. 48A through 48F, involved in the method of forming the semiconductor device in accordance with still another embodiment of the present invention;

FIG. 50A is a fragmentary plan view illustrating a transistor in a step, subsequent to the step of FIGS. 49A through 49F, involved in the method of forming the semiconductor device in accordance with still another embodiment of the present invention;

FIG. 50B is a fragmentary cross sectional elevation view, taken along an X1-X1' line of FIG. 50A, illustrating the transistor in a step, subsequent to the step of FIGS. 49A through 49F, involved in the method of forming the semiconductor device in accordance with still another embodiment of the present invention;

FIG. 50C is a fragmentary cross sectional elevation view, taken along an X2-X2' line of FIG. 50A, illustrating the transistor in a step, subsequent to the step of FIGS. 49A through 49F, involved in the method of forming the semiconductor device in accordance with still another embodiment of the present invention;

FIG. 50D is a fragmentary cross sectional elevation view, taken along a Y1-Y1' line of FIG. 50A, illustrating the transistor in a step, subsequent to the step of FIGS. 49A through 49F, involved in the method of forming the semiconductor device in accordance with still another embodiment of the present invention;

FIG. 50E is a fragmentary cross sectional elevation view, taken along a Y2-Y2' line of FIG. 50A, illustrating the transistor in a step, subsequent to the step of FIGS. 49A through 49F, involved in the method of forming the semiconductor device in accordance with still another embodiment of the present invention;

FIG. 51A is a fragmentary plan view illustrating a transistor in a step, subsequent to the step of FIGS. 50A through 50F, involved in the method of forming the semiconductor device in accordance with still another embodiment of the present invention;

FIG. 51B is a fragmentary cross sectional elevation view, taken along an X1-X1' line of FIG. 51A, illustrating the transistor in a step, subsequent to the step of FIGS. 50A through 50F, involved in the method of forming the semiconductor device in accordance with still another embodiment of the present invention;

FIG. 51C is a fragmentary cross sectional elevation view, taken along an X2-X2' line of FIG. 51A, illustrating the transistor in a step, subsequent to the step of FIGS. 50A through 50F, involved in the method of forming the semiconductor device in accordance with still another embodiment of the present invention;

FIG. 51D is a fragmentary cross sectional elevation view, taken along a Y1-Y1' line of FIG. 51A, illustrating the transistor in a step, subsequent to the step of FIGS. 50A through 50F, involved in the method of forming the semiconductor device in accordance with still another embodiment of the present invention;

FIG. 51E is a fragmentary cross sectional elevation view, taken along a Y2-Y2' line of FIG. 51A, illustrating the transistor in a step, subsequent to the step of FIGS. 50A through 50F, involved in the method of forming the semiconductor device in accordance with still another embodiment of the present invention;

FIG. 52 is a brief configuration diagram illustrating a data processing system including the semiconductor device in accordance with the embodiments of the present invention; and FIG. 53 is a fragmentary enlarged perspective view illustrating a part of a semiconductor device in accordance with the related art.

DETAILED DESCRIPTION OF THE PREFERRED EMBODIMENTS

Before describing the present invention, the related art will be explained in detail, in order to facilitate the understanding of the present invention.

A transistor as shown in FIG. 53 has the channel of the three-dimensional structure described above. The transistor is formed as follows. An isolation region 101 and an active region 102 are formed in a surface portion of a semiconductor substrate 100. Trench portions 103 and 104 for a buried gate electrode are formed in the isolation region 101 and the active region 102, respectively. A fin portion 107 is a protrusion which is a part of the active region 102 between the trench portions 103. A saddle fin gate electrode 106 is formed by burying a conductive material in the trench portions 103 and 104 while a gate insulating film 105 is interposed between the saddle fin gate electrode 106 and the semiconductor substrate. That is, the saddle fin gate electrode 106 crosses over the fin portion 107. An upper surface 107a of the fin portion 107 is located to be higher than a bottom surface of the trench portion 103 and to be lower than an upper surface of the active region 102 (an upper surface of the semiconductor substrate 100). This is because the trench portion 104 in the active region 102 is shallower than the trench portion 103 formed in the isolation region 102. A source region 108a and a drain region 108b (impurity diffusion layers) are formed, by implanting ions, in two active regions 102 between which the gate electrode 106 is interposed.

However, widths of the trench portions 103 and 104 for the buried gate electrode become narrow due to the reduction in dimensions of the memory cell described above. Thus, widths of channel regions formed in the upper surface 107a and a side surface 107b of the fin portion 107 also become narrow in correspondence with the widths of the buried gate trench portions 103 and 104. Therefore, in some cases, it is difficult to sufficiently secure an ON current due to a short channel effect.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate including a fin. The fin includes first and second fin portions. The first fin portion extends substantially in a horizontal direction to a surface of the semiconductor substrate. The second fin portion extends substantially in a vertical direction to the surface of the semiconductor substrate. The fin has a channel region.

In some cases, the fin further may further include, but is not limited to, a third fin portion extending substantially in the vertical direction.

In some cases, the semiconductor device may further include, but is not limited to, source and drain regions having bottoms which contact tops of the second and third fin portions, respectively.

In some cases, the semiconductor device may further include, but is not limited to, a first side wall insulating film on a first side surface of the source and a second side wall insulating film on a second side surface of the drain. The second side surface faces toward the first side surface.

In some cases, the semiconductor device may include, but is not limited to, the following elements. The second fin portion has first and second side surfaces opposed to each other and a third side surface adjacent to the first and second side surfaces. The third fin portion has fourth and fifth side surfaces opposed to each other and a sixth side surface adjacent to the forth and fifth side surfaces. The third and sixth side surfaces face toward each other.

In some cases, the semiconductor device may further include, but is not limited to, a gate insulating film and a gate electrode. The gate insulating film covers the first through sixth side surfaces. The gate electrode contacts the gate insulating film. The gate electrode faces toward the first through sixth side surfaces. The gate insulating film is interposed between the gate electrode and the first through sixth side surfaces.

In some cases, the semiconductor device may further include, but is not limited to, an isolation region adjacent to the fin.

In some cases, the semiconductor device may include, but is not limited to, a top surface of the gate electrode being lower in level than a top surface of the isolation region.

In some cases, the semiconductor device may include, but is not limited to, the isolation region having a trench beside the fin. A distance between the third and sixth surfaces is smaller than a width of the trench, the width being defined in a direction from the third surface to the sixth surface.

In another embodiment, a semiconductor device may include, but is not limited to, the following elements. A semiconductor substrate includes an active region. The active region has a fin. The fin includes first, second, and third fin portions. The first fin portion extends substantially in a first horizontal direction to a surface of the semiconductor substrate. The second and third fin portions extend substantially in a vertical direction to the surface of the semiconductor substrate. An isolation region defines the active region. A word line extends over the isolation region and the active region. The word line extends across the fin. The word line extends substantially in a second horizontal direction perpendicular to the first horizontal direction. The word line has first and second portions. The first portion is interposed between the second and third fin portions. The second portion is over the isolation region. The first portion is smaller in width than the second portion.

In some cases, the semiconductor device may further include, but is not limited to, source and drain regions in the active region and a channel region in the active region. The channel region is located below the source and drain regions. The channel region is formed in the vicinity of a surface region of the fin.

In some cases, the semiconductor device may further include, but is not limited to, a first side wall insulating film on a first side surface of the source and a second side wall insulating film on a second side surface of the drain. The second side surface faces toward the first side surface.

In some cases, the semiconductor device may include, but is not limited to, the following elements. The second fin portion has first and second side surfaces opposed to each other and a third side surface adjacent to the first and second side surfaces. The third fin portion has fourth and fifth side surfaces opposed to each other and a sixth side surface adjacent to the forth and fifth side surfaces. The third and sixth side surfaces face toward each other.

In some cases, the semiconductor device may further include, but is not limited to, a gate insulating film covering the first through sixth side surfaces. The first portion contacts the gate insulating film. The first portion faces toward the first through sixth side surfaces. The gate insulating film is interposed between the first portion and the first through sixth side surfaces.

In some cases, the semiconductor device may include, but is not limited to, a top surface of the word line is lower in level than a top surface of the isolation region.

In still another embodiment, a semiconductor device may include, but is not limited to, the following elements. A semiconductor substrate has a fin having a channel region in the vicinity of a surface of the fin. The fin includes an end portion. The end portion has first and second channel portions of the channel region. The first and second channel portions are opposed to each other. The first and second channel portions extend substantially vertical to a surface of the semiconductor substrate. A diffusion region has a bottom. The bottom is in contact with the end portion and with the first and second channel portions.

In some cases, the semiconductor device may include, but is not limited to, the end portion having a third channel portion of the channel region. The third channel portion is adjacent to the first and second channel portions. The third channel portion extends substantially vertical to the surface of the semiconductor substrate. The bottom is in contact with the third channel portion.

In some cases, the semiconductor device may further include, but is not limited to, a gate insulating film covering the channel region and a gate electrode contacting the gate insulating film. The gate electrode faces toward the first through third channel portions. The gate insulating film is interposed between the gate electrode and the first through third channel portions.

In some cases, the semiconductor device may include, but is not limited to, a top surface of the gate electrode is lower in level than a top surface of the isolation region.

In some cases, the semiconductor device may further include, but is not limited to, a first side wall insulating film on a side surface of the diffusion region.

In still another embodiment, a method for forming a semiconductor device may include, but is not limited to, the following processes. An isolation region is formed in a semiconductor substrate. The isolation region defines an active region. The active region and the isolation region are selectively etched to form first and second trench portions, respectively. The first and second trench portions are adjacent to each other. Side surfaces and a bottom surface of the second trench portion are etched to form a fin in the active region.

In some cases, the method may further include, but is not limited to, forming a mask over the active region and the isolation region before selectively etching the active region and the isolation region.

In some cases, etching the side surfaces and the bottom surface of the second trench portion may include, but is not limited to, etching the side surfaces and the bottom surface of the second trench portion while the mask remains.

In some cases, etching the side surfaces and the bottom surface of the second trench portion may include, but is not limited to, wet etching the side surfaces and the bottom surface of the second trench portion.

In some cases, etching the side surfaces and the bottom surface of the second trench portion may include, but is not limited to, etching the bottom surface of the second trench portion by an anisotropic etching process and etching the side surfaces and the bottom surface of the second trench portion by an isotropic etching process.

In some cases, the method may further include, but is not limited to, forming a conductive film filling the first and second trench portion.

Hereinafter, a semiconductor device according to an embodiment of the invention will be described in detail with reference to the drawings. In the embodiment, an example of applying the invention to a DRAM (Dynamic Random Access Memory) as the semiconductor device will be described. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

First Embodiment

Semiconductor Device

Figure 1:
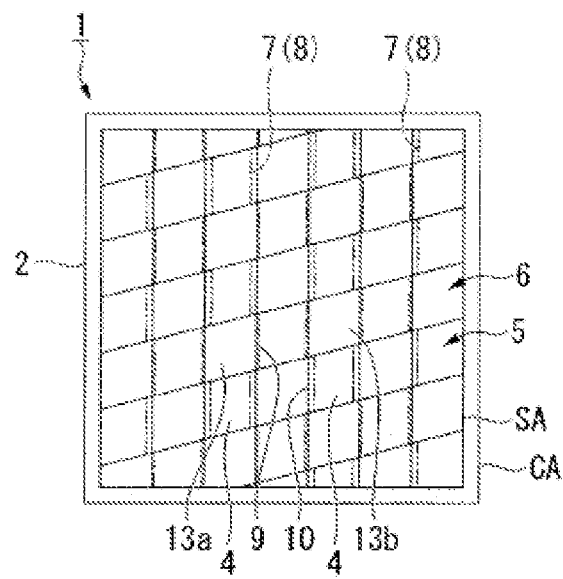
FIG. 1 is a fragmentary plan view illustrating a semiconductor device in accordance with one embodiment of the present invention.
Figure 2:
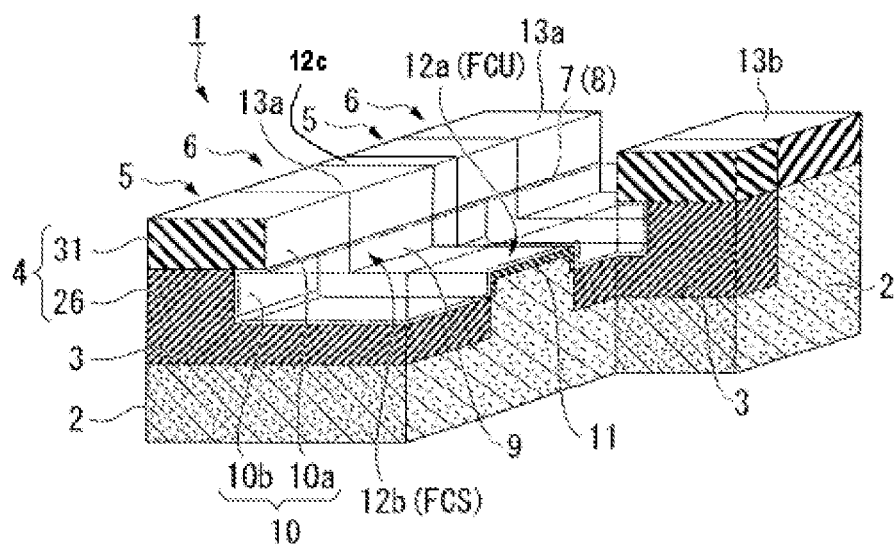
FIG. 2 is a fragmentary enlarged perspective view illustrating part of the semiconductor device shown in FIG. 1 in accordance with one embodiment of the present invention.

The structure of a semiconductor device 1 will be described as the first embodiment with reference to FIGS. 1 and 2. FIG. 1 is a plan view of the semiconductor device 1. FIG. 2 is a fragmentary enlarged perspective view illustrating part of the semiconductor device 1.

The semiconductor device 1 functions as a DRAM. As shown in FIGS. 1 and 2, the semiconductor device 1 includes a cell array region SA and a peripheral circuit region CA in a semiconductor substrate 2. The peripheral circuit region CA is located in the vicinity of the cell array region SA. A plurality of memory cells are arranged in a matrix in the cell array region SA. A circuit for controlling operations of each memory cell is disposed in the peripheral circuit area CA. Each of the memory cells arranged in the cell array region SA includes a selection transistor and a capacitor electrically connected to any one of a source and a drain of the selection transistor.

In the cell array region SA, a plurality of isolation regions 5 and a plurality of active regions 6 are alternately arranged in stripes. The plurality of active regions 6 are insulated and isolated by the isolation regions 5. The plurality of isolation regions 5 are formed as follows. A plurality of isolation trench portions 3 extending in a first direction are formed in the semiconductor substrate 2. The plurality of isolation regions 5 called shallow trench isolation (STI) are formed by burying isolation insulating films 4 (a silicon oxide film 26 and a silicon nitride film 31) in the plurality of isolation trench portions 3.

In the cell array region SA, a plurality of word lines 7 extend in a second direction crossing the isolation regions 5 and the active regions 6. The plurality of word lines 7 are arranged in stripes. The word line 7 includes a gate electrode 8 of the selection transistor. The gate electrode 8 is a buried gate electrode. The gate electrode 8 is formed as follows. Conductive materials are buried in first and second trench portions 9 and 10 which are buried gate trench portions formed in the isolation region 5 and the active region 6, respectively while a gate insulating film 11 is interposed between the gate electrode 8 and the semiconductor substrate 2.

In some cases, the first trench portion 9 is formed in the active region 6 in the cell array region SA. The second trench portion 10 is formed in the isolation region 5. The second trench portion 10 is greater in depth than the first trench portion 9. The bottom portion of the second trench portion 10 is greater in width in the first direction than the first trench portion 9. The active region 6 includes a fin. The fin includes first and second fin portions 12a and 12b. The first fin portion 12a protrudes substantially in the vertical direction to the surface of the semiconductor substrate 2. The first fin portion 12a extends substantially in a horizontal direction to the surface of the semiconductor substrate. The first fin portion 12a is positioned between the second trench portions 10. The second fin portions 12b protrude substantially in the horizontal direction. The second fin portions 12b extend substantially in the vertical direction. The second fin portions 12b are connected continuously to the first fin portion 12a. The second fin portions 12b extends continuously from the opposite sides of the first fin portion 12a. Each of the second fin portions 12b is positioned between the second trench portions 10. The presence of the first fin portion 12a causes that the second trench portion 10 is greater in depth than the first trench portion 9. The presence of the second fin portions 12b causes that the bottom portion of the second trench portion 10 is greater in width in the first direction than the first trench portion 9. Optionally, a third fin (channel) portion 12c is present.

Figure 3:
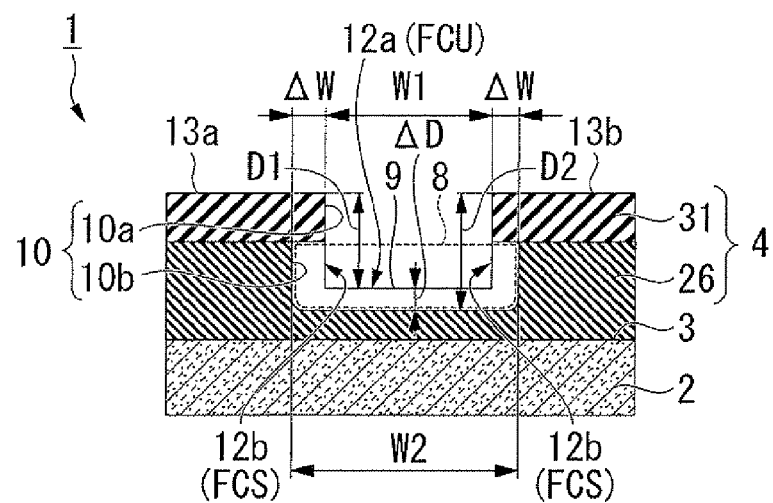
FIG. 3 is a fragmentary cross sectional elevation view illustrating a channel structure of the semiconductor device shown in FIG. 1 in accordance with one embodiment of the present invention.

As shown in FIG. 3, the semiconductor device 1 may include, but is not limited to, an isolation insulating film 4 which includes the silicon oxide film 26 and the silicon nitride film 31. The silicon oxide film 26 and the silicon nitride film 31 are sequentially buried in the isolation trench portion 3. The second trench portion 10 includes an upper trench portion 10a and a lower trench portion 10b. The upper trench portion 10a is formed in the silicon nitride film 31 so as to have the same width W1 as the first trench portion 9. The lower trench portion 10b is formed in the silicon oxide film 26 located below the upper trench portion 10a so as to have a greater width W2 than the width W1 of the upper trench portion 10a. The second trench portion 10 has a cross-sectional shape that is line-symmetric with respect to a line extending in the second direction perpendicular to the first direction and extending through a center of the first trench portion 9. Here, the "width" is defined in the first direction.

A dimension in a depth direction of the upper trench portion 10a is the same as thicknesses of a drain region 13a and a source region 13b. The upper trench portion 10a is formed in the vicinity of a surface of the active region 6, that is, the surface portion of the semiconductor substrate 2.

In this case, the first fin portion 12a in the first trench portion 9 protrudes substantially in the vertical direction to the surface of the substrate by a difference $\Delta D$ ($=D2-D1$) between a depth D1 of the first trench portion 9 and a depth D2 of the second trench portion 10. The first fin portion 12a forms a first channel region FCU having the width W1 in the first direction. In some cases, a surface portion of the first fin portion 12a forms the first channel region FCU.

A pair of the second fin portions 12b in the first trench portion 9 respectively protrude substantially in the horizontal direction to the surface of the substrate by half ($\Delta W$) a difference $2\Delta W$ ($=W2-W1$) between the width W1 of the first trench portion 9 and the width W2 of the second trench portion 10 (the lower trench portion 10b). The pair of second fin portions 12b forms second channel regions FCS extending substantially in the vertical direction to the surface of the semiconductor substrate 2 from both ends of the first fin portion 12a. In some cases, surface portions of the pair of second fin portions 12b form the second channel regions FCS. Each of the second fin portions 12b has first and second channel portions of the second channel region FCS. The fin has the opposite end portions which may, in some cases, be the second fin portions 12b. The first and second channel portions are opposed to each other. The first and second channel portions extend substantially in the direction vertical to the surface of the semiconductor substrate.

The semiconductor device 1 may include, but is not limited to, the gate insulating film 11 covering the surfaces of the first and second fin portions 12a and 12b. A part of the word line 7 functions as the gate electrode 8. The gate electrode 8 is buried in the buried gate trench portions 9 and 10 so as to cross over the first and second fin portions 12a and 12b while the gate insulating film 11 is interposed between the gate electrode 8 and the semiconductor substrate 2. Therefore, the semiconductor device 1 has a saddle fin channel structure.

In parts of the active regions 6 between which the gate electrode 8 is interposed, the drain region 13a and the source region 13b (impurity diffusion layers) are respectively provided by implanting ions. The drain region 13a and the source region 13b function as a source and a drain of the selection transistor, respectively. The drain region 13a and the source region 13b have bottoms which are connected to the tops of the second fin portions 12b, which are located under the drain region 13a and the source region 13b, respectively.

As described above, the semiconductor device 1 may include, but is not limited to, the gate electrode 8, the drain region 13a and the source region 13b (the impurity diffusion layers), the pair of second fin portions 12b (the second channel regions FCS), the first fin portion 12a (the first channel region FCU), and the gate insulating film 11. The gate electrode 8 is located below the surface of the semiconductor substrate 2. The gate electrode 8 is buried in the first and second trench portions 9 and 10 extending in the second direction. The gate electrode 8 is interposed between the drain region 13a and the source region 13b. The drain region 13a and the source region 13b respectively have upper surfaces in positions that are higher in level than the upper surface of the gate electrode 8. The pair of second fin portions 12b (the second channel regions FCS) is continuously connected to the respective bottom surfaces of the drain region 13a and the source region 13b. The pair of second fin portions 12b (the second channel regions FCS) extends substantially in the depth direction that is vertical to the surface of the semiconductor substrate 2 from the respective bottom surfaces of the drain region 13a and the source region 13b. One of the pair of second fin portions 12b has first and second side surfaces opposed to each other and a third side surface adjacent to the first and second side surfaces. The other of the pair of second fin portions 12b has fourth and fifth side surfaces opposed to each other and a sixth side surface adjacent to the fourth and fifth side surfaces. The third and sixth side surfaces face toward each other. The distance between the third and sixth surfaces is smaller than the width of the lower trench portion 10b. The first fin portion 12a is connected to lower portions of the pair of second fin portions 12b. The first fin portion 12a extends in the first direction between the pair of second fin portions 12b. The gate insulating film 11 covers the surfaces of the first and second fin portions 12a and 12b. The gate insulating film 11 covers the first through sixth side surfaces. The gate electrode 8 contacts the gate insulating film 11. The gate electrode 8 faces toward the first through sixth side surfaces while the gate insulating film 11 being interposed between the gate electrode and the first through sixth side surfaces. The semiconductor device 1 has a buried gate transistor.

In the semiconductor device 1 having the above-described structure, electric charges released from the source region 13b propagate through one second fin portion 12b, the first fin portion 12a, and the other second fin portion 12b and then enter into the drain region 13a.

In the semiconductor device 1 according to the present embodiment is applied as described above, the pair of second fin portions 12b (the second channel regions FCS) are provided to extend substantially in the direction vertical to the surface of the semiconductor substrate 2 from both ends of the first fin portion 12a (the first channel region FCU). Therefore, the pair of second fin portions 12b (the second channel regions FCS) will ensure the extended length of the channel region in the first direction, as compared to the related art.

Thus, it is possible to increase the ON current $I_{on}$ by reducing the resistance of the entire channel compared to the related art in which only the bottom portion has the saddle fin channel structure. Therefore, even when the widths of the buried gate trench portions 9 and 10 are narrow due to the reduction in size of the memory cell in the semiconductor device 1, the channel region may include the second channel regions FCS extending in the direction vertical to the surface of the semiconductor substrate 2, that is, in the direction vertical to the bottom surfaces of the drain region 13a and the source region 13b. The second channel regions FCS extending in the vertical direction will contribute to suppress the short channel effects of the switching transistor of the semiconductor device 1, which secures a sufficient ON current $I_{on}$.

In the cell array region SA shown in FIG. 1 described above, a number of the isolation regions 5 and the active regions 6 as described above may be arranged and formed. FIG. 1 schematically shows that some isolation regions 5 and some active regions 6 are arranged and formed in the cell array region SA. In the semiconductor device 1, although not shown, two word lines 7 operating for a normal transistor and a dummy word line are disposed next to the word lines 7. The dummy word line is a buried wiring for isolation (a dummy gate). A predetermined potential is applied to the dummy word line, so that adjacent transistors on the same active region are isolated. Alternatively, the parasitic transistor is in an OFF state and isolated by applying the predetermined potential to the dummy word line. The dummy word wiring is formed as follows. The trench portions having the same configuration as the word lines 7 are simultaneously formed. A conductive material is buried in the trench portions.

Method of Forming a Semiconductor Device:

A method of forming the semiconductor device 1 will be described with reference to FIGS. 9A to 29C.

FIGS. 9A, 10A, 11A, 12A, 13A, 14A, 15A, 16A, 17A, 18A, 19A, 20A, 21A, 22A, 23A, 24A, 25A, 26A, 27A, 28A, and 29A are fragmentary plan views illustrating a transistor in a step involved in the method of forming the semiconductor device in accordance with still another embodiment of the present invention. FIGS. 9B, 10B, 11B, 12B, 13B, 14B, 15B, 16B, 17B, 18B, 19B, 20B, 21B, 22B, 23B, 24B, 25B, 26B, 27B, 28B, and 29B are fragmentary cross-sectional elevation views taken along an X1-X1' line. FIGS. 9C, 10C, 11C, 12C, 13C, 14C, 15C, 16C, 17C, 18C, 19C, 20C, 21C, 22C, 23C, 24C, 25C, 26C, and 27C are cross-sectional elevation views taken along an X2-X2' line. FIGS. 9D, 10D, 11D, 12D, 13D, 14D, 15D, 16D, 17D, 18D, 19D, 20D, 21D, 22D, 23D, 24D, 25D, 26D, and 27D are cross-sectional elevation views taken along a Y1-Y1' line. FIGS. 9E, 10E, 11E, 12E, 13E, 14E, 15E, 16E, 17E, 18E, 19E, 20E, 21E, 22E, 23E, 24E, 25E, 26E, 27E, 28C, and 29C are cross-sectional elevation views taken along a Y2-Y2' line. FIGS. 9F, 10F, 11F, 12F, 13F, 14F, 15F, 16F, 17F, 18F, 19F, 20F, 21F, 22F, 23F, 24F, 25F, 26F, and 27F are cross-sectional elevation views taken along a Y3-Y3' line. The Y1-Y1' line and the Y2-Y2' line indicate cross-sectional portions in a region inside the cell array region SA. The Y3-Y3' line indicates a cross-sectional portion in a boundary region crossing over a cell array region SA and a peripheral circuit region CA.

In the cell array region SA shown in FIGS. 9A, 10A, 11A, 12A, 13A, 14A, 15A, 16A, 17A, 18A, 19A, 20A, 21A, 22A, 23A, 24A, 25A, 26A, 27A, 28A, and 29A, the isolation regions 5 and the active regions 6 as described above are arranged and formed in plural. However, a state in which some isolation regions 5 and some active regions 6 arranged and formed in the cell array region SA are enlarged is schematically shown for convenience in FIGS. 9A, 10A, 11A, 12A, 13A, 14A, 15A, 16A, 17A, 18A, 19A, 20A, 21A, 22A, 23A, 24A, 25A, 26A, 27A, 28A, and 29A.

As shown in FIGS. 9A to 9F, a semiconductor substrate 2 is prepared before processing. The semiconductor substrate 2 may be, but is not limited to, a single crystal substrate containing a predetermined concentration of impurities, for example, a silicon single crystal substrate containing impurities.

On the semiconductor substrate 2, a mask layer 24 is formed in which a silicon nitride film 21, an amorphous carbon film 22, and an antireflective (BARC) film 23 are sequentially stacked. A photoresist (PR) is applied on the mask layer 24. The PR is patterned using lithography technique, thereby forming a resist pattern 25 having a shape corresponding to the active region. An opening portion 25a in a position corresponding to an isolation region 5 and an opening portion 25b in the peripheral circuit region CA are formed using the resist pattern 25.

As shown in FIGS. 10A to 10F, the mask layer 24 is patterned by an anisotropic dry etching process using the resist pattern 25. The resist pattern 25 on the mask layer 24 is removed with the progression of etching. The shape of the resist pattern 25 is reflected to the mask layer 24. Thereby, the mask layer 24 can be patterned to the shape corresponding to the resist pattern 25. The mask layer 24 is also removed while the pattern of the mask layer 24 corresponding to the shape of the resist pattern 25 is maintained with the progression of etching. When the patterning of the mask layer 24 has been completed, for example, the antireflective (BARC) film 23 is completely removed. The mask layer 24 including the amorphous carbon film 22 and the silicon nitride film 21 remains to have an opening portion 24a in a position corresponding to the isolation region 5 and an opening portion 24b in the peripheral circuit region CA remains.

The semiconductor substrate 2 is patterned by an anisotropic dry etching process using the patterned mask layer 24. The shape of the mask layer 24 depends on the surface of the semiconductor substrate 2. In the cell array region SA of the semiconductor substrate 2, a plurality of isolation trench portions 3 extending in the first direction are arranged and formed in stripes. A trench portion 3A with a greater width than the isolation trench portion 3 is formed in the peripheral circuit region CA. In forming the isolation trench portion 3 and the trench portion 3A, the amorphous carbon film 22 included in the mask layer 24 is removed by an etching process.

As shown in FIGS. 11A to 11F, a silicon oxide film 26 is formed with a thickness sufficient to be buried in the isolation trench portion 3 and the trench portion 3A by a high-density plasma-chemical vapor deposition (HDP-CVD) method over the entire surface of the semiconductor substrate 2. A surface on which the silicon oxide film 26 is formed is polished by chemical mechanical polishing (CMP) and planarized until the surface of the silicon nitride film 21 serving as a stopper is shown.

As shown in FIGS. 12A to 12F, the silicon oxide film 26 is selectively removed by a wet etching process using hydrofluoric acid (HF). Thereby, the silicon oxide film 26 is adjusted to be the same in height as the surface of the semiconductor substrate 2. The silicon nitride film 21 is removed by a wet etching process using hot phosphoric acid ($H_3PO_4$). Thereby, the isolation region 5 and the active region 6 are formed to be alternately adjacent while extending in the first direction. As described above, the isolation region 5 is formed by burying the silicon oxide film 26 in the isolation trench portion 3 as the isolation insulating film 4. The active region 6 is isolated by the isolation region 5.

As shown in FIGS. 13A to 13F, a silicon oxide film 27 is formed by oxidizing the surface of the semiconductor substrate 2 (the active region 6) positioned between the silicon oxide films 26 by thermal oxidation (in situ steam generation (ISSG)). A non-doped silicon film 28 is formed over the entire surface of the semiconductor substrate 2. Low-concentration N-type impurities (phosphorus or the like) are ion-implanted into the active region 6 disposed between the silicon oxide films 26 through the non-doped silicon film 28, so that an impurity diffusion layer 29 is formed in the active region 6. The impurity diffusion layer 29 functions as a drain region 13a or a source region 13b of the semiconductor device 1.

A photo resist is applied on the semiconductor substrate 2. A resist pattern (not shown) is formed to cover the peripheral circuit region CA while patterning the photo resist by a lithography technique. As shown in FIGS. 14A to 14F, the non-doped silicon film 28 remains on the peripheral circuit region CA, and the non-doped silicon film 28 within the cell array region SA is removed by a dry etching process using the resist pattern.

As shown in FIGS. 15A to 15F, a part of the silicon oxide film 26 and the silicon oxide film 27 are selectively removed by an anisotropic selective etching process. Thereby, a trench portion 30 is formed between the impurity diffusion layers 29 in the isolation region 5. A bottom surface of the trench portion 30 is leveled to a top surface of a gate electrode 8 to be formed in a subsequent process which will be described later. That is, an upper surface of the silicon oxide film 26 which forms a bottom surface of the trench portion 30 is the same in level as the upper surface of the gate electrode 8 formed in the subsequent process. Also, the upper surface of the silicon oxide film 26 is the same in level as a bottom surface of the impurity diffusion layer 29.

As shown in FIGS. 16A to 16F, a protective oxide film (not shown) is formed and a silicon nitride film 31 covering the surface of the semiconductor substrate 2 is buried in the trench portion 30.

As shown in FIGS. 17A to 17F, an amorphous carbon film 32 is formed on the silicon nitride film 31. A photo resist is applied on the amorphous carbon film 32. The photo resist is patterned by a lithography technique. Thereby, there is formed a resist pattern (not shown) having opening portions which are located at positions where the buried gate trench portions 9 and 10 will be formed. The amorphous carbon film 32 is patterned by a dry etching process using the resist pattern. The resist pattern on the amorphous carbon film 32 is removed with the progression of etching. The shape of the resist pattern depends on the amorphous carbon film 32. In the amorphous carbon film 32, opening portions 32a are formed in a position where the buried gate trench portions 9 and 10 will be formed.

As shown in FIGS. 18A to 18F, parts shown through the opening portion 32a are removed by an anisotropic etching process using the patterned amorphous carbon film 32 as a mask. At this time, the amorphous carbon film 32 over the silicon nitride film 31 is also simultaneously removed. Thereby, the silicon nitride film 31, the silicon oxide film 26, the impurity diffusion layer 29, and the surface portion of the semiconductor substrate 2 shown through the opening portion 32a are etched at the constant speed. At this time, the first trench portion 9 is formed in at least the surface portion of the semiconductor substrate 2 (the active region 6). An upper trench portion 10a serving as a part of the second trench portion 10 is formed in the silicon nitride film 31 (the isolation region 5).

The silicon oxide film 26 forming a bottom surface of the upper trench portion 10a shown in FIG. 18C is selectively removed by a wet etching process using a solution containing HF as shown in FIGS. 19A to 19F. It is possible to etch the silicon oxide film 26 to the silicon nitride film 31 at a high selectivity using the HF-containing solution. Therefore, the silicon oxide film 26 under the silicon nitride film 31 is selectively removed without removing the silicon nitride film 31. Because the wet etching process is an isotropic etching process, the silicon oxide film 26 forming the bottom surface of the upper trench portion 10a is etched in a depth direction and a width direction. Therefore, under the upper trench portion 10a, a lower trench portion 10b is formed to be 2ΔW wider than the upper trench portion 10a.

The wet etching process by the HF-containing solution is used for forming the lower trench portion 10b in this embodiment, but the present embodiment is not limited thereto. In some cases, a chemical dry etching method using anhydrous hydrogen fluoride gas and ammonia gas may be used. For example, after the processes shown in FIGS. 18A to 18F are completed, the semiconductor substrate 2 is set in an etching device. The semiconductor substrate 2 is kept in the etching device under the condition at 20 mTorr and at 37° C. for 1 minute while a constant amount of anhydrous hydrogen fluoride gas and ammonia gas are supplied to the etching device. Thereby, ammonium fluorosilicate is formed on the surface of the silicon oxide film 26. The ammonium fluorosilicate is sublimed and removed if the temperature is raised to 180° C. At this time, an etching amount of the silicon oxide film 26 is 5 nm in thickness direction, and the etching amount can be controlled by setting a condition of the chemical dry etching method. The silicon oxide film 26 is etched since the chemical dry etching method is an isotropic etching process. Other structure members than the silicon oxide film 26 are not affected by the chemical dry etching method. The lower trench portion 10b can be formed with higher precision than in the above-described wet etching method.

The second trench portions 10 are formed in the isolation regions 5 of both sides between which the active region 6 is interposed. There is formed the first fin portion 12a which is a first part of the active region 6 protruding by ΔD in the substantially vertical direction to the surface of the substrate. The pair of second fin portions 12b is formed to be continuously connected to the first fin portion 12a. The pair of second fin portions 12b extends substantially in the horizontal direction to the surface of the substrate. The second fin portions 12b are second parts of the active region 6 which are shown by ΔW from the silicon oxide film 26.

As shown in FIGS. 20A to 20F, the surfaces of the first and second fin portions 12a and 12b are oxidized by thermal oxidation (ISSG: In Situ Steam Generation), so that the gate insulating film 11 made of a silicon oxide film is formed. A conductive film 33 is formed to cover the surface of the semiconductor substrate 2 and to be buried in the buried gate trench portions 9 and 10.

Figure 21A:
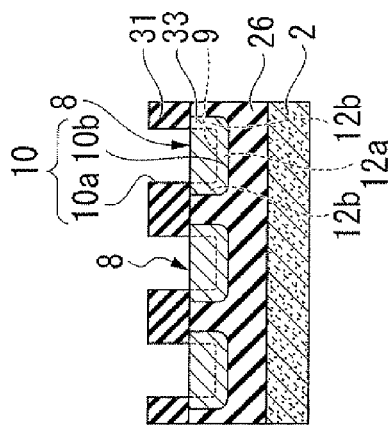
FIG. 21A is a fragmentary plan view illustrating a transistor in a step, subsequent to the step of FIGS. 20A through 20F, involved in the method of forming the semiconductor device in accordance with one embodiment of the present invention.
Figure 21B:
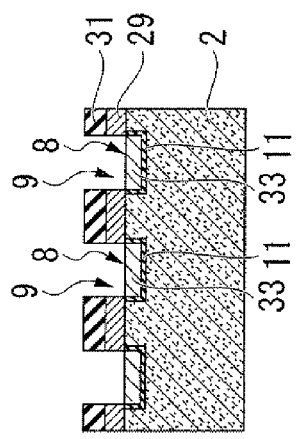
FIG. 21B is a fragmentary cross sectional elevation view, taken along an X1-X1' line of FIG. 21A, illustrating the transistor in a step, subsequent to the step of FIGS. 20A through 20F, involved in the method of forming the semiconductor device in accordance with one embodiment of the present invention.
Figure 21C:
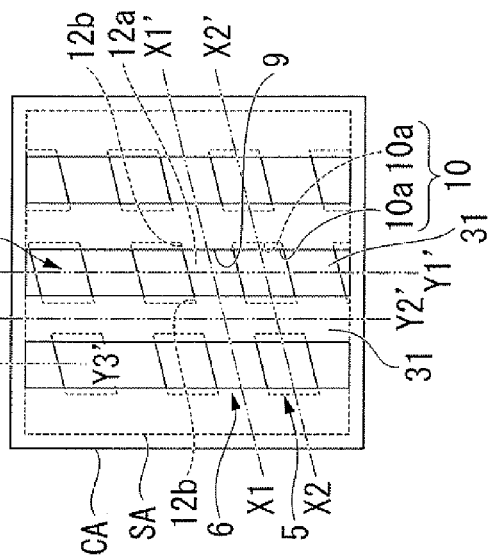
FIG. 21C is a fragmentary cross sectional elevation view, taken along an X2-X2' line of FIG. 21A, illustrating the transistor in a step, subsequent to the step of FIGS. 20A through 20F, involved in the method of forming the semiconductor device in accordance with one embodiment of the present invention.
Figure 21D:
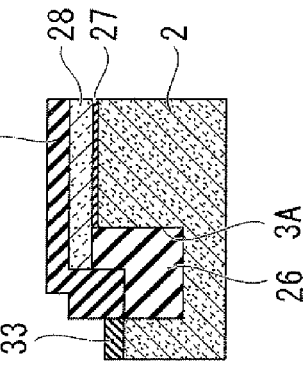
FIG. 21D is a fragmentary cross sectional elevation view, taken along a Y1-Y1' line of FIG. 21A, illustrating the transistor in a step, subsequent to the step of FIGS. 20A through 20F, involved in the method of forming the semiconductor device in accordance with one embodiment of the present invention.
Figure 21E:
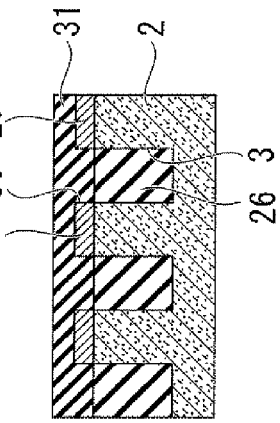
FIG. 21E is a fragmentary cross sectional elevation view, taken along a Y2-Y2' line of FIG. 21A, illustrating the transistor in a step, subsequent to the step of FIGS. 20A through 20F, involved in the method of forming the semiconductor device in accordance with one embodiment of the present invention.
Figure 21F:
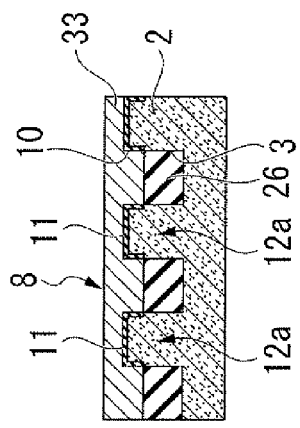
FIG. 21F is a fragmentary cross sectional elevation view, taken along a Y3-Y3' line of FIG. 21A, illustrating the transistor in a step, subsequent to the step of FIGS. 20A through 20F, involved in the method of forming the semiconductor device in accordance with one embodiment of the present invention.

As shown in FIGS. 21A to 21F, the surface of the conductive film 33 is polished by CMP for planarization until the surface of the silicon nitride film 31 serving as a stopper is shown. An etch-back process is performed until the surface of the conductive film 33 is the same in level as the surface of the silicon oxide film 26 as shown in FIG. 21C. Thereby, the gate electrode 8 is formed. The gate electrode 8 serves as the word line 7 in the memory cell region SA.

As shown in FIGS. 22A to 22F, a silicon oxide film 34 serving as a cap insulating film of the gate electrode 8 is formed by an HDP-CVD method over the entire surface of the semiconductor substrate 2.

As shown in FIGS. 23A to 23F, the surface of the silicon oxide film 34 is polished by CMP for planarization until the surface of the silicon nitride film 31 is shown. The silicon nitride film 31 formed in the peripheral circuit region CA serves as the stopper. The silicon oxide film 34 is selectively removed by a wet etching process using HF (etch-back process) until a surface of the silicon oxide film 34 is the same in level as the surface of the silicon nitride film 31 formed in the cell array region SA.

Through the above-described processes, a selection transistor included in a memory cell is formed as the semiconductor device 1 shown in FIGS. 1 and 2 described above in the cell array region SA.

In the semiconductor device 1 formed by applying this embodiment, the pair of second fin portions 12b (the second channel regions FCS) are formed to extend in the direction vertical to the surface of the semiconductor substrate 2 from both ends of the first fin portion 12a (the first channel region FCU) as shown in FIG. 3 described above. The pair of second fin portions 12b (the second channel regions FCS) will ensure the extended length of the channel region in the first direction.

After the processes shown in FIGS. 23A to 23F described above, a bit line electrically connected to any one of a source and a drain of the selection transistor, a capacitor electrically connected to the other, and a wiring layer thereon are sequentially formed, so that a DRAM in which a plurality of memory cells are arranged within the cell array region SA can be formed.

As shown in FIGS. 24A to 24F, after the processes shown in FIGS. 23A to 23F described above, a resist pattern 35 having an opening portion 35a is formed over the semiconductor substrate 2. The opening portion 35a is located in a position corresponding to a bit contact hole 36 which will be formed. The bit contact hole 36 is a trench for forming the bit line.

As shown in FIGS. 25A to 25F, the silicon nitride film 31 shown through the opening portion 35a is removed by an anisotropic etching process using the resist pattern 35 as a mask. At this time, the anisotropic etching process is performed until the impurity diffusion layer 29 formed in the cell array region SA and the non-doped silicon film 28 formed in the peripheral circuit region CA are shown. Thereby, the bit contact hole 36 is formed to extend in the direction (the second direction) parallel to the gate electrode 8.

As shown in FIGS. 26A to 26F, a stack of an impurity-containing polysilicon film 37a and a tungsten silicide film 37b is formed. The stack of an impurity-containing polysilicon film 37a and a tungsten silicide film 37b will be processed into the bit line 37 in later steps. The impurity-containing polysilicon film 37a covers the semiconductor substrate 2. The impurity-containing polysilicon film 37a is buried in the bit contact hole 36. The impurity-containing polysilicon film 37a may be formed to contain an impurity in the film formation step by a CVD method. In other cases, after the non-doped silicon film is formed, the impurity may be implanted by ion implantation.

As shown in FIGS. 27A to 27F, a resist pattern (not shown) is formed to cover a position where the bit line 37 is formed on the stack of an impurity-containing polysilicon film 37a and a tungsten silicide film 37b. Using the resist pattern, the stack of an impurity-containing polysilicon film 37a and a tungsten silicide film 37b is patterned by a dry etching process. Thereby, the bit line 37 is formed to extend in the direction (the second direction) parallel to the gate electrode 8. In some cases, the bit line 37 may be formed by the following method. After the tungsten silicide film 37b is formed, a cover silicon nitride film is formed. Using the resist pattern, the cover silicon nitride film is patterned to have a predetermined pattern. Further, the underlying tungsten silicide film 37b and the impurity-containing polysilicon film 37a are etched using the cover silicon nitride film as a mask.

As shown in FIGS. 28A to 28C, a space between the bit lines 37 is filled by applying spin-on dielectrics (SOD) over the semiconductor substrate 2. Under a vapor (H$_2$O) atmosphere, the SOD is modified to solid state by an annealing process, thereby forming an SOD film (an insulating film) 38. A resist pattern (not shown) is formed on the SOD film 38. The resist pattern has an opening portion in a position where a capacitor contact plug will be formed. A contact hole 39 is formed by patterning the SOD film 38 by a dry etching process using the resist pattern as a mask.

As shown in FIGS. 29A to 29C, a capacitor contact plug 40 is formed by burying a conductive material in the contact hole 39. An insulating film 41 is formed on the SOD film 38. The insulating film 41 has an opening portion in a position overlapping the capacitor contact plug 40. A capacitor contact pad 42 electrically connected to the capacitor contact plug 40 is formed to be buried in the opening portion.

Figure 30A:
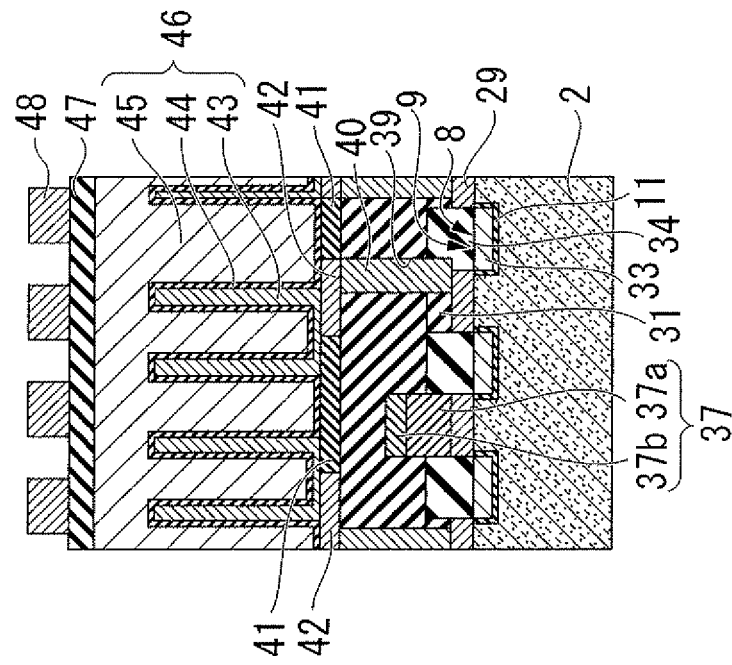
Figure 30B:
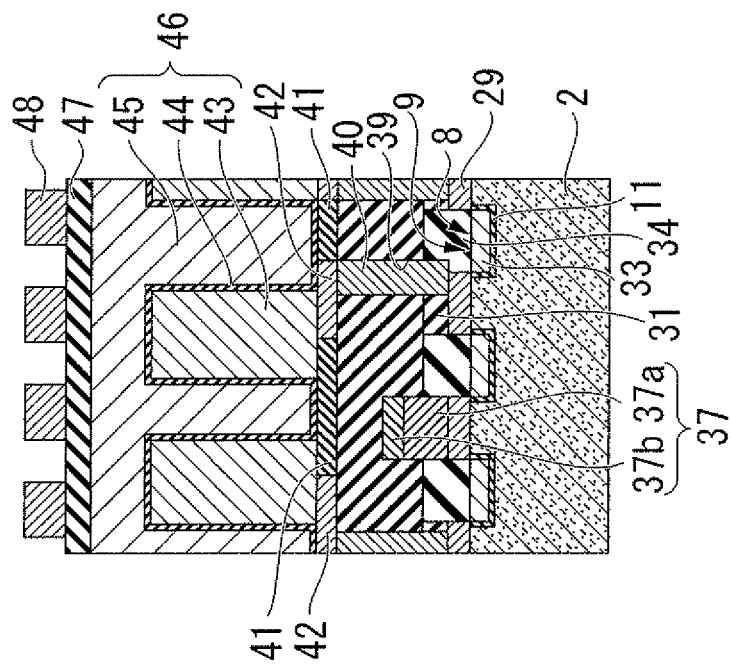

As shown in FIGS. 30A and 30B, a capacitor 46 including a lower electrode 43, a capacitor insulating film 44, and an upper electrode 45 is formed to overlap the capacitor contact pad 42. The capacitor 46 is not particularly limited. In some cases, there may be provided a cylindrical capacitor structure using only an outer wall of the lower electrode 43 as the electrode shown in FIG. 30A. In other cases, there may be provided a crown capacitor structure using an inner wall and an outer wall of the lower electrode 43 as the electrode shown in FIG. 30B.

An interlayer insulating film 47 is formed on the capacitor 46. A wiring layer 48 is formed on the interlayer insulating film 47. Thereby, there is formed a DRAM including the plurality of memory cells arranged within the cell array region SA.

Second Embodiment

Semiconductor Device

A semiconductor device 50 as shown in FIGS. 31 and 32 will be described as the second embodiment.

FIG. 31 is a fragmentary plan view illustrating the semiconductor device 50. FIG. 32 is a fragmentary perspective view in which main parts of the semiconductor device 50 are enlarged. In the following description, the same parts as those of the semiconductor device 1 in the first embodiment are denoted by the same reference numerals in the drawings and their descriptions are omitted.

The semiconductor device 50 has the following configuration as shown in FIGS. 31 and 32. As the isolation insulating film 4, the silicon oxide film 26 is buried in the isolation trench portion 3. The second trench portion 10 having the upper trench portion 10a and the lower trench portion 10b is formed in the silicon oxide film 26. A side wall film 51 (a silicon nitride film) extending in the second direction is formed to cover both side surfaces of the first trench portion 9 and the upper trench portion 10a described above.

In the semiconductor device 1 disclosed in the first embodiment, the silicon nitride film 31 is provided to cover the top of the silicon oxide film 26. In the present embodiment, the silicon nitride film, which is not on the silicon oxide film 26, is provided as the side wall film 51 to cover both side surfaces of the first trench portion 9 and the upper trench portion 10a described above. The rest of the configuration of the semiconductor device 50 is substantially the same as that of the semiconductor device 1.

In the semiconductor device 50 like the semiconductor device 1, the first and second fin portions 12a and 12b are provided so that a channel region is longer in the first direction than that in the related art.

Specifically, in the semiconductor device 50, the silicon oxide film 26 is buried in the isolation trench portion 3 as the isolation insulating film 4 as shown in FIG. 33. The second trench portion 10 includes the upper trench portion 10a and the lower trench portion 10b formed in the silicon oxide film 26. The upper trench portion 10a has the same width W1 as the first trench portion 9. The lower trench portion 10b is formed under the upper trench portion 10a. The lower trench portion 10b has a greater width W2 than the upper trench portion 10a. The second trench portion 10 has a cross-sectional shape that is line-symmetric with respect to a line extending in the second direction perpendicular to the first direction and extending through a center of the first trench portion 9.

A difference between a depth D1 of the first trench portion 9 and a depth D2 of the second trench portion 10 is denoted by ΔD (=D2−D1). In terms of the first fin portion 12a, the first fin portion 12a in the first trench portion 9 protrudes in the substantially vertical direction to the surface of the substrate by the ΔD. Thereby, the first fin portion 12a provides the first channel region FCU having the width W1 in the first direction.

The difference between the width W1 of the first trench portion 9 and the width W2 of the second trench portion 10 is denoted by 2ΔW (=W2−W1). In terms of the pair of second fin portions 12b, the pair of the second fin portions 12b in the first trench portion 9 respectively protrude substantially in the horizontal direction to the surface of the substrate by half (ΔW) a difference 2ΔW (=W2−W1) between the width W1 of the first trench portion 9 and the width W2 of the second trench portion 10 (the lower trench portion 10b). Thereby, the pair of second fin portions 12b forms second channel regions FCS extending in a direction vertical to the surface of the semiconductor substrate 2 from both ends of the first fin portion 12a. The width in the first direction of the second channel regions FCS (here, the direction perpendicular to the surface of the semiconductor substrate 2) is ΔD.

The semiconductor device 50 may include, but is not limited to, the gate insulating film 11 and the gate electrode 8. The gate insulating film 11 covers the surfaces of the first and second fin portions 12a and 12b. A part of the gate electrode 8 is buried in the buried gate trench portions 9 and 10 so as to extend across the first and second fin portions 12a and 12b while the gate insulating film 11 is interposed between the gate electrode 8 and the first fin portion 12a and between the gate electrode 8 and the second fin portion 12b. Therefore, the semiconductor device 50 has the saddle fin channel structure.

In parts of the active regions 6 between which the gate electrode 8 is interposed, the drain region 13a and the source region 13b (impurity diffusion layers) are provided. The drain region 13a and the source region 13b function as the source and the drain of the selection transistor, respectively. The drain region 13a and the source region 13b are formed by implanting ions. The drain region 13a and the source region 13b are connected to the tops of the second fin portions 12b located thereunder.

As described above, the semiconductor device 50 may include, but is not limited to, the gate electrode 8, the drain region 13a, the source region 13b, the first fin portion 12a (the first channel region FCU), the pair of second fin portions 12b (the second channel regions FCS), and the gate insulating film 11. The gate electrode 8 is located below the surface of the semiconductor substrate 2. The gate electrode 8 is buried in the first and second trench portions 9 and 10 extending in the second direction. The gate electrode 8 is interposed between the drain region 13a and the source region 13b. The drain region 13a and the source region 13b respectively have upper surfaces in positions that are higher than the upper surface of the gate electrode 8. The pair of second fin portions 12b is continuously connected to the respective bottom surfaces of the drain region 13a and the source region 13b. The pair of second fin portions 12b extends substantially in the depth direction (the horizontal direction to the surface of the semiconductor substrate 2) from the respective bottom surfaces of the drain region 13a and the source region 13b. One of the pair of second fin portions 12b has first and second side surfaces opposed to each other and a third side surface adjacent to the first and second side surfaces. The other of the pair of second fin portions 12b has fourth and fifth side surfaces opposed to each other and a sixth side surface adjacent to the forth and fifth side surfaces. The third and sixth side surfaces face toward each other. A distance between the third and sixth surfaces is smaller than a width of the lower trench portion 10b. The first fin portion 12a is connected to lower portions of the pair of second fin portions 12b. The first fin portion 12a extends in the first direction between the pair of second fin portions 12b. The gate insulating film 11 covers the surfaces of the first and second fin portions 12a and 12b. The gate insulating film 11 covers the first through sixth side surfaces. The gate electrode 8 contacts the gate insulating film 11. The gate electrode 8 faces toward the first through sixth side surfaces while the gate insulating film 11 being interposed between the gate electrode and the first through sixth side surfaces. Therefore, the semiconductor device 50 has a buried gate transistor.

In the semiconductor device 50 having the above-described structure, electric charges released from the source region 13b propagate through one second fin portion 12b, the first fin portion 12a, and the other second fin portion 12b and then enter into the drain region 13a.

In the semiconductor device 50 according to the present embodiment is applied as described above, the pair of second fin portions 12b (the second channel regions FCS) are provided to extend substantially in the direction vertical to the surface of the semiconductor substrate 2 from both ends of the first fin portion 12a (the first channel region FCU). The pair of second fin portions 12b (the second channel regions FCS) will ensure the extended length of the channel region in the first direction as compared to the related art.

It is possible to increase the ON current $I_{on}$ by reducing the resistance of the entire channel compared to the semiconductor device according to the related art, which has the saddle fin channel structure without second fin portions 12b. Therefore, even when the widths of the buried gate trench portions 9 and 10 are narrow due to the reduction in size of the memory cell in the semiconductor device 50, the channel region can extend in the direction vertical to the surface of the semiconductor substrate 2, that is, in the direction vertical to the bottom surfaces of the drain region 13a and the source region 13b. Consequently, a sufficient ON current $I_{on}$ can be secured by suppressing short channel effect.

In the semiconductor device 50, the silicon oxide film 26 is buried in the isolation trench portion 3 as the isolation insulating film 4. The upper trench portion 10a and the lower trench portion 10b included in the second trench portion 10 are formed in the silicon oxide film 26. The side wall film 51 extending in the second direction is formed to cover both side surfaces of the first trench portion 9 and the upper trench portion 10a described above.

When the side wall film 51 is made of a silicon nitride film to be described later, it is possible to further suppress a junction leak of the drain region 13a and the source region 13b (the impurity diffusion layers) from being increased compared to the semiconductor device 1. At this time, the side wall films 51 (the silicon nitride film) with small thickness are located on side surfaces of the trench portions 9 and 10a.

Method of Forming a Semiconductor Device:

A method of forming the semiconductor device 50 will be described with reference to FIGS. 34A to 38E.

FIGS. 34A, 35A, 36A, 37A, and 38A are fragmentary plan views illustrating a transistor in a step involved in the method of forming the semiconductor device 50. FIGS. 34B, 35B, 36B, 37B, and 38B are fragmentary cross-sectional elevation views taken along an X1-X1' line illustrating the transistor in a step involved in the method of forming the semiconductor device 50. FIGS. 34C, 35C, 36C, 37C, and 38C are fragmentary cross-sectional elevation views taken along an X2-X2' line illustrating the transistor in a step involved in the method of forming the semiconductor device 50. FIGS. 34D, 35D, 36D, 37D, and 38D are fragmentary cross-sectional elevation views taken along an Y1-Y1' line illustrating the transistor in a step involved in the method of forming the semiconductor device 50. FIGS. 34E, 35E, 36E, 37E, and 38E are fragmentary cross-sectional elevation views taken along an Y2-Y2' line illustrating the transistor in a step involved in the method of forming the semiconductor device 50. The line Y1-Y1' and the line Y2-Y2' indicate cross-sectional portions in a region inside the cell array region SA.

In the cell array region SA shown in FIGS. 34A, 35A, 36A, 37A, and 38A, a plurality of isolation regions 5 and a plurality of active regions 6 are arranged. However, a state in which some isolation regions 5 and some active regions 6 arranged in the cell array region SA are enlarged is schematically shown for convenience in FIGS. 34A, 35A, 36A, 37A, and 38A.

Because the semiconductor device 50 is formed by the processes of forming the semiconductor device 1 shown in FIGS. 9A to 14F, their descriptions are omitted.

After the above-described processes shown in FIGS. 14A to 14F, a silicon nitride film 52 and an amorphous carbon film 53 are sequentially stacked over the semiconductor substrate 2 as shown in FIGS. 34A to 34E. A photo resist is applied on the amorphous carbon film 53. The photo resist is patterned by a lithography technique. Thereby, a resist pattern (not shown) having an opening portion is formed in a position where the buried gate trench portions 9 and 10 will be formed. The amorphous carbon film 53 and the silicon nitride film 52 are patterned by a dry etching process using the resist pattern as a mask. At this time, the resist pattern on the amorphous carbon film 53 is removed with the progression of etching. The shape of the resist pattern is reflected to the amorphous carbon film 53 and the silicon nitride film 52. In the amorphous carbon film 53 and the silicon nitride film 52, opening portions 53a and 52a are formed in a position where the buried gate trench portion 9 will be formed.

As shown in FIGS. 35A to 35E, parts shown through the opening portions 53a and 52a are removed by an anisotropic etching process using the patterned amorphous carbon film 53 and the patterned silicon nitride film 52 as a mask. At this time, the amorphous carbon film 53 is also simultaneously removed. Thereby, the silicon oxide film 26, the impurity diffusion layer 29, and the surface portion of the semiconductor substrate 2 shown through the opening portion 52a are etched at the constant speed. At this time, the first trench portion 9 is formed in at least the surface portion of the semiconductor substrate 2 (the active region 6). The upper trench portion 10a serving as a part of the second trench portion 10 is formed in the silicon oxide film 26.

As shown in FIGS. 36A to 36E, a pair of side wall films 51 are formed to cover both side surfaces of the first trench portion 9 and the upper trench portion 10a. In order to form the side wall films 51, a silicon nitride film is formed to cover the surface of the semiconductor substrate 2. The silicon nitride film is formed with such a thickness that it is not completely buried inside the trench portions 9 and 10a. The silicon nitride film is etched back by an anisotropic dry etching process. The silicon nitride film remains only on side surfaces of the trench portions 9 and 10a. Thereby, the side wall films 51 can be formed to cover both side surfaces of the first trench portion 9 and the upper trench portion 10a.

As shown in FIGS. 37A to 37E, the semiconductor substrate 2 (silicon) shown through the first trench portion 9 and the silicon oxide film 26 shown through the upper trench portion 10a are removed at the constant speed by an etching process. Thereby, a trench portion is formed under the side wall films 51 which are formed on the side surfaces of the trench portions 9 and 10a.

As shown in FIGS. 38A to 38E, the silicon oxide film 26 shown through the upper trench portion 10a is selectively removed by a wet etching process using a solution containing HF. It is possible to etch the silicon oxide film 26 at a high selectivity to the silicon nitride film (the side wall film 51) by using the HF-containing solution. Therefore, the silicon oxide film 26 which is not covered by the silicon nitride film (the side wall film 51) is selectively removed without removing the silicon nitride film (the side wall film 51). The wet etching process is an isotropic etching process. The silicon oxide film 26 shown through the upper trench portion 10a is etched in a depth direction and a width direction. Under the upper trench portion 10a, the lower trench portion 10b is formed to be 2ΔW wider than the upper trench portion 10a as shown in FIG. 38C.

The wet etching process using the HF-containing solution is used as a method of forming the lower trench portion 10b in this embodiment, but the present invention is not limited thereto. In some cases, a chemical dry etching method using anhydrous hydrogen fluoride gas and ammonia gas may be used as disclosed in the above-described first embodiment.

Thereby, the second trench portions 10 are formed in the isolation regions 5 of both sides between which the active region 6 is interposed. There is formed a first fin portion 12a which is a first part of the active region 6 protruding by ΔD from the bottom surface of the second trench portion 10. A pair of second fin portions 12b is formed to be continuous to the first fin portion 12a. The pair of second fin portions 12b extends in the substantially vertical direction to the surface of the semiconductor substrate 2. The second fin portions 12b is second parts of the active region 6 which are shown by ΔW from the silicon oxide film 26.

As shown in FIGS. 39A to 39E, the surfaces of the first and second fin portions 12a and 12b are oxidized by thermal oxidation (ISSG: In Situ Steam Generation), so that the gate insulating film 11 made of a silicon oxide film is formed. The conductive film 33 is formed to cover the surface of the semiconductor substrate 2 and to be buried in the buried gate trench portions 9 and 10.

As shown in FIGS. 40A to 40E, the surface of the conductive film 33 is polished by CMP for planarization until the surface of the silicon nitride film 52 serving as a stopper is shown. An etch-back process is performed until the surface of the conductive film 33 is substantially the same in level as a bottom of the impurity diffusion layer 29. Thereby, the gate electrode 8 is formed. The gate electrode 8 serves as the word line 7 in the memory cell region SA.

As shown in FIGS. 41A to 41E, a silicon oxide film 34a serving as a cap insulating film of the gate electrode 8 is formed by an HDP-CVD method over the entire surface of the semiconductor substrate 2.

As shown in FIGS. 42A to 42E, the surface of the silicon oxide film 34 is polished by CMP for planarization until the surface of the silicon nitride film 31 is shown.

As shown in FIGS. 43A to 43E, the silicon oxide film 34a is selectively removed by a wet etching process using HF (an etch-back process) until a surface of the silicon oxide film 34a is the same in level as the surface of the semiconductor substrate 2. Thereafter, parts of the silicon nitride film 52 and the side wall film 51 described above is removed by a wet etching process using hot phosphoric acid ($H_3PO_4$).

As shown in FIGS. 44A to 44E, a silicon oxide film 34b is formed by an HDP-CVD method over the entire surface of the semiconductor substrate 2.

There is formed a resist pattern (not shown) having an opening portion which is formed in a position where the bit contact hole 36 will be formed. Using the resist pattern as a mask, the silicon oxide film 34b shown through the opening portion is removed by an anisotropic etching process. The bit contact hole 36 is formed to extend in the direction (second direction) parallel to the gate electrode 8.

Processes after the process shown in FIGS. 44A to 44E are basically identical to the processes for forming the semiconductor device 1 shown in FIGS. 26A to 30B, and thus their descriptions are omitted. Through the above processes, the semiconductor device 50 shown in FIGS. 31 and 32 described above can be manufactured.

Third Embodiment

Another semiconductor device 70 as shown in FIGS. 45 and 46 will be described as the third embodiment.

FIG. 45 is a fragmentary plan view illustrating the semiconductor device 70. FIG. 46 is a fragmentary perspective view in which main parts of the semiconductor device 70 are enlarged. In the following description, the same parts as those of the semiconductor device 1 are denoted by the same reference numerals in the drawings and their descriptions are omitted.

The semiconductor device 70 has the following configuration as shown in FIGS. 45 and 46. As the isolation insulating film 4, the silicon oxide film 26 is buried in the isolation trench portion 3. In the silicon oxide film 26, the upper trench portion 10a and the lower trench portion 10b included in the second trench portion 10 are formed. Except that the side wall film 51 (the silicon nitride film) shown in the second embodiment is not provided, the rest of the configuration is substantially the same as that of the semiconductor device 50.

In the semiconductor device 70 like the semiconductor devices 1 and 50, the first and second fin portions 12a and 12b are provided so that a channel region is longer in the first direction than that in the related art.

In the semiconductor device 70, the silicon oxide film 26 is buried in the isolation trench portion 3 as the isolation insulating film 4 as shown in FIG. 47. The second trench portion 10 includes the upper trench portion 10a and the lower trench portion 10b formed in the silicon oxide film 26. The upper trench portion 10a has the same width W1 as the first trench portion 9. The lower trench portion 10b is located under the upper trench portion 10a. The lower trench portion 10b has a greater width W2 than the upper trench portion 10a. The second trench portion 10 has a cross-sectional shape that is line-symmetric with respect to a line extending in the second direction perpendicular to the first direction and extending through a center of the first trench portion 9.

A difference between a depth D1 of the first trench portion 9 and a depth D2 of the second trench portion 10 is denoted by $\Delta D$ ($=D2-D1$). The first fin portion 12a in the first trench portion 9 protrudes in the substantially vertical direction to the surface of the substrate by a difference $\Delta D$ ($=D2-D1$) between a depth D1 of the first trench portion 9 and a depth D2 of the second trench portion 10. Thereby, the first fin portion 12a provides the first channel region FCU having the width W1 in the first direction. In some cases, a surface portion of the first fin portion 12a forms the first channel region FCU.

A difference between the width W1 of the first trench portion 9 and the width W2 of the second trench portion 10 is denoted by $2\Delta W$ ($=W2-W1$). The pair of the second fin portions 12b in the first trench portion 9 respectively protrude in the substantially horizontal direction to the surface of the substrate by half ($\Delta W$) a difference $2\Delta W$ ($=W2-W1$) between the width W1 of the first trench portion 9 and the width W2 of the second trench portion 10 (the lower trench portion 10b). Thereby, the pair of second fin portions 12b forms the second channel regions FCS extending in the direction vertical to the surface of the semiconductor substrate 2 from both ends of the first fin portion 12a. In some cases, surface portions of the pair of second fin portions 12b form the second channel region FCS. Each of the second fin portions 12b includes an end portion having first and second channel portions of the second channel region FCS. The first and second channel portions are opposed to each other. The first and second channel portions extend substantially vertical to a surface of the semiconductor substrate.

The semiconductor device 70 may include, but is not limited to, the gate insulating film 11 and the gate electrode 8. The gate insulating film 11 covers the surfaces of the first and second fin portions 12a and 12b. A part of the word line 7 functions as the gate electrode 8. The gate electrode 8 is buried in the buried gate trench portions 9 and 10 so as to cross over the first and second fin portions 12a and 12b while the gate insulating film 11 is interposed between the gate electrode 8 and the first fin portion 12a and between the gate electrode 8 and the second fin portion 12b. Thereby, the semiconductor device 70 has the saddle fin channel structure.

In parts of the active regions 6 between which the gate electrode 8 is interposed, the drain region 13a and the source region 13b (the impurity diffusion layers) are provided. The drain region 13a and the source region 13b function as the source and the drain of the selection transistor, respectively. The drain region 13a and the source region 13b are formed by implanting ions. The drain region 13a and the source region 13b have bottoms which are connected to the tops of the second fin portions 12b located under the drain region 13a and the source region 13b, respectively.

As described above, the semiconductor device 70 may include, but is not limited to, the gate electrode 8, the drain region 13a and the source region 13b (the impurity diffusion layers), the first fin portion 12a (the first channel region FCU), the pair of second fin portions 12b (the second channel regions FCS), and the gate insulating film 11. The gate electrode 8 is located below the surface of the semiconductor substrate 2. The gate electrode 8 is buried in the first and second trench portions 9 and 10 extending in the second direction. The drain region 13a and the source region 13b are located on both sides between which the gate electrode 8 is interposed. The drain region 13a and the source region 13b respectively have upper surfaces in positions that are higher than the upper surface of the gate electrode 8. The pair of second fin portions 12b is connected to the respective bottom surfaces of the drain region 13a and the source region 13b. The pair of second fin portions 12b extends substantially in the depth direction (the horizontal direction to the surface of the semiconductor substrate 2) from the respective bottom surfaces of the drain region 13a and the source region 13b. One of the pair of second fin portions 12b has first and second side surfaces opposed to each other and a third side surface adjacent to the first and second side surfaces. The other of the pair of second fin portions 12b has fourth and fifth side surfaces opposed to each other and a sixth side surface adjacent to the forth and fifth side surfaces. The third and sixth side surfaces face toward each other. The distance between the third and sixth surfaces is smaller than the width of the lower trench portion 10b. The first fin portion 12a is connected to lower portions of the pair of second fin portions 12b. The first fin portion 12a extends in the first direction between the pair of second fin portions 12b. The gate insulating film 11 covers the surfaces of the first and second fin portions 12a and 12b. The gate insulating film 11 covers the first through sixth side surfaces. The gate electrode 8 contacts the gate insulating film 11. The gate electrode 8 faces toward the first through sixth side surfaces while the gate insulating film 11 being interposed between the gate electrode 8 and the first through sixth side surfaces. Therefore, the semiconductor device 70 has the buried gate transistor.

In the semiconductor device 50 having the above-described structure, an electric charge released from the source region 13b enters the drain region 13a by sequentially passing through one second fin portion 12b, the first fin portion 12a, and the other second fin portion 12b.

In the semiconductor device 70 according to the present embodiment is applied as described above, the pair of second fin portions 12b (the second channel regions FCS) are provided to extend in the direction vertical to the surface of the semiconductor substrate 2 from both ends of the first fin portion 12a (the first channel region FCU) in the first direction. The pair of second fin portions 12b (the second channel regions FCS) will ensure the extended length of the channel region in the first direction as compared to the related art.

It is possible to increase the ON current $I_{on}$ by reducing the resistance of the entire channel as compared with the semiconductor device according to the related art, which has the saddle fin channel structure without second fin portions 12b. Therefore, even when the widths of the buried gate trench portions 9 and 10 are narrow due to the reduction in size of the memory cell in the semiconductor device 70, the channel region can extend in the direction vertical to the surface of the semiconductor substrate 2, that is, in the direction vertical to the bottom surfaces of the drain region 13a and the source region 13b. Consequently, a sufficient ON current can be secured by suppressing a short channel effect.

In the semiconductor device 70, the silicon oxide film 26 is buried in the isolation trench portion 3 as the isolation insulating film 4. The upper trench portion 10a and the lower trench portion 10b included in the first trench portion 10 are formed in the silicon oxide film 26. The side wall film 51 is removed.

The above-described junction leakage can be further suppressed because there is no silicon nitride film in the vicinity of the drain region 13a and the source region 13b (the impurity diffusion layers) in the semiconductor device 70.

Method of Forming a Semiconductor Device:

A method of forming the semiconductor device 70 will be described with reference to FIGS. 48A to 51E.

FIGS. 48A, 49A, 50A, and 51A are fragmentary plan views illustrating a transistor in a step involved in the method of forming the semiconductor device 70. FIGS. 48B, 49B, 50B, and 51B are fragmentary cross-sectional elevation views taken along an X1-X1' line illustrating the transistor in a step involved in the method of forming the semiconductor device 70. FIGS. 48C, 49C, 50C, and 51C are fragmentary cross-sectional elevation views taken along an X2-X2' line illustrating the transistor in a step involved in the method of forming the semiconductor device 70. FIGS. 48D, 49D, 50D, and 51D are fragmentary cross-sectional elevation views taken along an Y1-Y1' line illustrating the transistor in a step involved in the method of forming the semiconductor device 70. FIGS. 48E, 49E, 50E, and 51E are fragmentary cross-sectional elevation views taken along an Y2-Y2' line illustrating the transistor in a step involved in the method of forming the semiconductor device 70. The line Y1-Y1' and the line Y2-Y2' indicate cross-sectional portions in a region inside the cell array region SA.

In the cell array region SA shown in FIGS. 48A, 49A, 50A, and 51A, a plurality of isolation regions 5 and a plurality of active regions 6 are arranged. However, a state in which some isolation regions 5 and some active regions 6 arranged and formed in the cell array region SA are enlarged is schematically shown for convenience in FIGS. 48A, 49A, 50A, and 51A.

The semiconductor device 70 is formed by the processes of forming the semiconductor device 1 shown in FIGS. 9A to 14F. Thereafter, the semiconductor device 70 is formed by the processes of forming the semiconductor device 50 shown in FIGS. 34A to 38E. Therefore, their descriptions are omitted.

As shown in FIGS. 48A to 48E, the side wall film 51 and the silicon nitride film 52 are removed by a wet etching process using a hot phosphoric acid ($H_3PO_4$) after the process shown in FIGS. 38A to 38E. As shown in FIGS. 49A to 49E, the surfaces of the first and second fin portions 12a and 12b are oxidized by thermal oxidation (ISSG: In Situ Steam Generation), so that the gate insulating film 11 made of a silicon oxide film is formed. The conductive film 33 is formed to cover the surface of the semiconductor substrate 2 and to be buried in the buried gate trench portions 9 and 10. The surface of the conductive film 33 is polished by CMP for planarization until the surface of the silicon oxide film 27 serving as a stopper is shown. An etch-back process is performed until the surface of the conductive film 33 is substantially the same in level as the bottom of the diffusion layer 29. Thereby, the gate electrode 8 is formed. The top surface of the gate electrode 8 is lower in level than the top surface of the isolation region 5.

The gate electrode 8 serves as the word line 7 in the memory cell region SA.

As shown in FIGS. 50A to 50E, the silicon oxide film 34a is formed by an HDP-CVD method over the entire surface of the semiconductor substrate 2. The silicon oxide film 34a has a sufficient thickness to be buried in the trench portions 9 and 10. The surface of the conductive film 34a is polished by CMP for planarization until the surface of the silicon oxide film 27 serving as a stopper is shown. The silicon oxide film 34a serves as a cap insulating film of the gate electrode 8.

As shown in FIGS. 51A to 51E, the silicon oxide film 34b is formed by an HDP-CVD method over the entire surface of the semiconductor substrate 2.

A resist pattern (not shown) having an opening portion which is formed in a position where the bit contact hole 36 will be formed. Using the resist pattern as a mask, the silicon oxide film 34b shown through the opening portion is removed by an anisotropic etching process. The bit contact hole 36 is formed to extend in the direction (second direction) parallel to the gate electrode 8.

Processes after the process shown in FIGS. 51A to 51E are basically identical to the processes for forming the semiconductor device 1 shown in FIGS. 26A to 30B, and thus their descriptions are omitted. Through the above processes, the semiconductor device 70 shown in FIGS. 45 and 46 described above can be manufactured.

Data Processing System

A data processing system 400 as shown in FIG. 52 will be described.

The data processing system 400 is an example of a system including the semiconductor device 1, 50, or 70. The data processing system 400 may include, but is not limited to, a computer system.

The data processing system 400 may include, but is not limited to, a data processor 420 and a DRAM 460 according to the first through third embodiments. The data processor 420 may include, but is not limited to, a microprocessor (MPU), a digital signal processor (DSP), or the like.

The data processor 420 is connected to the DRAM 460 via a system bus 410. However, it may be connected by a local bus without involving the system bus 410. One system bus 410 is shown in FIG. 52, but serial and parallel connections may be made via a connector or the like, if necessary.

A storage device 430, an I/O device 440, and a ROM 450 of the data processing system 400 are connected to the system bus 410, if necessary, but are not essential constituent elements. In some cases, the I/O device 440 may be only any one of an input device or an output device. The number of each element in the data processing system 400 is not particularly limited, and may be at least one or more.

EXAMPLES

Comparison Evaluation Test

Figure 4:
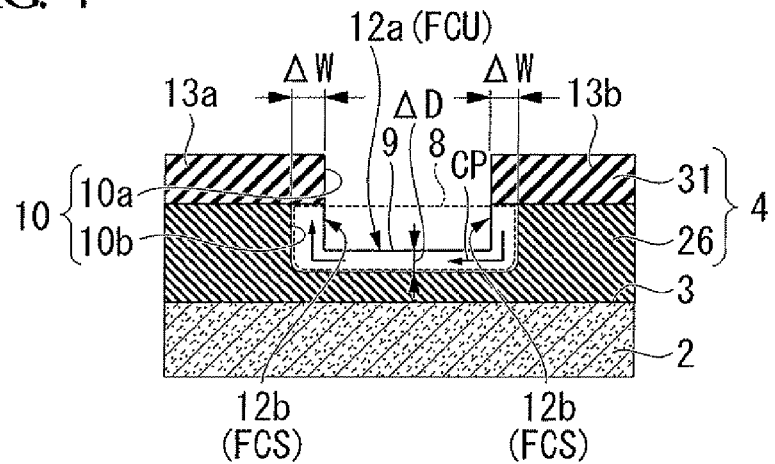
FIG. 4 is a fragmentary cross sectional elevation view illustrating the channel structure of the semiconductor device shown in FIG. 1 in accordance with one embodiment of the present invention.
Figure 5:
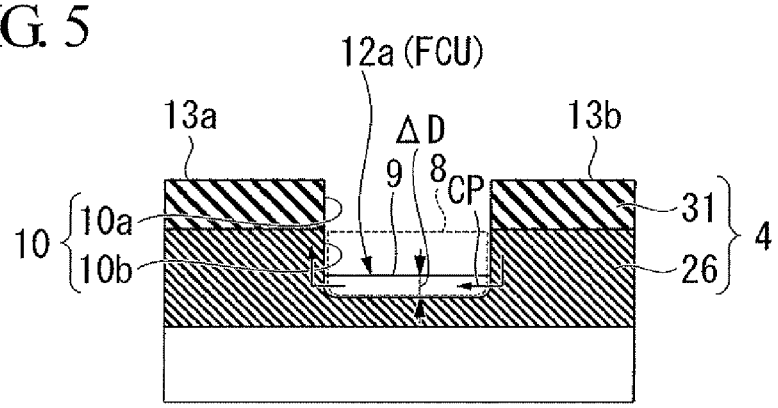
FIG. 5 is a fragmentary cross sectional elevation view illustrating a channel structure of a semiconductor device in accordance with the related art.

The comparison evaluation test was performed by comparing the characteristics of driving currents $I_{on}$, threshold voltages $V_t$, and subthreshold swings (SS) between the semiconductor device of the present invention shown in FIG. 4 and the semiconductor device of the related art shown in FIG. 5. Evaluation results of the driving currents $I_{on}$, the threshold voltages $V_t$, and the subthreshold swings (SS) are respectively shown in FIGS. 6 to 8.

In the semiconductor devices shown in FIGS. 4 and 5, the same parts as those of the semiconductor device shown in FIG. 2 are denoted by the same reference numerals in the drawings. A current pass (CP) of an arrow shown in FIGS. 4 and 5 indicates a current path serving as a channel.

The semiconductor device of the present invention shown in FIG. 4 has the same saddle fin channel structure as the semiconductor device 1 shown in FIG. 3. The pair of second fin portions 12b (the second channel regions FCS) are provided to extend in the direction vertical to the surface of the semiconductor substrate 2 from both ends of the first fin portion 12a (the first channel region FCU). The source region 13a and the drain region 13b are provided on the pair of second fin portions 12b. The gate electrode 8 is buried in the buried gate trench portions 9 and 10.

The semiconductor device of the related art shown in FIG. 5 is the same as the semiconductor device 1 shown in FIG. 3, except that it has the saddle fin channel structure having only the first fin portion 12a (the first channel region FCU).

For the semiconductor device of the present invention, the results of the driving currents $I_{on}$, the threshold voltages $V_t$, and the subthreshold swings (SS) were evaluated when a protrusion amount ΔD of the first fin portion 12a was 0, 10, and 20 nm. As a comparative example, for the semiconductor device of the related art, the results of the driving currents $I_{on}$, the threshold voltages $V_t$, and the subthreshold swings (SS) were evaluated in the same manner as the semiconductor device of the present invention. In this comparison evaluation test, a protrusion amount ΔW of the second fin portion 12b in the semiconductor device of the present invention was designated as 10 nm and all of a physical size, an applied voltage, and the like had the same conditions.

Figure 6:
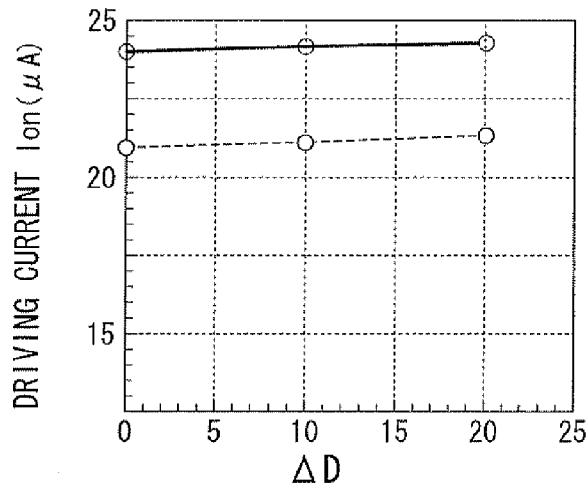
FIG. 6 is a figure showing relationships between a height of a fin portion and a driving current ($I_{on}$) in accordance with the semiconductor device of the present invention and the related art.

As shown in FIG. 6, the semiconductor device of the present invention (solid line) is greater in $I_{on}$ value than the semiconductor device of the related art (broken line) by about 3 μA. The driving current of the transistor needs to have stable characteristics for a stable operation of the semiconductor device even when the transistor is miniaturized. It is preferable that the driving current of the transistor have a large value. Therefore, it can be seen that the semiconductor device of the present invention is superior to the semiconductor device of the related art.

Figure 7:
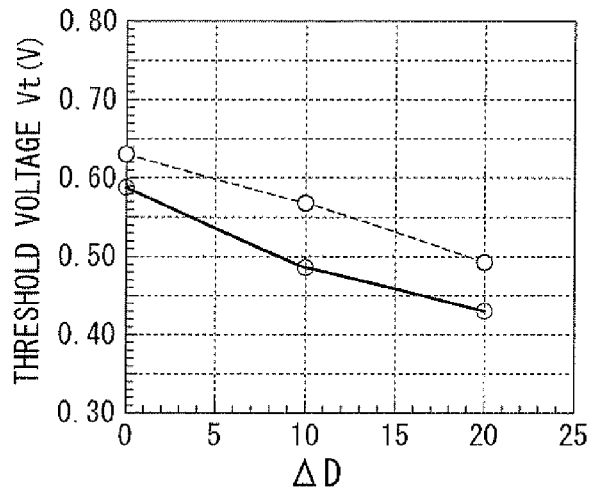
FIG. 7 is a figure showing relationships between a height of a fin portion and a threshold voltage ($V_t$) in accordance with semiconductor device of the present invention and the related art.

As shown in FIG. 7, the semiconductor device of the present invention (solid line) is less in $V_t$ value than the semiconductor device of the related art (broken line) as a whole. In particular, when a height of the fin portion 12a is 10 nm, the semiconductor device of the present invention is less in $V_t$ value than the semiconductor device of the related art by about 0.07V. It is preferable that the threshold voltage of the transistor be a low voltage to satisfy the requirement of low power consumption of the semiconductor device. Therefore, it can be seen that the semiconductor device of the present invention is superior to the semiconductor device of the related art.

Figure 8:
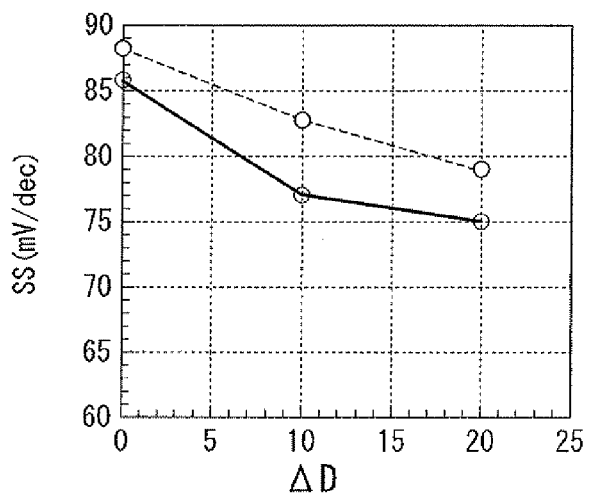
FIG. 8 is a figure showing relationships between a height of a fin portion and a subthreshold swing (SS) in accordance with semiconductor device of the present invention and the related art.
Figure 9C:
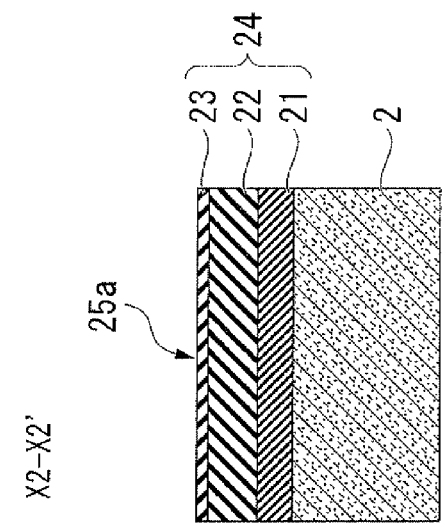
FIG. 9C is a fragmentary cross sectional elevation view, taken along an X2-X2' line of FIG. 9A, illustrating the transistor in a step involved in the method of forming the semiconductor device in accordance with one embodiment of the present invention.
Figure 9B:
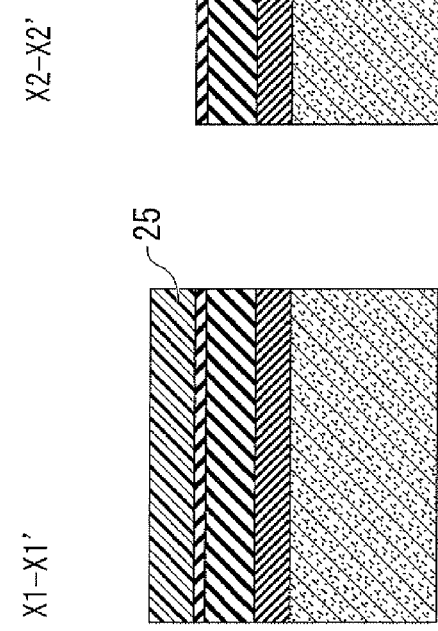
FIG. 9B is a fragmentary cross sectional elevation view, taken along an X1-X1' line of FIG. 9A, illustrating the transistor in a step involved in the method of forming the semiconductor device in accordance with one embodiment of the present invention.
Figure 9A:
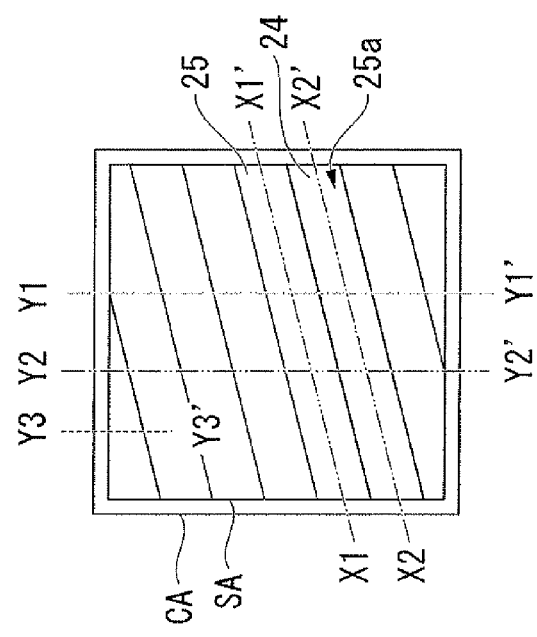
FIG. 9A is a fragmentary plan view illustrating a transistor in a step involved in the method of forming the semiconductor device shown in FIG. 1 in accordance with one embodiment of the present invention.
Figure 9F:
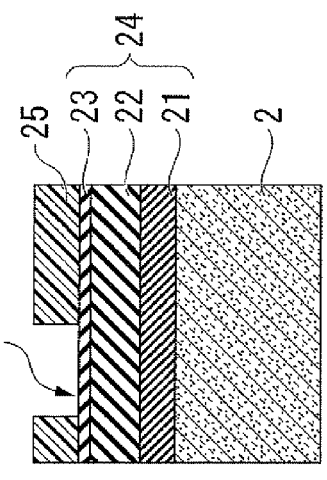
FIG. 9F is a fragmentary cross sectional elevation view, taken along a Y3-Y3' line of FIG. 9A, illustrating the transistor in a step involved in the method of forming the semiconductor device in accordance with one embodiment of the present invention.
Figure 9E:
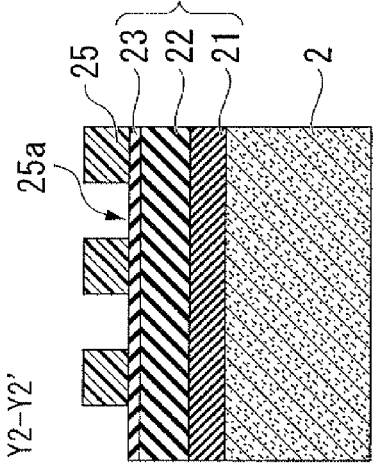
FIG. 9E is a fragmentary cross sectional elevation view, taken along a Y2-Y2' line of FIG. 9A, illustrating the transistor in a step involved in the method of forming the semiconductor device in accordance with one embodiment of the present invention.
Figure 9D:
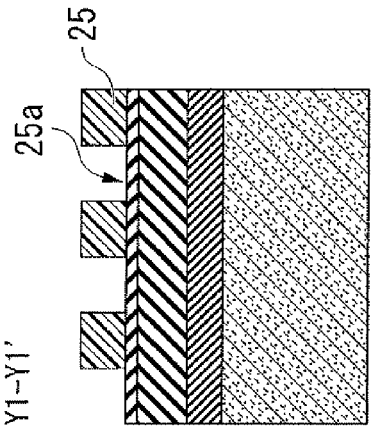
FIG. 9D is a fragmentary cross sectional elevation view, taken along a Y1-Y1' line of FIG. 9A, illustrating the transistor in a step involved in the method of forming the semiconductor device in accordance with one embodiment of the present invention.
Figure 10C:
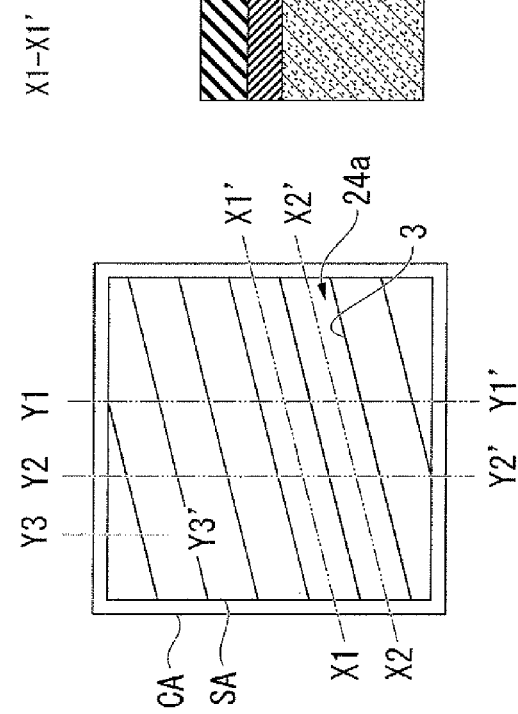
FIG. 10C is a fragmentary cross sectional elevation view, taken along an X2-X2' line of FIG. 10A, illustrating the transistor in a step, subsequent to the step of FIGS. 9A through 9F, involved in the method of forming the semiconductor device in accordance with one embodiment of the present invention.
Figure 10B:
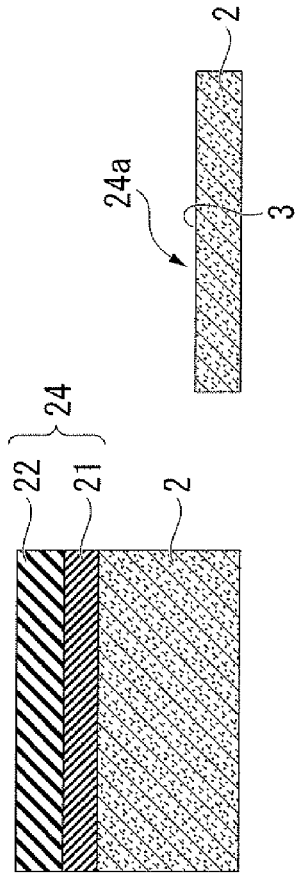
FIG. 10B is a fragmentary cross sectional elevation view, taken along an X1-X1' line of FIG. 10A, illustrating the transistor in a step, subsequent to the step of FIGS. 9A through 9F, involved in the method of forming the semiconductor device in accordance with one embodiment of the present invention.
Figure 10A:
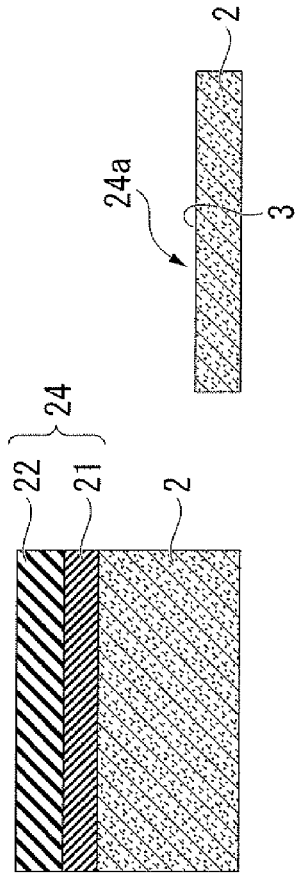
FIG. 10A is a fragmentary plan view illustrating a transistor in a step, subsequent to the step of FIGS. 9A through 9F, involved in the method of forming the semiconductor device in accordance with one embodiment of the present invention.
Figure 10F:
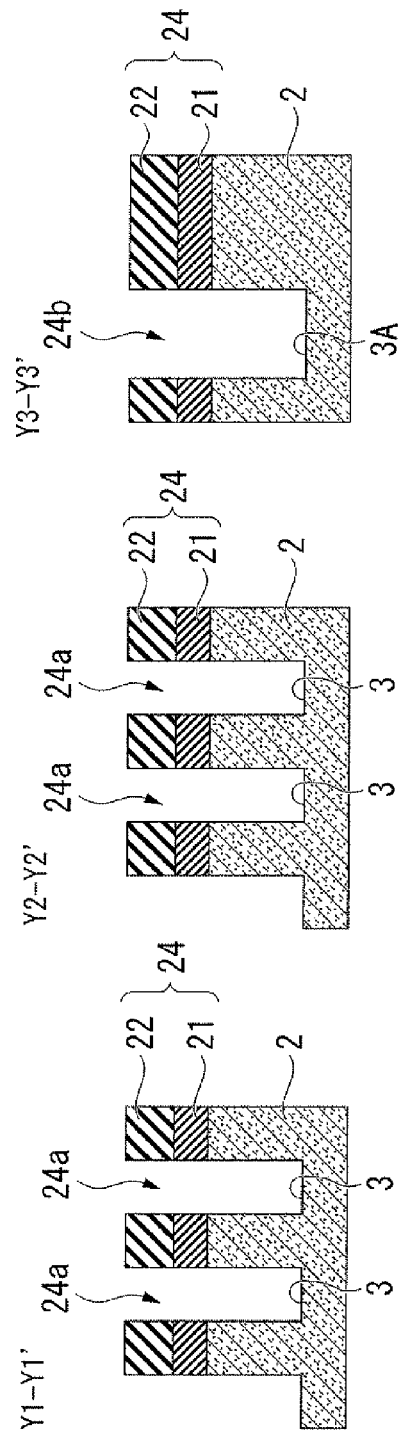
FIG. 10F is a fragmentary cross sectional elevation view, taken along a Y3-Y3' line of FIG. 10A, illustrating the transistor in a step, subsequent to the step of FIGS. 9A through 9F, involved in the method of forming the semiconductor device in accordance with one embodiment of the present invention.
Figure 10E:
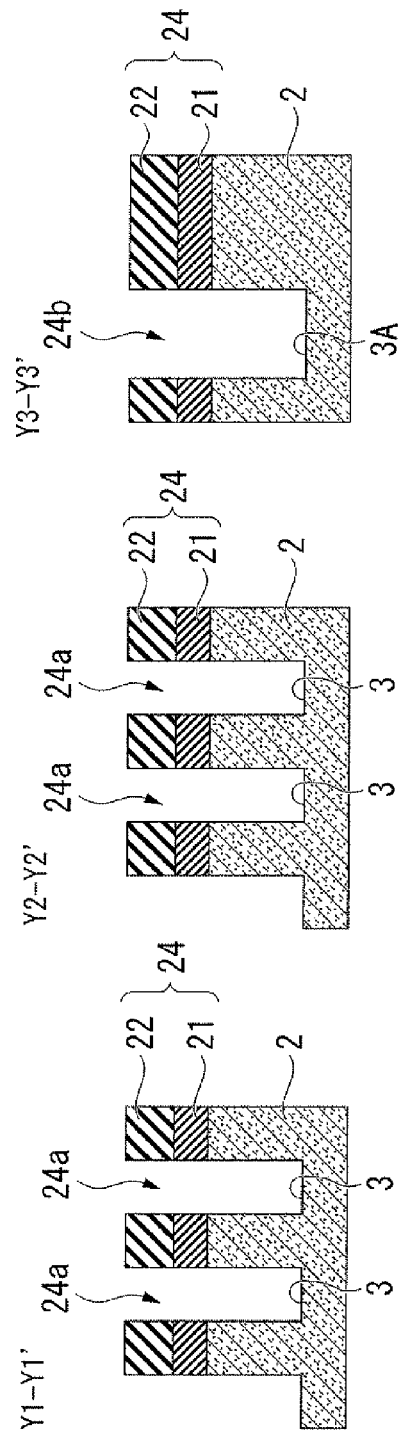
FIG. 10E is a fragmentary cross sectional elevation view, taken along a Y2-Y2' line of FIG. 10A, illustrating the transistor in a step, subsequent to the step of FIGS. 9A through 9F, involved in the method of forming the semiconductor device in accordance with one embodiment of the present invention.
Figure 10D:
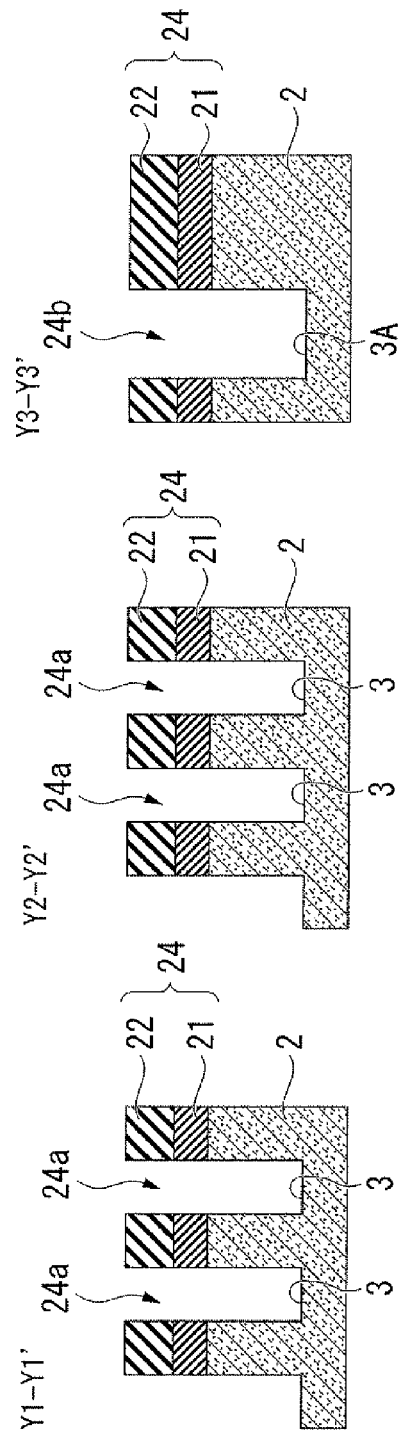
FIG. 10D is a fragmentary cross sectional elevation view, taken along a Y1-Y1' line of FIG. 10A, illustrating the transistor in a step, subsequent to the step of FIGS. 9A through 9F, involved in the method of forming the semiconductor device in accordance with one embodiment of the present invention.
Figure 12C:
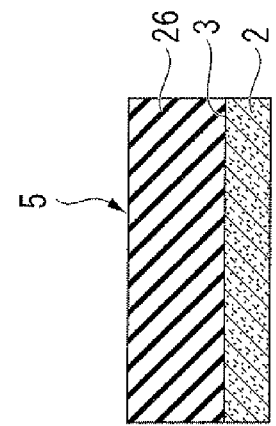
FIG. 12C is a fragmentary cross sectional elevation view, taken along an X2-X2' line of FIG. 12A, illustrating the transistor in a step, subsequent to the step of FIGS. 11A through 11F, involved in the method of forming the semiconductor device in accordance with one embodiment of the present invention.
Figure 12B:
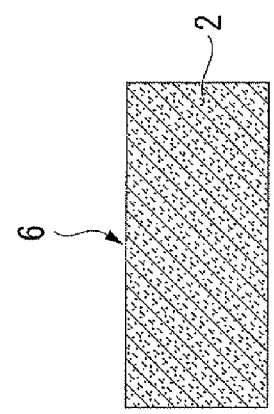
FIG. 12B is a fragmentary cross sectional elevation view, taken along an X1-X1' line of FIG. 12A, illustrating the transistor in a step, subsequent to the step of FIGS. 11A through 11F, involved in the method of forming the semiconductor device in accordance with one embodiment of the present invention.
Figure 12A:
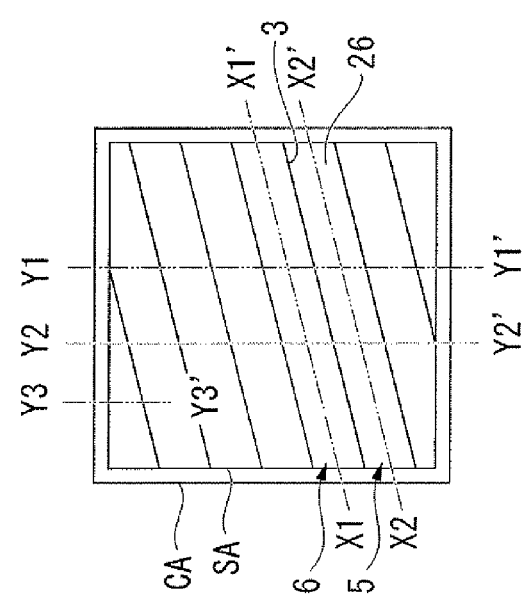
FIG. 12A is a fragmentary plan view illustrating a transistor in a step, subsequent to the step of FIGS. 11A through 11F, involved in the method of forming the semiconductor device in accordance with one embodiment of the present invention.
Figure 12F:
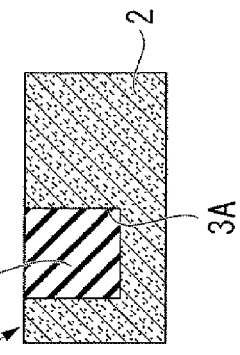
FIG. 12F is a fragmentary cross sectional elevation view, taken along a Y3-Y3' line of FIG. 12A, illustrating the transistor in a step, subsequent to the step of FIGS. 11A through 11F, involved in the method of forming the semiconductor device in accordance with one embodiment of the present invention.
Figure 12E:
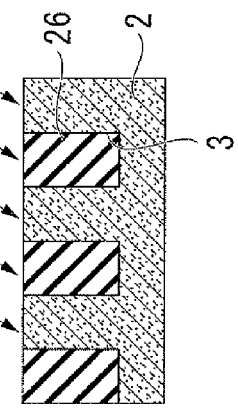
FIG. 12E is a fragmentary cross sectional elevation view, taken along a Y2-Y2' line of FIG. 12A, illustrating the transistor in a step, subsequent to the step of FIGS. 11A through 11F, involved in the method of forming the semiconductor device in accordance with one embodiment of the present invention.
Figure 12D:
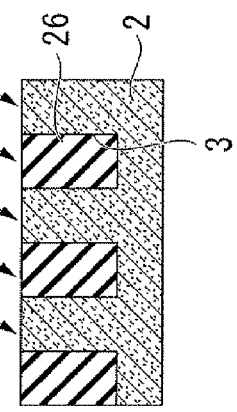
FIG. 12D is a fragmentary cross sectional elevation view, taken along a Y1-Y1' line of FIG. 12A, illustrating the transistor in a step, subsequent to the step of FIGS. 11A through 11F, involved in the method of forming the semiconductor device in accordance with one embodiment of the present invention.
Figure 14C:
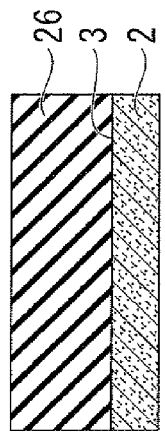
FIG. 14C is a fragmentary cross sectional elevation view, taken along an X2-X2' line of FIG. 14A, illustrating the transistor in a step, subsequent to the step of FIGS. 13A through 13F, involved in the method of forming the semiconductor device in accordance with one embodiment of the present invention.
Figure 14F:
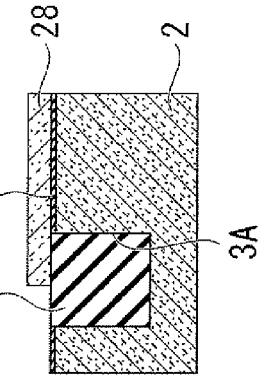
FIG. 14F is a fragmentary cross sectional elevation view, taken along a Y3-Y3' line of FIG. 14A, illustrating the transistor in a step, subsequent to the step of FIGS. 13A through 13F, involved in the method of forming the semiconductor device in accordance with one embodiment of the present invention.
Figure 14B:
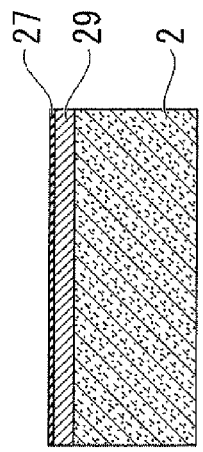
FIG. 14B is a fragmentary cross sectional elevation view, taken along an X1-X1' line of FIG. 14A, illustrating the transistor in a step, subsequent to the step of FIGS. 13A through 13F, involved in the method of forming the semiconductor device in accordance with one embodiment of the present invention.
Figure 14E:
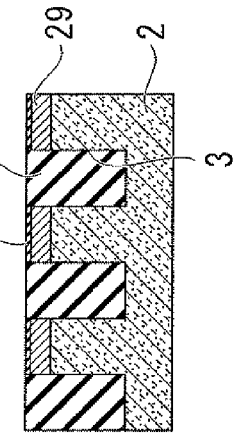
FIG. 14E is a fragmentary cross sectional elevation view, taken along a Y2-Y2' line of FIG. 14A, illustrating the transistor in a step, subsequent to the step of FIGS. 13A through 13F, involved in the method of forming the semiconductor device in accordance with one embodiment of the present invention.
Figure 14A:
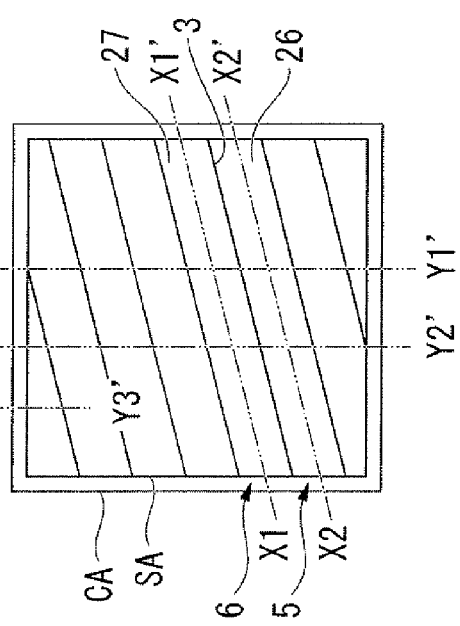
FIG. 14A is a fragmentary plan view illustrating a transistor in a step, subsequent to the step of FIGS. 13A through 13F, involved in the method of forming the semiconductor device in accordance with one embodiment of the present invention.
Figure 14D:
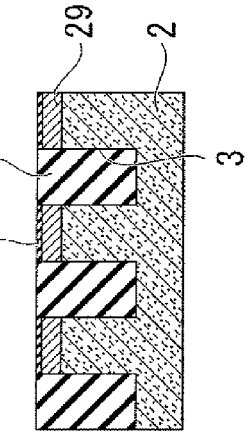
FIG. 14D is a fragmentary cross sectional elevation view, taken along a Y1-Y1' line of FIG. 14A, illustrating the transistor in a step, subsequent to the step of FIGS. 13A through 13F, involved in the method of forming the semiconductor device in accordance with one embodiment of the present invention.

As shown in FIG. 8, the semiconductor device of the present invention (solid line) is less in subthreshold swings (SS) than the semiconductor device of the related art (broken line) as a whole. In particular, when the height of the fin portion 12a is 10 nm, the semiconductor device of the present invention is less in subthreshold swings (SS) than the semiconductor device of the related art (broken line) by about 6 mV/decade. The subthreshold swing of the transistor is an ON/OFF characteristic index. From a point of view of a high-speed operation of the semiconductor device, it is preferable that the subthreshold swing be a small value. Therefore, it can be seen that the semiconductor device of the present invention is superior to the semiconductor device of the related art.

As described above, the semiconductor device of the present invention has results indicating superiority to the semiconductor device of the related art in the respective characteristics of the threshold voltage $V_t$, the driving current $I_{on}$, and the subthreshold swing (SS).

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
an active region;
first and second isolation regions sandwiching the active region therebetween;
a trench extending in a first direction to include a first trench portion crossing the first isolation region, a second trench portion crossing the active region and a third trench portion crossing the second isolation region;
a first upper surface and a first side surface of the first isolation region that cooperate with each other to define the first trench portion;
a second upper surface and a second side surface of the second isolation region that cooperate with each other to define the third trench portion;
a first fin portion that projects toward the trench as compared to each of the first upper surface of the first isolation region and the second upper surface of the second isolation region, the second trench portion being smaller in depth than each of the first and third trench portions and being smaller in width in a second direction crossing the first direction than each of the first and third trench portions;
a second fin portion that projects toward the trench as compared to each of the first side surface of the first isolation region and the second side surface of the second isolation region so that the active region provides the second fin portion; and
a gate electrode formed in the trench to fill the first, second and third trench portions.

2. The device according to claim 1, wherein the first and second fin portions include first and second impurity diffusion layers to provide first and second channel regions, wherein conductivity types of first and second impurity diffusion layers are same as each other.

3. The device according to claim 2, wherein the gate electrode covering the first and second channel regions of the first and second fin portions with an intervention of a gate insulating film therebetween.

4. The device according to claim 2, wherein a first edge part of the active region includes a third impurity diffusion layer to provide a source region,
a second edge part that is opposite to the first edge part of the active region includes a fourth diffusion layer to provide a drain region, wherein conductivity types of third and fourth impurity diffusion layers are same as each other, and
the first and second fin portions including the first and second channel regions are between the source and drain regions.

5. The device according to claim 4, wherein the first and second channel regions are located below the source and drain regions.

6. The device according to claim 1, wherein a cap insulating film covers the gate electrode.

7. The device according to claim 1, wherein the first and second isolation regions comprise an isolation insulating film, and the isolation insulating film is different from a cap insulating film.

8. The device according to claim 7, wherein a protective insulating film covers the first and second isolation regions and the active region except for the first, second and third trench portions, and the protective insulating film and the isolation insulating film each comprise a different material from each other.

9. The device according to claim 8, wherein the protective insulating film has a side surface that is covered with a side wall film, and the side wall film also covers upper parts of the first, second and third trench portions, the upper parts of the first and third trench portions are smaller in width in the second direction than residual parts parts of the first and third trench portions that are not covered with the side wall film.

10. The device according to claim 1, wherein the second fin portion has first and second side wall surfaces opposed to each other and a third side wall surface adjacent to the first and second side wall surfaces.

11. The device according to claim 10, wherein a third fin portion is disposed opposite to the second fin portion in the trench.

12. The device according to claim 11, wherein the third fin portion has fourth and fifth side wall surfaces opposed to each other and a sixth side wall surface adjacent to the fourth and fifth side wall surfaces, wherein the third and sixth side wall surfaces face toward each other.

13. The device according to claim 12, wherein the gate electrode covers the first through sixth side wall surfaces with an intervention of a gate insulating film therebetween.

14. A device comprising:
active regions projecting from a semiconductor body;
isolation regions being filled with isolation insulating films between active regions; and
a trench extending across the active regions and the isolation regions, the trench comprising first trench portions formed on the active regions and second trench portions formed on the isolation regions,
the second trench portions being greater in depth than the first trench portions, bottom portions of the second trench portions being greater in width than the first trench portions.

* * * * *